(12) United States Patent
Ohara

(10) Patent No.: US 7,868,539 B2
(45) Date of Patent: Jan. 11, 2011

(54) LIGHT-EMITTING ELEMENT AND LIGHT-EMITTING DEVICE

(75) Inventor: Hiroki Ohara, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 469 days.

(21) Appl. No.: 11/961,857

(22) Filed: Dec. 20, 2007

(65) Prior Publication Data

US 2008/0150422 A1  Jun. 26, 2008

(30) Foreign Application Priority Data

Dec. 21, 2006  (JP) .............. 2006-344005

(51) Int. Cl.
*H01J 1/62* (2006.01)
(52) U.S. Cl. .................. 313/504; 313/506
(58) Field of Classification Search ......... 313/504, 313/506
See application file for complete search history.

(56) References Cited

U.S. PATENT DOCUMENTS

| | | | |
|---|---|---|---|
| 7,022,421 | B2 | 4/2006 | Thompson et al. |
| 7,078,113 | B2 | 7/2006 | Thompson et al. |
| 7,151,338 | B2 | 12/2006 | Hoffman |
| 7,983,132 | | 7/2007 | Tsuchiya et al. |
| 7,261,954 | B2 | 8/2007 | Thompson et al. |
| 7,288,331 | B2 | 10/2007 | Thompson et al. |
| 2002/0043930 | A1 | 4/2002 | Takeishi et al. |
| 2003/0059647 | A1 | 3/2003 | Thompson et al. |
| 2003/0189401 | A1 | 10/2003 | Kido et al. |
| 2005/0084712 | A1 | 4/2005 | Kido et al. |
| 2005/0098207 | A1 | 5/2005 | Matsumoto et al. |
| 2005/0106419 | A1 | 5/2005 | Endoh et al. |
| 2005/0164520 | A1 | 7/2005 | Muranaka et al. |
| 2005/0170208 | A1 | 8/2005 | Yatsunami et al. |
| 2005/0248267 | A1 | 11/2005 | Gyoutoku et al. |
| 2006/0008740 | A1 | 1/2006 | Kido et al. |

(Continued)

FOREIGN PATENT DOCUMENTS

JP  01-312873  12/1989

(Continued)

OTHER PUBLICATIONS

International Search Report (Application No. PCT/JP2007/074073; PCT10229) Dated Mar. 11, 2008.

(Continued)

*Primary Examiner*—Vip Patel
(74) *Attorney, Agent, or Firm*—Nixon Peabody LLP; Jeffrey L. Costellia

(57) ABSTRACT

An object is to provide a highly functional and reliable light-emitting element and light-emitting device with lower power consumption and high emission efficiency. The light-emitting element has an EL layer that has a stacked structure including a light-emitting element containing an organic compound and a functional layer having separate functions between a pair of electrode layers. In the light-emitting element including the functional layer and the light-emitting element containing an organic compound, a mixed-valence compound is contained in the functional layers. When an element in a compound has a plurality of valences, this element is in a state that is referred to as a mixed-valence state and this compound is referred to as a mixed-valence compound.

16 Claims, 24 Drawing Sheets

U.S. PATENT DOCUMENTS

| | | |
|---|---|---|
| 2006/0261727 A1 | 11/2006 | Aziz et al. |
| 2007/0001945 A1 | 1/2007 | Yoshida et al. |
| 2007/0150206 A1 | 6/2007 | Iwaki et al. |
| 2007/0259207 A1 | 11/2007 | Hashimoto et al. |

FOREIGN PATENT DOCUMENTS

| | | |
|---|---|---|
| JP | 01-312874 | 12/1989 |
| JP | 02-010693 | 1/1990 |
| JP | 09-063771 | 3/1997 |
| JP | 11-307259 | 11/1999 |
| JP | 2001-244077 | 9/2001 |
| JP | 2002-367784 | 12/2002 |
| JP | 2004-152641 | 5/2004 |
| JP | 2005-502166 | 1/2005 |
| JP | 2005-032618 | 2/2005 |
| JP | 2005-108696 | 4/2005 |
| JP | 2005-317213 | 11/2005 |
| JP | 2006-032758 | 2/2006 |
| JP | 2006-049853 | 2/2006 |
| JP | 2006-332653 | 12/2006 |
| JP | 2007-302565 | 11/2007 |
| WO | WO03/022007 | 3/2003 |
| WO | WO03/022008 | 3/2003 |

OTHER PUBLICATIONS

Written Opinion (Application No. PCT/JP2007/074073; PCT10299) Dated Mar. 11, 2008.

306b 310b 305c 317 306a 310a 305a

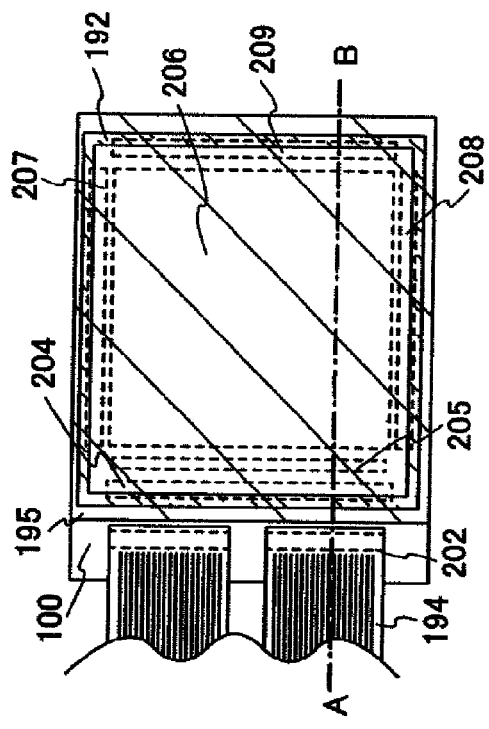
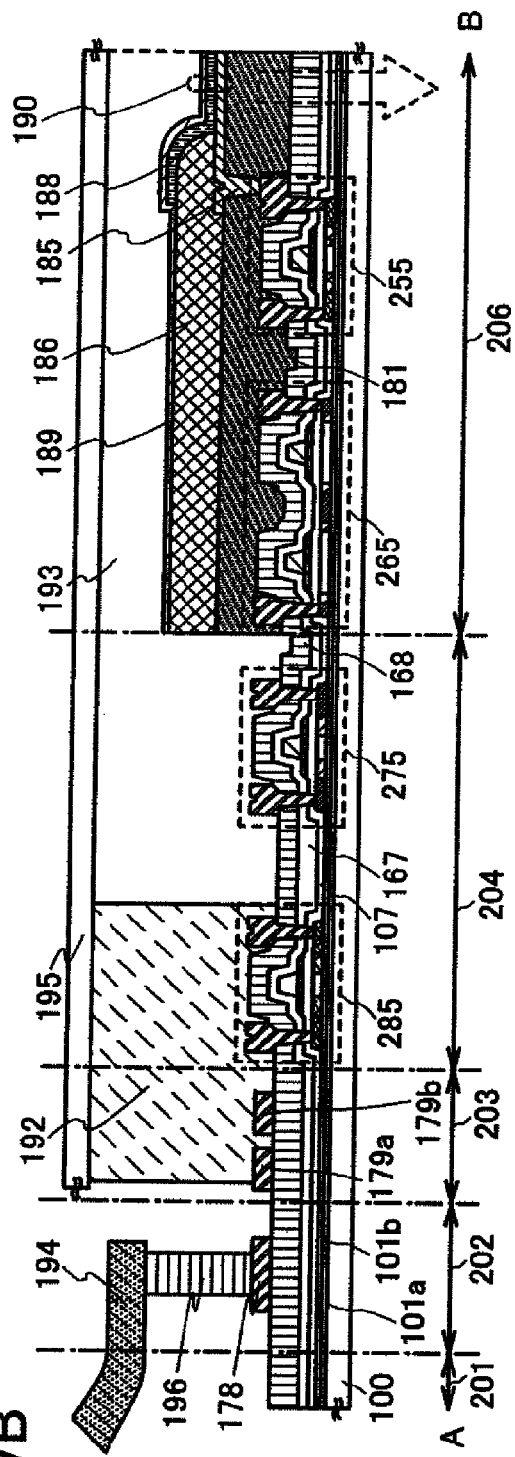
FIG. 7A
FIG. 7B

LIGHT-EMITTING ELEMENT AND LIGHT-EMITTING DEVICE

TECHNICAL FIELD

The present invention relates to light-emitting elements and light-emitting devices.

BACKGROUND ART

As for organic compounds, there are a wider variety of materials and more possibilities to synthesize materials having various functions depending on the molecular design, compared with inorganic compounds. Because of these advantages, photo electronics and electronics each of which uses functional organic materials have been attracting attention in recent years.

As examples of electronic devices using organic compounds as functional organic materials, there are solar cells, light-emitting elements, organic transistors, and the like. These are devices taking advantage of electric properties and optical properties of such organic compounds. In particular, light-emitting elements (electroluminescent (hereinafter, also referred to as "EL") elements) have been making remarkable development.

Such light-emitting elements have a lot of material-dependant problems for improvement of element characteristics. In order to solve the problems, improvement of an element structure, development of materials, and the like have been carried out.

Research has been made on an element structure of a light-emitting element, in which a hole-transporting layer and/or an electron-transporting layer, and/or the like is/are stacked as well as a light-emitting layer and functions are separated in order to improve element characteristics such as emission efficiency (for example, see Patent Document 1: Japanese Published Patent Application No. 2004-152641).

DISCLOSURE OF INVENTION

However, the light-emitting elements as described above have problems such as high driving voltage, and thus further improvement is expected.

In view of the above problem, it is an object of the present invention to reduce driving voltage of light-emitting elements. It is another object of the present invention to provide light-emitting elements and light-emitting devices with lower power consumption and high reliability.

The light-emitting element of the present invention includes an EL layer that has a stacked structure including a light-emitting layer containing an organic compound and a functional layer having a separate function between a pair of electrode layers. According to an aspect of the present invention, a mixed-valence compound is contained in a functional layer in a light-emitting element that includes an EL layer in which a light-emitting layer containing an organic compound and the functional layer are stacked. In the present invention, an EL layer refers to a stack of a functional layer and a light-emitting layer provided between a pair of electrode layers.

When an element in a compound has a plurality of valences, this element is in a state that is referred to as a mixed-valence state and this compound is referred to as a mixed-valence compound. An example of a mixed-valence state is a state in which an element M contained in a compound MX has valences of +n and +m (n≠m), that is, a plurality of valences. An element may have three or more valences.

Specific examples of valences include a mixed state of valences of +1 and +2, a mixed state of valences of +2 and +3, and further a mixed state of valences of +1, +2, and +3. As valences that form a mixed-valence state, numbers are not necessarily consecutive and the case of a mixed state of valences of +1 and +3 may be possible. Furthermore, in one compound, each of two or more elements may be in a mixed-valence state. For example, in the case of the above compound MX, an element X has valences of −a and −b (a≠b) and an element M has valences of +n and +m (n≠m). The mixed-valence compound used in the present invention includes, in its category, both organic compounds and inorganic compounds. Moreover, a compositional formula of the compound may be non-stoichiometric.

The compound can be in a mixed-valence state and the state (e.g., ratio of valences) thereof can be controlled depending on conditions for the formation or the synthesis. Examples of the conditions include a synthetic temperature, kinds of raw materials or the quantity thereof to be mixed, and the like in synthesizing an objective compound. The compound can be in a mixed-valence state and the state thereof can be controlled also depending on a state in which a thin film is formed (film formation method such as vacuum evaporation or the like). Further, in some cases, oxide or sulfide can be in a mixed-valence state by a defect or by doping of a certain element. The valence state can be classified into an ordered type and a disordered type according to the state. In a disordered type, an element having valences of +n and +m (an atom having a valence of +n and an atom having a valence of +m) is randomly distributed in a crystal structure. On the other hand, in an ordered type, an element of an atom having a valence of +n and an atom having a valence of +m is not randomly distributed but aligned in a certain site. For example, a compound is in a state in which only an atom having a valence of +n is in one site and only an atom having a valence of +m is in another site. It is considered that a disordered type is preferable for hopping conduction. Among such mixed-valence compounds are a lot of materials having interesting properties, such as a superconductor and a sensor.

Hopping conduction (in some cases, referred to as Pool-Frenkel conduction) occurs in a mixed-valence compound because it has different valences. Such hopping conduction can thus improve the mobility of a charge (carrier). Therefore, when a mixed-valence compound is contained in a functional layer of a light-emitting element, the light-emitting element can be driven at low voltage to achieve the decrease of power consumption and the improvement of reliability.

A light emission mechanism is said to be as follows: by applying voltage to a pair of electrodes with an EL layer interposed therebetween, electrons injected from a cathode and holes injected from an anode (hereinafter, electrons or holes are also referred to as carriers) are recombined with each other in an emission center of a light-emitting layer to form molecular excitons, and the molecular excitons release energy in returning to a ground state; accordingly light is emitted. Each of a singlet excited state and a triplet excited state is known as an excited state, and light emission is considered to be possible through either a singlet excited state or a triplet excited state.

An injecting layer to inject carriers from an electrode (an electron-injecting layer or a hole-injecting layer), a transporting layer to transport the injected carriers to a light-emitting layer (an electron-transporting layer or a hole-transporting layer), or the like is thus used as a functional layer included in the light-emitting element. In the present invention, the light-emitting element may include at least one of the functional layers other than a light-emitting layer (light-emitting region) in which light is emitted. It is needless to say that plural of functional layers may be included and further the functional layer itself may be a stacked layer of different thin films (for example, a plurality of electron-transporting layers may be stacked).

Furthermore, a light-emitting device can be manufactured according to the present invention. Among light-emitting devices to which the present invention can be applied are a light-emitting device in which a light-emitting element and a thin film transistor (hereinafter, also referred to as TFT) are connected to each other, and the like.

An aspect of the present invention is a light-emitting element including, between a first electrode layer and a second electrode layer, a light-emitting layer containing an organic compound and a functional layer containing a mixed-valence compound on at least one of the first electrode layer side and the second electrode layer side of the light-emitting layer.

Another aspect of the present invention is a light-emitting element including, between a first electrode layer and a second electrode layer, a light-emitting layer containing an organic compound and a hole-transporting layer containing a mixed-valence compound on at least one of the first electrode layer side and the second electrode layer side of the light-emitting layer.

Another aspect of the present invention is a light-emitting element including, between a first electrode layer and a second electrode layer, a light-emitting layer containing an organic compound and an electron-transporting layer containing a mixed-valence compound on at least one of the first electrode layer side and the second electrode layer side of the light-emitting layer.

Another aspect of the present invention is a light-emitting element including a first electrode layer, an electron-injecting layer, an electron-transporting layer, a light-emitting layer containing an organic compound, a hole-transporting layer, a hole-injecting layer, and a second electrode layer that are sequentially stacked, and a mixed-valence compound that is contained in at least one of the electron-injecting layer, the electron-transporting layer, the hole-transporting layer, and the hole-injecting layer.

An aspect of the present invention is a light-emitting device including a light-emitting element that includes, between a first electrode layer and a second electrode layer, a light-emitting layer containing an organic compound and a functional layer containing a mixed-valence compound on at least one of the first electrode layer side and the second electrode layer side of the light-emitting layer.

Another aspect of the present invention is a light-emitting device including a light-emitting element that includes, between a first electrode layer and a second electrode layer, a light-emitting layer containing an organic compound and a hole-transporting layer containing a mixed-valence compound on at least one of the first electrode layer side and the second electrode layer side of the light-emitting layer.

Another aspect of the present invention is a light-emitting device including a light-emitting element that includes, between a first electrode layer and a second electrode layer, a light-emitting layer containing an organic compound and an electron-transporting layer containing a mixed-valence compound on at least one of the first electrode layer side and the second electrode layer side of the light-emitting layer.

Another aspect of the present invention is a light-emitting device including a light-emitting element that includes the light-emitting element comprising a first electrode layer, an electron-injecting layer, an electron-transporting layer, a light-emitting layer containing an organic compound, a hole-transporting layer, a hole-injecting layer, and a second electrode layer that are sequentially stacked, and a mixed-valence compound that is contained in at least one of the electron-injecting layer, the electron-transporting layer, the hole-transporting layer, and the hole-injecting layer.

When a functional layer containing a mixed-valence compound is included in the light-emitting element of the present invention, which includes the light-emitting layer containing an organic compound, the electron-transporting property of the functional layer can be improved. Therefore, the light-emitting element can be driven at low voltage to reduce its power consumption.

Accordingly, the light-emitting device including the light-emitting element to which the present invention is applied can achieve low power consumption and high reliability.

BRIEF DESCRIPTION OF DRAWINGS

In the accompanying drawings:

FIGS. 7A and 7B are views each explaining a light-emitting device of the present invention;

BEST MODE FOR CARRYING OUT THE INVENTION

Figure 1A:
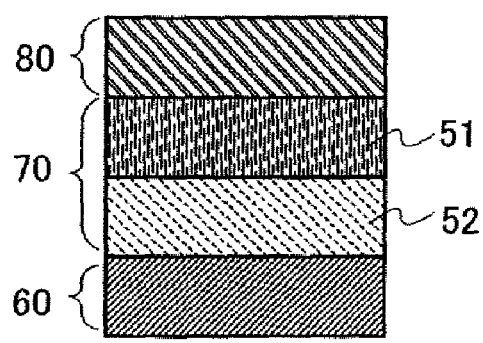
FIGS. 1A to 1D are views each explaining a light-emitting element of the present invention.

Embodiment modes of the present invention will be explained in detail with reference to the accompanying drawings. It is to be noted that the present invention is not limited to the following description, and it is easily understood by those skilled in the art that modes and details thereof can be modified in various ways without departing from the spirit and the scope of the present invention. Therefore, the present invention should not be interpreted as being limited to the following description of the embodiment modes. It is to be noted that, in structures of the present invention explained below, reference numerals indicating the same portions or portions having the similar functions are used in common in different drawings, and repeated explanation thereof will be omitted.

Embodiment Mode 1

A light-emitting element in this embodiment mode will be explained in detail with reference to FIGS. 1A to 1D and FIGS. 2A to 2D.

The light-emitting element of the present invention includes an EL layer that has a stacked structure including a light-emitting layer containing an organic compound and a functional layer having a separate function between a pair of electrode layers. According to an aspect of the present invention, a mixed-valence compound is contained in a functional layer in a light-emitting element that includes an EL layer in which a light-emitting layer containing an organic compound and the functional layer are stacked.

A light emission mechanism is said to be as follows: by applying voltage to a pair of electrodes with an EL layer interposed therebetween, electrons injected from a cathode and holes injected from an anode (hereinafter, electrons or holes are also referred to as carriers) are recombined with each other in an emission center of a light-emitting layer to form molecular excitons, and the molecular excitons release energy in returning to a ground state; accordingly light is emitted. Each of a singlet excited state and a triplet excited state is known as an excited state, and light emission is considered to be possible through either a singlet excited state or a triplet excited state.

An injecting layer to inject carriers from an electrode (an electron-injecting layer or a hole-injecting layer), a transporting layer to transport the injected carriers to a light-emitting layer (an electron-transporting layer or a hole-transporting layer), or the like is thus used as a functional layer included in the light-emitting element. In the present invention, the light-emitting element may include at least one of the functional layers other than a light-emitting layer (light-emitting region) in which light is emitted. It is needless to say that plural of functional layers may be included and further the functional layer itself may be a stacked layer of different thin films (for example, a plurality of electron-transporting layers may be stacked).

FIGS. 1A to 1D each show a light-emitting element in which an EL layer 70 including a functional layer and a light-emitting element layer 51 between a first electrode layer 60 and a second electrode layer 80.

FIGS. 1A to 1D each show a case where the potential of the first electrode layer 60 is higher than that of the second electrode layer 80. In FIG. 1A, a hole-transporting layer 52 containing a mixed-valence compound is provided as a functional layer between the first electrode layer 60 and the light-emitting layer 51. The hole-transporting layer 52 may be a hole-injecting layer.

Figure 1C:
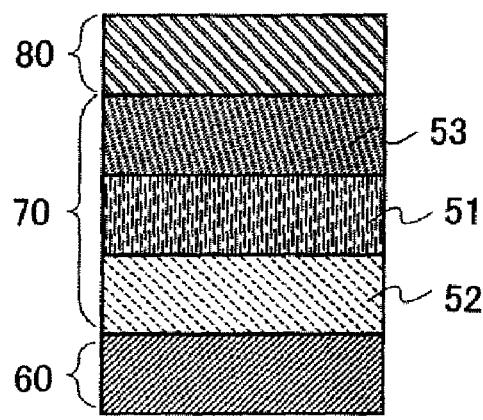
Figure 1B:
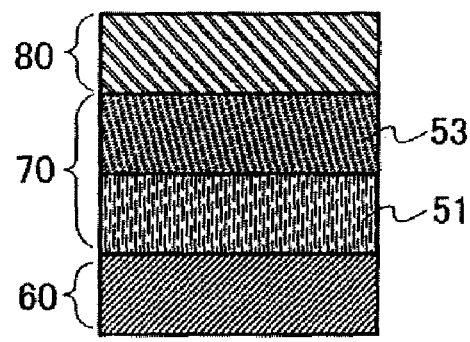

In FIG. 1B, an electron-transporting layer 53 containing a mixed-valence compound is provided as a functional layer between the light-emitting layer 51 and the second electrode layer 80. The electron-transporting layer 53 may be an electron-injecting layer.

In FIG. 1C, the hole-transporting layer 52 and the electron-transporting layer 53 are provided to be in contact with the first electrode layer 60 and the second electrode layer 80, respectively, with the light-emitting layer 51 interposed therebetween. In the present invention, a mixed-valence compound may be contained in at least one of functional layers included in a light-emitting element. Accordingly, a mixed-valence compound may be contained in one of the hole-transporting layer 52 and the electron-transporting layer 53 that are the functional layers. It is needless to say that a mixed-valence compound may be contained in both the hole-transporting layer 52 and the electron-transporting layer 53.

Figure 1D:
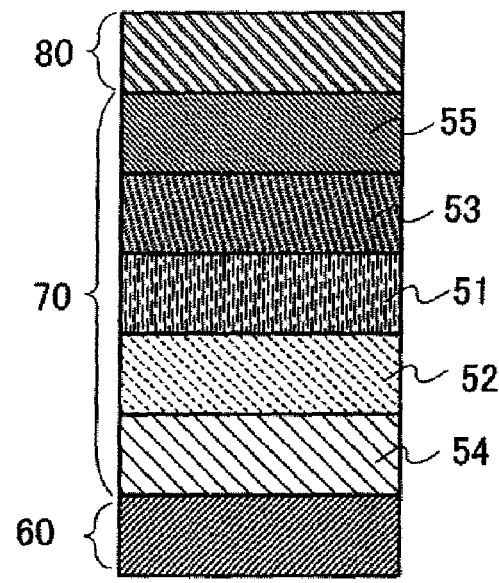

In FIG. 1D, the hole-injecting layer 54, the hole-transporting layer 52, the electron-transporting layer 53, and the electron-injecting layer 55 are provided as functional layers. On the first electrode layer 60 side, the hole-injecting layer 54 and the hole-transporting layer 52 are sequentially provided between the first electrode layer 60 and the light-emitting layer 51; on the light-emitting layer 51 side, the electron-transporting layer 53 and the electron-injecting layer 55 are sequentially provided between the light-emitting layer 51 and the second electrode layer 80. As described above, a mixed-valence compound may be contained in at least one of functional layers such as hole-injecting layer 54, the hole-transporting layer 52, the electron-transporting layer 53, or the electron-injecting layer 55. It is needless to say that a mixed-valence compound may be contained in plural of layers and a mixed-valence compound may be contained in all of the above four layers.

When an element in a compound has a plurality of valences, this element is in a state that is referred to as a mixed-valence state and this compound is referred to as a mixed-valence compound. An example of a mixed-valence state is a state in which an element M contained in a compound MX has valences of +n and +m ($n \neq m$), that is, a plurality of valences. An element may have three or more valences.

Specific examples of valences include a mixed state of valences of +1 and +2, a mixed state of valences of +2 and +3, and further a mixed state of valences of +1, +2, and +3. As valences that form a mixed-valence state, numbers are not necessarily consecutive and the case of a mixed state of valences of +1 and +3 may be possible. Furthermore, in one compound, each of two or more elements may be in a mixed-valence state. For example, in the case of the above compound MX, an element X has valences of −a and −b ($a \neq b$) and an element M has valences of +n and +m ($n \neq m$). The mixed-valence compound used in the present invention includes, in its category, both organic compounds and inorganic compounds. Moreover, a compositional formula of the compound may be non-stoichiometric.

The compound can be in a mixed-valence state and the state (e.g., ratio of valences) thereof can be controlled depending on conditions for the formation or the synthesis. Examples of the conditions include a synthetic temperature, kinds of raw materials or the quantity thereof to be mixed, and the like in synthesizing an objective compound. The compound can be in a mixed-valence state and the state thereof can be controlled also depending on a state in which a thin film is formed (film formation method such as vacuum evaporation or the like). Further, in some cases, oxide or sulfide can be in a mixed-valence state by a defect or by doping of a certain element. The valence state can be classified into an ordered type and a disordered type according to the state. In a disordered type, an element having valences of +n and +m (an atom having a valence of +n and an atom having a valence of +m) is randomly distributed in a crystal structure. On the other hand, in an ordered type, an element of an atom having a valence of +n and an atom having a valence of +m is not randomly distributed but aligned in a certain site. For example, a compound is in a state in which only an atom having a valence of +n is in one site and only an atom having a valence of +m is in another site. It is considered that a disordered type is preferable for hopping conduction. Among such mixed-valence compounds are a lot of materials having interesting properties, such as a superconductor and a sensor.

Figure 3A:
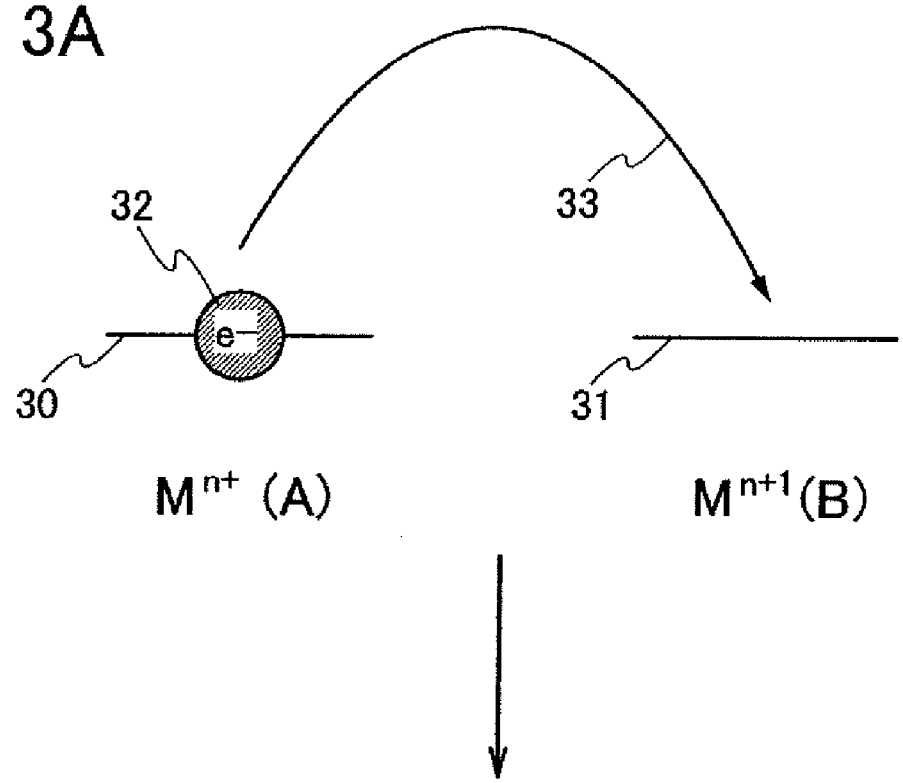
FIGS. 3A and 3B are views each explaining a model of a light-emitting element of the present invention.
Figure 3B:
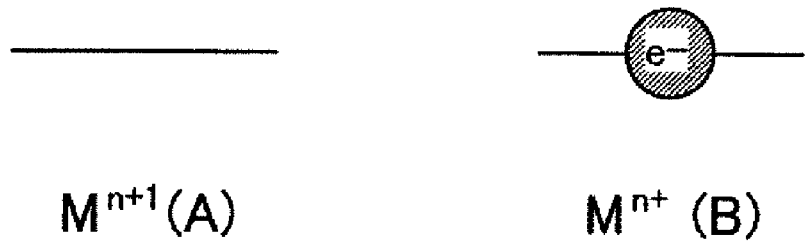

Hopping conduction occurs in a mixed-valence compound because it has different valences. FIGS. 3A and 3B are theoretical views of hopping conduction in the mixed-valence compound of the present invention. FIG. 3A shows an electron exchange reaction between an atom M (A) having a valence of +n and an atom M (B) having a valence of +(n+1). Since the atom M (A) is $M^{n+}$ (A) having a valence of +n, it has an electron 32 at a level 30. On the other hand, since the atom M (B) is $M^{n+1}$ having a valence of +(n+1), it has no electron at a level 31.

The electron 32 is excited to hop, as indicated by an arrow 33, to the level 31 of the atom M (B), which is hopping conduction (see FIG. 3A). After the hopping conduction, the atom M (A) is $M^{n+1}$ (A) having a valence of +(n+1) since it has no electron at the level 30 of the atom M (A); on the other hand, the atom M (B) is $M^n$ (B) having a valence of +n since it has the electron 32 at the level 31 of the atom M (B) (see FIG. 3B). In this manner, hopping conduction occurs.

Such hopping conduction can thus improve the mobility of a charge (carrier). Therefore, when a mixed-valence compound is contained in a functional layer of a light-emitting element, the light-emitting element can be driven at low voltage to achieve the decrease of power consumption and the improvement of reliability.

Among elements in a mixed-valence state are a transition metal and a rare-earth metal. For example, europium (Eu) has valences of +2 and +3. Among mixed-valence compounds are metal chalcogenide such as metal oxide and metal sulfide, and the like. For example, molybdenum oxide ($MoO_3$) is formed as a compound in a state in which molybdenum (Mo) has not only a valence of +3, but valences of both +2 and +3 in combination.

When such molybdenum oxide having a plurality of valences is contained in the hole-injecting layer 54 of a light-emitting element as shown in FIG. 1D, the hole-injecting property of the light-emitting element can be improved to reduce power consumption.

Oxide or sulfide of a transition metal and a rare-earth metal can be used for the mixed-valence compound contained in the above functional layer. For example, as oxide, there are perovskite-type oxide such as strontium titanate ($SrTiO_3$); a ferrite material such as magnetic ($Fe_3O_4$), manganese ferrite ($MnFe_2O_4$), or nickel ferrite ($NiFe_2O_4$); tungsten trioxide ($WO_3$), vanadium oxide ($V_2O_5$), molybdenum oxide ($MoO_3$), rhenium oxide ($ReO_3$), europium oxide ($Eu_3O_4$), lithium titanate ($LiTi_2O_4$), manganese oxide ($Mn_3O_4$), cobalt oxide ($Co_3O_4$), antimony oxide ($Sb_2O_4$), lead oxide ($Pb_3O_4$), and the like. As sulfide, there are europium sulfide ($Eu_3S_4$), copper sulfide ($Cu_xS$) (x is in the range of 1 to 2), gallium sulfide (GaS), thallium sulfide (TlS), and the like. Furthermore, as a halogen compound, there are silver fluoride ($Ag_2F$), indium halide ($InF_2$, $InCl_2$, $InBr_2$, or $InI_2$), tantalum chloride ($Ta_6Cl_{15}$), thallium chloride ($Tl_4Cl_6$), and gallium chloride ($GaCl_2$). Moreover, as nitride, there are indium nitride (InN), tin nitride (SnN), and the like. As arsenide, there are europium arsenide ($Eu_3As_4$) and the like. Furthermore, a metallic complex of platinum (Pt), palladium (Pd), nickel (Ni), iridium (Ir), or iron (Fe) is in a mixed-valence state. It is to be noted that manganese oxide ($Mn_3O_4$) and copper sulfide ($Cu_xS$) (x is in the range of 1 to 2) are more preferable. Some of oxide or sulfide are in a mixed-valence state when oxygen defect or sulfur defect are generated. It is considered that such oxide and sulfide are useful for a hole-transporting layer because they become p-type semiconductor.

Whether a compound is in a mixed-valence state or not can be examined by any one of several techniques such as an optical method, an electrochemical method, and an X-ray crystallographic method. For example, existence of a plurality of valences contained in a compound can be observed from the absorbing state of an observed atom in the compound by Moessbauer spectroscopy, magnetic susceptibility, X-ray absorption near edge structure (XANES) spectroscopy, X-ray absorption fine structure (XAFS) spectroscopy, or the like. Alternatively, a mixed-valence state can be judged by high-definition X-ray analysis, X-ray photoelectron spectroscopy (XPS), Auger electron spectroscopy (AES), or the like.

Another structure of the light-emitting element of the present invention will be described with reference to FIGS. 2A to 2D.

FIGS. 2A to 2D each show an element structure of a light-emitting element, in which an EL layer 860 is interposed between a first electrode layer 870 and a second electrode layer 850. As shown in FIGS. 2A to 2D, the EL layer 860 includes a first layer 804, a second layer 803, and a third layer 802. In FIGS. 2A to 2D, the second layer 803 is a light-emitting layer, and the first layer 804 and the third layer 802 are functional layers. In FIGS. 2A to 2D, at least one of the first layer 804 and the third layer 802 is formed so as to contain a mixed-valence compound. It is needless to say that a mixed-valence compound may be contained in both the first layer 804 and the third layer 802.

The first layer 804 is a layer having a function of transporting holes to the second layer 803. The hole-injecting layer 54 in FIGS. 1A to 1D (in FIGS. 2A to 2D, included in the first layer 804) is a layer that contains a substance with a high hole-injecting property. As the substance with a high hole-injecting property, molybdenum oxide, vanadium oxide, ruthenium oxide, tungsten oxide, manganese oxide, or the like can be used. Alternatively, the first layer 804 can be formed using phthalocyanine (abbr.: $H_2Pc$); a phthalocyanine-based compound such as copper phthalocyanine (CuPc); an aromatic amine compound such as 4,4'-bis[N-(4-diphenylaminophenyl)-N-phenylamino]biphenyl (abbr.: DPAB) or 4,4'-bis(N-{4-[N-(3-methylphenyl)-N-phenylamino]phenyl}-N-phenylamino)biphenyl (abbr.: DNTPD); or a high molecule such as poly(ethylene dioxythiophene)/poly(styrenesulfonic acid) (PEDOT/PSS), or the like.

Alternatively, a composite material formed by composing an organic compound and an inorganic compound can be used for the hole-injecting layer 54. In particular, a composite material including an organic compound and an inorganic compound having an electron accepting property with respect to the organic compound has an excellent hole-injecting property and hole-transporting property because the electrons are transported between the organic compound and the inorganic compound, increasing the carrier density.

In the case of using the composite material formed by composing an organic compound and an inorganic compound for the hole-injecting layer 54, the hole-injecting layer 54 can achieve an ohmic contact with the electrode layer; therefore, a material of the electrode layer can be selected regardless of work function.

As the inorganic compound used for the composite material, oxide of a transition metal is preferably used. Oxide of metals belonging to Groups 4 to 8 in the periodic table can be given. Specifically, it is preferable to use vanadium oxide, niobium oxide, tantalum oxide, chromium oxide, molybdenum oxide, tungsten oxide, manganese oxide, and rhenium oxide because of their high electron accepting properties. Among them, molybdenum oxide is particularly preferable because it is stable under air, has a low hygroscopic property, and is easily handled.

As the organic compound used for the composite material, any of various compounds such as an aromatic amine compound, a carbazole derivative, an aromatic hydrocarbon, and a high molecular weight compound (such as oligomer, dendrimer, or polymer) can be used. The organic compound used for the composite material is preferably an organic compound having a high hole-transporting property. Specifically, a substance having a hole mobility of greater than or equal to $10^{-6}$ cm$^2$/Vs is preferably used. However, other materials than these materials may also be used as long as the hole-transporting properties thereof are higher than the electron-transporting properties thereof. The organic compounds that can be used for the composite material will be specifically shown below.

For example, the following can be represented as the aromatic amine compound: N,N'-di(p-tolyl)-N,N'-diphenyl-p-phenylenediamine (abbr.: DTDPPA); 4,4'-bis[N-(4-diphenylaminophenyl)-N-phenylamino]biphenyl (abbr.: DPAB); 4,4'-bis(N-{4-[N-(3-methylphenyl)-N-phenylamino]phenyl}-N-phenylamino)biphenyl (abbr.: DNTPD); 1,3,5-tris[N-(4-diphenylaminophenyl)-N-phenylamino]benzene (abbr.: DPA3B); and the like.

As the carbazole derivatives which can be used for the composite material, the following can be provided specifically: 3-[N-(9-phenylcarbazol-3-yl)-N-phenylamino]-9-phenylcarbazole (abbr.: PCzPCA1); 3,6-bis[N-(9-phenylcarbazol-3-yl)-N-phenylamino]-9-phenylcarbazole (abbr.: PCzPCA2); 3-[N-(1-naphtyl)-N-(9-phenylcarbazol-3-yl)amino]-9-phenylcarbazole (abbr.: PCzPCN1); and the like.

Moreover, the following can be given: 4,4'-di(N-carbazolyl)biphenyl (abbr.: CBP); 1,3,5-tris[4-(N-carbazolyl)phenyl]benzene (abbr.: TCPB); 9-[4-(N-carbazolyl)phenyl]-10-phenylanthracene (abbr.: CzPA); 1,4-bis[4-(N-carbazolyl)phenyl]-2,3,5,6-tetraphenylbenzene; and the like.

As the aromatic hydrocarbon which can be used for the composite material, the following can be given for example: 2-tert-butyl-9,10-di(2-naphthyl)anthracene (abbr.: t-BuDNA); 2-tert-butyl-9,10-di(1-naphthyl)anthracene; 9,10-bis(3,5-diphenylphenyl)anthracene (abbr.: DPPA); 2-tert-butyl-9,10-bis(4-phenylphenyl)anthracene (abbr.: t-BuDBA); 9,10-di(2-naphthyl)anthracene (abbr.: DNA); 9,10-diphenylanthracene (abbr.: DPAnth); 2-tert-butylanthracene (abbr.: t-BuAnth); 9,10-bis(4-methyl-1-naphthyl)anthracene (abbr.: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides these compounds, pentacene, coronene, or the like can also be used. In particular, an aromatic hydrocarbon which has a hole mobility of greater than or equal to $1\times10^{-6}$ cm$^2$/Vs and has 14 to 42 carbon atoms is more preferable.

The aromatic hydrocarbon which can be used for the composite material may have a vinyl skeleton. As the aromatic hydrocarbon having a vinyl group, the following are given for example: 4,4'-bis(2,2-diphenylvinyl)biphenyl (abbr.: DPVBi); 9,10-bis[4-(2,2-diphenylvinyl)phenyl]anthracene (abbr.: DPVPA); and the like.

Moreover, a high molecular compound such as poly(N-vinylcarbazole) (abbr.: PVK) or poly(4-vinyltriphenylamine) (abbr.: PVTPA) can also be used.

As a substance forming the hole-transporting layer 52 in FIG. 1D (in FIGS. 2A to 2D, included in the first layer 804), a substance having a high hole-transporting property, specifically, an aromatic amine compound (that is, a compound having a benzene ring-nitrogen bond) is preferable. As a material that is widely used, 4,4'-bis[N-(3-methylphenyl)-N-phenylamino]biphenyl, derivatives thereof such as 4,4'-bis[N-(1-napthyl)-N-phenylamino]biphenyl (hereinafter referred to as NPB), and star burst aromatic amine compounds such as 4,4',4''-tris(N,N-diphenyl-amino)triphenylamine, and 4,4',4''-tris[N-(3-methylphenyl)-N-phenylamino]triphenylamine can be given. These materials described here mainly are substances each having a hole mobility of greater than or equal to $10^{-6}$ cm$^2$/Vs. However, other materials than these compounds may also be used as long as the hole-transporting properties thereof are higher than the electron-transporting properties thereof. The hole-transporting layer 52 is not limited to a single layer, and may be a mixed layer of the aforementioned substances, or a stacked layer which comprises two or more layers each including the aforementioned substance.

In the present invention, each of the first layer 804, the hole-transporting layer 52, and the hole-injecting layer 54 is formed using the above-described mixed-valence compound in the case where each of them is formed as the functional layer containing a mixed-valence compound. Alternatively, a mixed-valence compound and the above-described substances that can be used for the first layer 804, the hole-transporting layer 52, and the hole-injecting layer 54 may be mixed to form a mixed layer, or formed as a stacked structure.

The third layer 802 is a layer having a function of transporting or injecting electrons to the second layer 803. The electron-transporting layer 53 in FIG. 1D (in FIGS. 2A to 2D, included in the third layer 802) will be described. As the electron-transporting layer 53, a substance having a high electron-transporting property can be used. For example, a layer including a metal complex or the like having a quinoline or benzoquinoline skeleton, such as tris(8-quinolinolato)aluminum (abbr.: Alq), tris(4-methyl-8-quinolinolato)aluminum (abbr.: Almq$_3$), bis(10-hydroxybenzo[h]quinolinato)beryllium (abbr.: BeBq$_2$), or bis(2-methyl-8-quinolinolato)(4-phenylphenolato)aluminum (abbr.: BAlq) can be used. Alternatively, a metal complex or the like having an oxazole-based or thiazole-based ligand, such as bis[2-(2-hydroxyphenyl)benzoxazolato]zinc (abbr.: Zn(BOX)$_2$) or bis[2-(2-hydroxyphenyl)-benzothiazolato]zinc (abbr.: Zn(BTZ)$_2$) can be used. Besides the metal complexes, 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-biphenylyl)-4-phenyl-5-(4-tert-butylphenyl)-1,2,4-triazole (abbr.: TAZ), bathophenanthroline (abbr.: BPhen), bathocuproine (abbr.: BCP), or the like can also be used. The substances described here mainly are substances each having an electron mobility of greater than or equal to $10^{-6}$ cm$^2$/Vs. However, other materials than these compounds may also be used as long as the materials have higher electron-transporting properties than hole-transporting properties thereof. Furthermore, the electron-transporting layer 53 is not limited to a single layer, and may be a stacked layer which comprises two or more layers each including the aforementioned substance.

The electron-injecting layer 55 in FIG. 1D (in FIGS. 2A to 2D, included in the third layer 802) will be described. The electron-injecting layer 55 can be formed using a substance with a high electron-injecting property. As the electron-injecting layer 55, an alkali metal, an alkaline earth metal, or a compound thereof such as lithium fluoride (LiF), cesium fluoride (CsF), or calcium fluoride (CaF$_2$) can be used. For example, a layer formed of a substance having an electron-transporting property, containing an alkali metal, an alkaline earth metal, or a compound thereof, such as a layer formed of Alq, containing magnesium (Mg), can be used. With the use of a layer formed of a substance having an electron-transporting property, containing an alkali metal or an alkaline earth metal, as the electron-injecting layer, electron injection from the electrode layer is performed efficiently, which is preferable.

In the present invention, each of the third layer 802, the electron-transporting layer 53, and the electron-injecting layer 55 is formed so as to contain the above-described mixed-valence compound in the case where each of them is formed as the functional layer containing a mixed-valence compound. Alternatively, a mixed-valence compound and the above-described substances that can be used for the third layer 802, the electron-transporting layer 53, and the electron-injecting layer 55 may be mixed to form a mixed layer, or formed as a stacked structure.

Next, the light-emitting layer 51 (in FIGS. 2A to 2D, the second layer 803) will be described. The light-emitting layer 51 is a layer having a function of light emission and contains a light-emitting organic compound. The light-emitting layer 51 may contain an inorganic compound. Various kinds of light-emitting organic compounds or inorganic compounds can be used to form the light-emitting layer 51. It is to be noted that the light-emitting layer 51 preferably has a thickness of about 10 to 100 nm.

An organic compound used for the light-emitting layer 51 is not particularly limited as long as it is a light-emitting organic compound, and examples of the organic compounds include, for example, 9,10-di(2-naphthyl)anthracene (abbr.: DNA), 9,10-di(2-naphthyl)-2-tert-butylanthracene (abbr.: t-BuDNA), 4,4'-bis(2,2-diphenylvinyl)biphenyl (abbr.: DPVBi), coumarin 30, coumarin 6, coumarin 545, coumarin 545T, perylene, rubrene, periflanthene, 2,5,8,11-tetra(tert-butyl)perylene (abbr.: TBP), 9,10-diphenylanthracene (abbr.: DPA), 5,12-diphenyltetracene, 4-(dicyanomethylene)-2-methyl-[p-(dimethylamino)styryl]-4H-pyran (abbr.: DCM1), 4-(dicyanomethylene)-2-methyl-6-[2-(julolidin-9-yl)ethenyl]-4H-pyran (abbr.: DCM2), 4-(dicyanomethylene)-2,6-bis[p-(dimethylamino)styryl]-4H-pyran (abbr.: BisDCM), and the like. Alternatively, it is also possible to use a compound capable of generating phosphorescence, such as bis[2-(4',6'-difluorophenyl)pyridinato-N,C$^{2'}$]iridium(picolinate) (abbr.: FIrpic), bis{2-[3',5'-bis(trifluoromethyl)phenyl]pyridinato-N,C$^{2'}$}iridium(picolinate) (abbr.: Ir(CF$_3$ppy)$_2$(pic)), tris(2-phenylpyridinato-N,C$^{2'}$)iridium (abbr.: Ir(ppy)$_3$), bis(2-phenylpyridinato-N,C$^{2'}$)iridium(acetylacetonate) (abbr.: Ir(ppy)$_2$(acac)), bis[2-(2'-thienyl)pyridinato-N,C$^{3'}$]iridium (acetylacetonate) (abbr.: Ir(thp)$_2$(acac)), bis(2-phenylquinolinato-N,C$^{2'}$)iridium(acetylacetonate) (abbr.: Ir(pq)$_2$(acac)), or bis[2-(2'-benzothienyl)pyridinato-N,C$^{3'}$]iridium(acetylacetonate) (abbr.: Ir(btp)$_2$(acac)).

A triplet excitation light-emitting material containing a metal complex or the like may be used for the light-emitting layer 51 in addition to a singlet excitation light-emitting material. For example, among pixels emitting red, green, and blue light, the pixel emitting red light whose luminance is reduced by half in a relatively short time is formed using a triplet excitation light-emitting material and the other pixels are formed using a singlet excitation light-emitting material. Triplet excitation light-emitting materials have a feature of favorable emission efficiency and less power consumption to obtain the same luminance. That is, when a triplet excitation light-emitting material is used for a pixel emitting red light, only a small amount of current should be applied to the light-emitting element, and thus, reliability can be improved. In order to reduce power consumption, a pixel emitting red light and a pixel emitting green light may be formed using triplet excitation light-emitting materials and a pixel emitting blue light may be formed using a singlet excitation light-emitting material. Power consumption can be further reduced when a light-emitting element to emit green light that is highly visible to human eyes is formed using a triplet excitation light-emitting material.

The light-emitting layer 51 may include not only the above-described organic compound, which produces light emission, but also another organic compound. Examples of organic compounds that can be added include, but are not limited to, TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and further, 4,4'-bis(N-carbazolyl)biphenyl (abbr.: CBP), 1,3,5-tris[4-(N-carbazolyl)phenyl]benzene (abbr.: TCPB), and the like. It is preferable that the other organic compound, which is added in addition to the organic compound, have higher excitation energy than the organic compound and be added in larger amounts than that of the organic compound in order to make the organic compound emit light efficiently (concentration quenching of the organic compound can thus be prevented). Alternatively, as another function, the other organic compound may emit light along with the organic compound (white light or the like can thus be emitted).

The light-emitting layer 51 may have a structure in which light-emitting layers having different light emission wavelength bands are each formed in a pixel so as to perform color display. Typically, light-emitting layers corresponding to respective luminescent colors of R (red), G (green), and B (blue) are formed. In this case, color purity can be improved and specular surface (reflection) of a pixel portion can be prevented by providing a filter that transmits light of a certain light emission wavelength band on a light emission side of the pixels. By providing the filter, a circular polarizing plate or the like, which has been conventionally thought to be required, can be omitted, thereby reducing loss of light emitted from the light-emitting layer. In addition, a change in hue, which is caused in the case where a pixel portion (a display screen) is seen obliquely, can be reduced.

The material that can be used for the light-emitting layer 51 may be preferable either a low molecular organic light-emitting material or a high molecular organic light-emitting material. The durability of an element is high because a high molecular organic light-emitting material has high physical strength in comparison with a low molecular material. In addition, manufacturing of an element is relatively easy because film formation by coating is possible in the case of using a high molecular organic light-emitting material.

Since the color of light is determined by a material of a light-emitting layer, a light-emitting element that emits light of a desired color can be formed by selecting the material. As high molecular electroluminescent materials that can be used to form the light-emitting layer 51, a polyparaphenylene vinylene based material, a polyparaphenylene based material, a polythiophene based material, and a polyfluorene based material can be given.

As the polyparaphenylene vinylene based material, a derivative of poly(paraphenylenevinylene) (abbr.: PPV): poly (2,5-dialkoxy-1,4-phenylenevinylene) (abbr.: RO-PPV); poly[2-(2'-ethyl-hexoxy)-5-methoxy-1,4-phenylenevinylene] (abbr.: MEH-PPV); poly[2-(dialkoxyphenyl)-1,4-phenylenevinylene] (abbr.: ROPh-PPV); and the like can be given. As the polyparaphenylene based material, a derivative of polyparaphenylene (abbr.: PPP): poly(2,5-dialkoxy-1,4-phenylene) (abbr.: RO-PPP); poly(2,5-dihexoxy-1,4-phenylene); and the like can be given. As the polythiophene based material, a derivative of polythiophene (abbr.: PT): poly(3-alkylthiophene) (abbr.: PAT); poly(3-hexylthiophene) (abbr.: PHT); poly(3-cyclohexylthiophene) (abbr.: PCHT); poly(3-cyclohexyl-4-methylthiophene) (abbr.: PCHMT); poly(3,4-dicyclohexylthiophene) (abbr.: PDCHT); poly[3-(4-octylphenyl)-thiophene](abbr.: POPT); poly[3-(4-octylphenyl)-2,2-bithiophene] (abbr.: PTOPT); and the like can be given. As the polyfluorene based material, a derivative of polyfluorene (abbr.: PF): poly(9,9-dialkylfluorene) (abbr.: PDAF); poly(9,9-dioctylfluorene) (abbr.: PDOF); and the like can be given.

The inorganic compound used for the light-emitting layer 51 may be any inorganic compound as long as the inorganic compound does not easily quench light emission of the organic compound, and any one of various kinds of metal oxide and metal nitride can be used. In particular, oxide of a metal that belongs to Group 13 or 14 of the periodic table is preferable because light emission of the organic compound is not easily quenched by such oxide, and specifically, aluminum oxide, gallium oxide, silicon oxide, or germanium oxide are preferable. However, the inorganic compound is not limited thereto.

It is to be noted that the light-emitting layer 51 may be formed by stacking a plurality of layers each including a combination of the organic compound and the inorganic compound that are described above, or may further include another organic compound or another inorganic compound. A layer structure of the light-emitting layer can be changed, and an electrode layer for injecting electrons may be provided or a light-emitting material may be dispersed, instead of providing a specific electron-injecting region or light-emitting region. Such a change can be permitted unless it departs from the spirit of the present invention.

A light-emitting element formed using the material as described above emits light when biased forwardly. A pixel of a display device formed with the light-emitting element can be driven by a simple matrix mode or an active matrix mode. In either mode, each pixel is made to emit light by applying a forward bias thereto in specific timing, and the pixel is in a non-light-emitting state for a certain period. By applying a reverse bias at this non-light-emitting time, reliability of the light-emitting element can be improved. In the light-emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating driving where bias voltage is applied forwardly and reversely. Thus, reliability of the light-emitting display device can be improved. Either a digital drive or an analog drive can be employed.

A color filter (colored layer) may be provided for a sealing substrate. The color filter (colored layer) can be formed by an evaporation method or a droplet-discharging method. With the use of the color filter (colored layer), high-definition display can be performed. This is because a broad peak can be modified to be sharp in the emission spectrum of each of R, G, and B by the color filter (colored layer).

Full color display can be performed by formation of a material emitting light of a single color and combination of the material with a color filter or a color conversion layer. A sealing substrate, for example, may be provided with the color filter (colored layer) or the color conversion layer and then attached to the substrate.

Naturally, display with monochromatic light emission may be performed. For instance, an area-color display device using monochromatic light emission may be formed. A passive-matrix display portion is suitable for the area-color display device, and characters and symbols can be mainly displayed thereon.

Figure 2A:
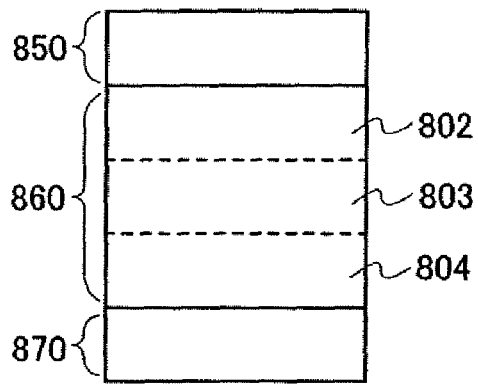
FIGS. 2A to 2D are views each explaining a light-emitting element of the present invention.
Figure 2A:
Figure 2B:
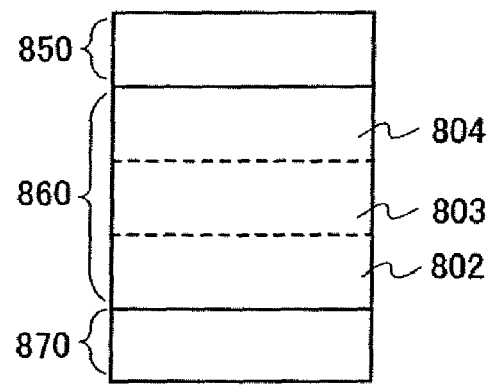
Figure 2B:

A material of each of the first electrode layer 870 and the second electrode layer 850 should be selected in consideration of a work function. Each of the first electrode layer 870 and the second electrode layer 850 can be either an anode (electrode layer at a high potential) or a cathode (electrode layer at a low potential) depending on the pixel structure. In the case where polarity of a driving thin film transistor is a p-channel type, the first electrode layer 870 may serve as an anode and the second electrode layer 850 may serve as a cathode as shown in FIG. 2A. In the case where polarity of the driving thin film transistor is an n-channel type, the first electrode layer 870 may serve as a cathode and the second electrode layer 850 may serve as an anode as shown in FIG. 2B. Materials that can be used for the first electrode layer 870 and the second electrode layer 850 are described. It is preferable to use a material having a higher work function (specifically, a material having a work function of 4.5 eV or higher) for one of the first electrode layer 870 and the second electrode layer 850, which serves as an anode, and a material having a lower work function (specifically, a material having a work function of 3.5 eV or lower) for the other electrode layer which serves as a cathode. However, since the first layer 804 is superior in a hole-injecting property and a hole-transporting property and the third layer 802 is superior in an electron-injecting property and an electron-transporting property, both of the first electrode layer 870 and the second electrode layer 850 are scarcely restricted by a work function, and various materials can be used.

Each of the light-emitting elements shown in FIGS. 2A and 2B has a structure in which light is extracted through the first electrode layer 870, and thus the second electrode layer 850 does not necessarily have a light-transmitting property. The second electrode layer 850 may be formed using a film mainly including an element selected from Ti, Ni, W, Cr, Pt, Zn, Sn, In, Ta, Al, Cu, Au, Ag, Mg, Ca, Li, or Mo, or an alloy material or compound material containing the element as its main component such as titanium nitride, $TiSi_xN_y$, $WSi_x$, tungsten nitride, $WSi_xN_y$, NbN or a stacked film thereof with a total thickness ranging from 100 nm to 800 nm.

In addition, when the second electrode layer 850 is formed using a light-transmitting conductive material, like the material used for the first electrode layer 870, light is also extracted through the second electrode layer 850, and a dual emission structure can be obtained, in which light emitted from the light-emitting element is emitted through both of the first electrode layer 870 and the second electrode layer 850.

It is to be noted that the light-emitting element according to the present invention has many variations by changing types of the first electrode layer 870 and the second electrode layer 850.

FIG. 2B shows a case where the EL layer 860 has a structure in which the first electrode layer 870, the third layer 802, the second layer 803, and the first layer 804 are sequentially provided.

Figure 2C:
Figure 2C:
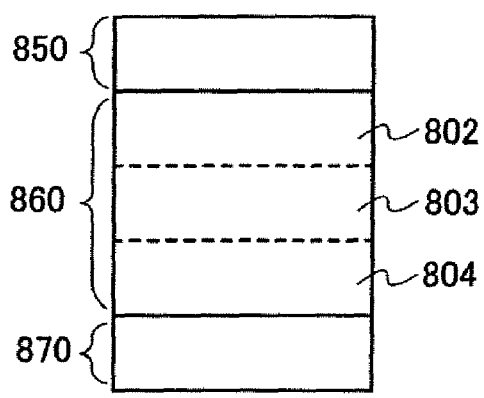
Figure 2D:
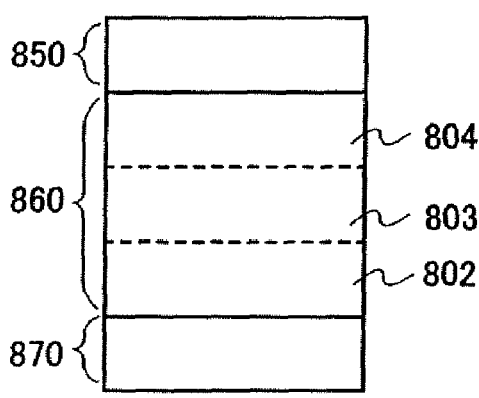

In FIG. 2C, an electrode layer having reflectivity is used for the first electrode layer 870, and an electrode layer having a light-transmitting property is used for the second electrode layer 850 in the structure of FIG. 2A. Light emitted from the light-emitting element is reflected by the first electrode layer 870, then, transmitted through the second electrode layer 850, and is emitted to outside. Similarly, in FIG. 2D, an electrode layer having reflectivity is used for the first electrode layer 870, and an electrode layer having a light-transmitting property is used for the second electrode layer 850 in the structure of FIG. 2B. Light emitted from the light-emitting element is reflected by the first electrode layer 870, and then transmitted through the second electrode layer 850 to be emitted to outside.

Any of various methods can be used as a method for forming the EL layer 860 when it is formed using a mixture of an organic compound and an inorganic compound. For example, a co-evaporation method in which both an organic compound and an inorganic compound are evaporated by resistance heating can be given. Alternatively, as co-evaporation, an inorganic compound may be evaporated by an electron beam (EB) while an organic compound may be evaporated by resistance heating. Further, an inorganic compound is sputtered while an organic compound may be evaporated by resistance heating, and then both of the compounds may be deposited the both at the same time. Alternatively, a wet process may be employed.

Each of the first electrode layer 870 and the second electrode layer 850 can be formed by an evaporation method by resistance heating, an EB evaporation method, a sputtering method, a CVD method, a spin coating method, a printing method, a dispenser method, a droplet-discharge method, or the like.

When a functional layer containing a mixed-valence compound is included in the light-emitting element of this embodiment mode, which includes the light-emitting layer containing an organic compound, the electron-transporting property of the functional layer can be improved. Therefore, the light-emitting element can be driven at low voltage to reduce its power consumption.

Accordingly, the light-emitting device including the light-emitting element of this embodiment mode, to which the present invention is applied, can achieve low power consumption and high reliability.

Embodiment Mode 2

In this embodiment mode, a mode of a light-emitting element in which a plurality of light-emitting units according to the present invention are stacked (this light-emitting element is also referred to as a stacked-type element) will be explained with reference to FIG. 20. This light-emitting element is a light-emitting element including a plurality of light-emitting units between a first electrode layer and a second electrode layer.

Figure 20:
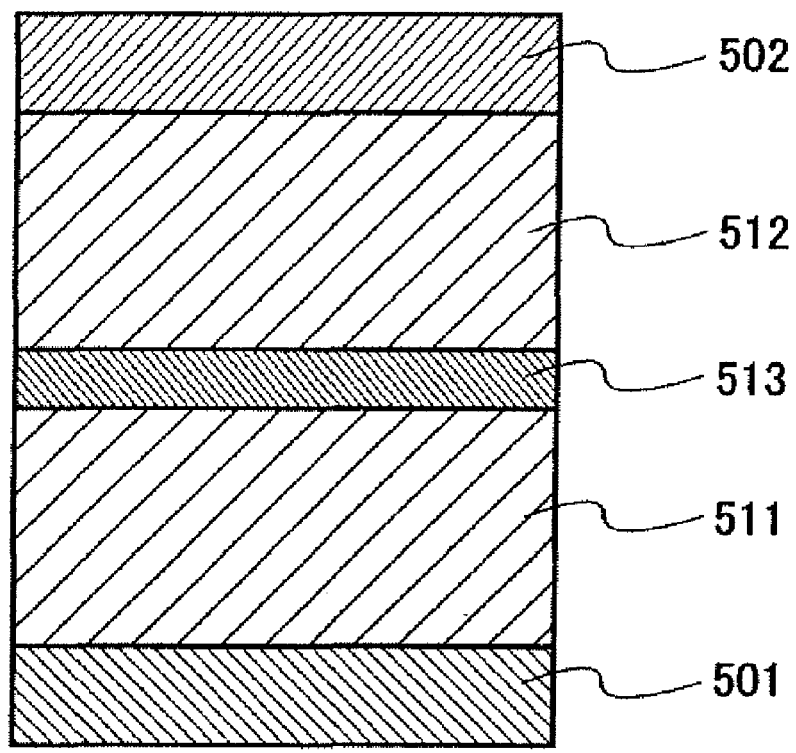
FIG. 20 is a view explaining a light-emitting element of the present invention.

In FIG. 20, a first light-emitting unit 511 and a second light-emitting unit 512 are stacked between a first electrode layer 501 and a second electrode layer 502. The first electrode layer 501 and the second electrode layer 502 can be similar to the electrode layers shown in Embodiment Mode 1. The first light-emitting unit 511 and the second light-emitting unit 512 may have either the same structure or a different structure, which may be similar to those shown in Embodiment Mode 1. Accordingly, a structure may be employed in which a mixed-valence compound is contained in at least one of functional layers included in the first light-emitting unit 511 and the second light-emitting unit 512.

A charge-generating layer 513 includes a composite material of an organic compound and metal oxide. This composite material of an organic compound and metal oxide is the composite material shown in Embodiment Mode 1 and includes the organic compound and metal oxide such as $V_2O_5$, $MoO_3$, or $WO_3$. As the organic compound, any of various compounds such as an aromatic amine compound, a carbazole derivative, aromatic hydrocarbon, and a high molecular compound (e.g., oligomer, dendrimer, or polymer) can be used. As the organic compound, it is preferable to use an organic compound having a hole-transporting property, which has a hole mobility of $10^{-6}$ $cm^2$/Vs or higher. However, other substances than these may also be used as long as the hole-transporting properties thereof are higher than the electron-transporting properties thereof. The composite material of the organic compound and metal oxide can realize low-voltage driving and low-current driving because of a superior carrier injecting property and carrier transporting property.

Alternatively, the charge-generating layer 513 may be formed with a combination of the composite material of the organic compound and metal oxide with another material. For example, a layer containing the composite material of the organic compound and metal oxide may be combined with a layer containing a compound selected from substances having electron-donating properties and a compound having a high electron-transporting property. Moreover, a layer containing the composite material of the organic compound and metal oxide may be combined with a transparent conductive film.

In any case, it is acceptable as long as the charge-generating layer 513 interposed between the first light-emitting unit 511 and the second light-emitting unit 512 injects electrons into one of these light-emitting units and holes to the other thereof when voltage is applied to the first electrode layer 501 and the second electrode layer 502.

This embodiment mode has described the light-emitting element having two light-emitting units. However, the present invention can be similarly applied to a light-emitting element in which three or more light-emitting units are stacked. When a charge-generating layer is provided between a pair of electrode layers so as to partition a plurality of light-emitting units, like the light-emitting element of this embodiment mode, a long lifetime element in a high luminance region can be realized while current density is kept low. When the light-emitting element is applied for lighting, voltage drop due to resistance of an electrode material can be suppressed, thereby achieving homogeneous light emission in a large area. Moreover, a light-emitting device of low power consumption, which can be driven at low voltage, can be realized.

This embodiment mode can be combined with Embodiment Mode 1 as appropriate.

Embodiment Mode 3

This embodiment mode will explain a structural example of a light-emitting device including the light-emitting element of the present invention with reference to drawings. More specifically, the case where a structure of a display device is a passive matrix type will be described.

Figure 4A:
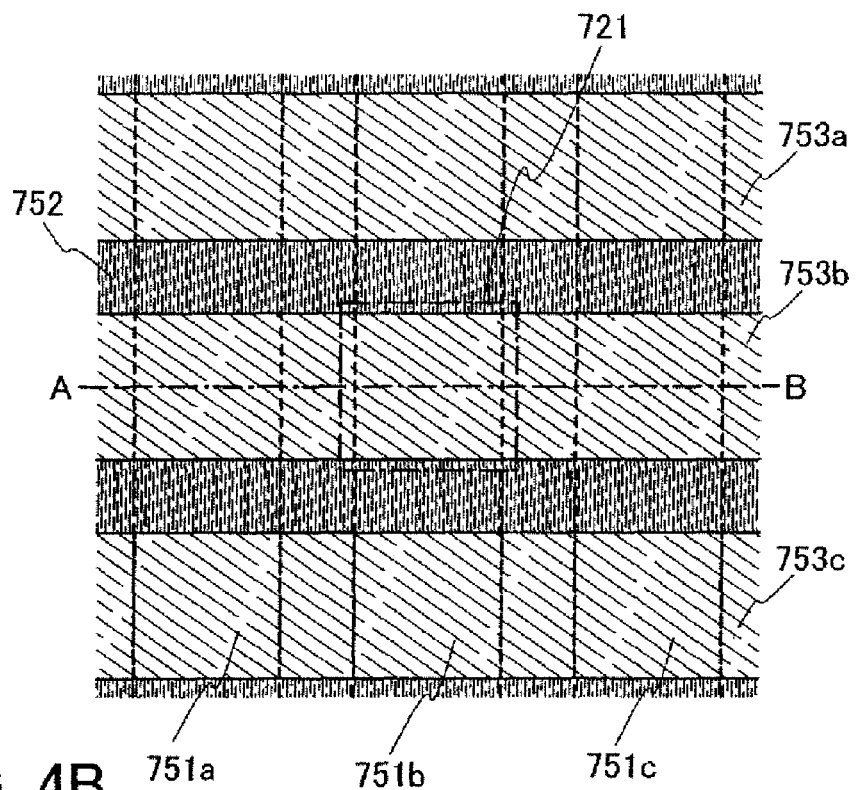
FIGS. 4A to 4C are views each explaining a light-emitting device of the present invention.

The light-emitting device includes first electrode layers 751*a*, 751*b*, and 751*c* extending in a first direction; an EL layer 752 provided to cover the first electrode layers 751*a*, 751*b*, and 751*c*; and second electrode layers 753*a*, 753*b*, and 753*c* extending in a second direction perpendicular to the first direction (see FIG. 4A). The EL layer 752 has a stacked structure including a light-emitting layer containing an organic compound and a functional layer containing a mixed-valence compound. The EL layer 752 is provided between the first electrode layers 751*a*, 751*b*, and 751*c* and the second electrode layers 753*a*, 753*b*, and 753*c*. In addition, an insulating layer 754 functioning as a protective film is provided so as to cover the second electrode layers 753*a*, 753*b*, and 753*c* (see FIG. 4B). When influence of an electric field in a lateral direction is concerned between adjacent light-emitting elements, the EL layer 752 provided in each light-emitting element may be separated.

Figure 4B:
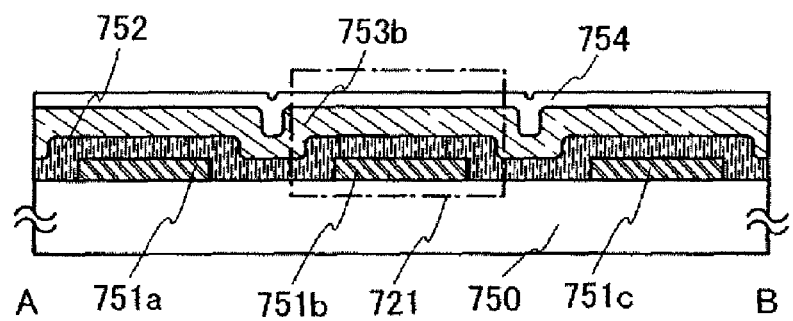
Figure 4C:
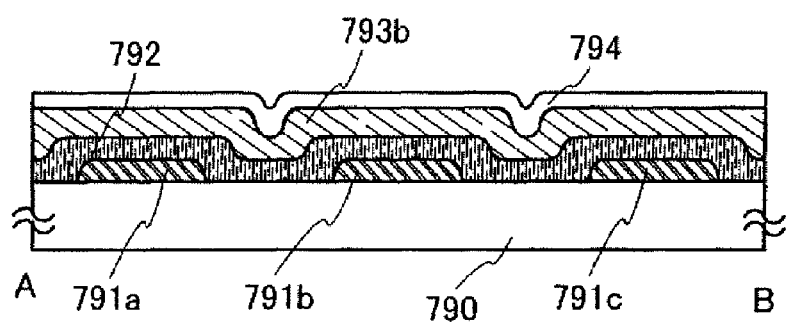

FIG. 4C is a deformed example of FIG. 4B. Over a substrate 790, there are first electrode layers 791*a*, 791*b*, and 791*c*, an EL layer 792 including a functional layer, a second electrode layer 793*b*, and an insulating layer 794 which is a protective layer. The EL layer 792 has a stacked structure including a light-emitting layer containing an organic compound and a functional layer containing a mixed-valence compound. As shown in FIG. 4C, the first electrode layers 791*a*, 791*b*, and 791*c* may have a tapered shape or a shape in which radius of curvature changes continuously. The shape like the first electrode layers 791*a*, 791*b*, and 791*c* can be formed by a droplet-discharging method or the like. With such a curved surface having a curvature, coverage of an insulating layer or conductive layer to be stacked thereover is favorable.

Figure 5A:
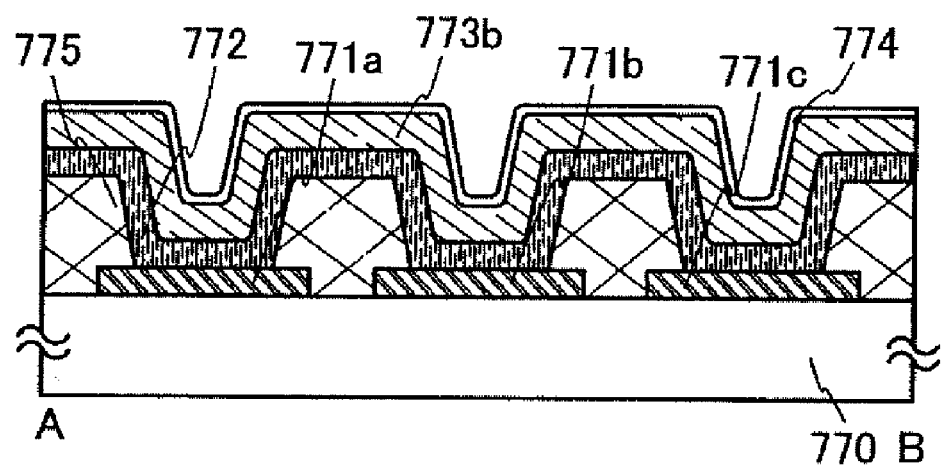
FIGS. 5A and 5B are views each explaining a light-emitting device of the present invention.
Figure 5B:
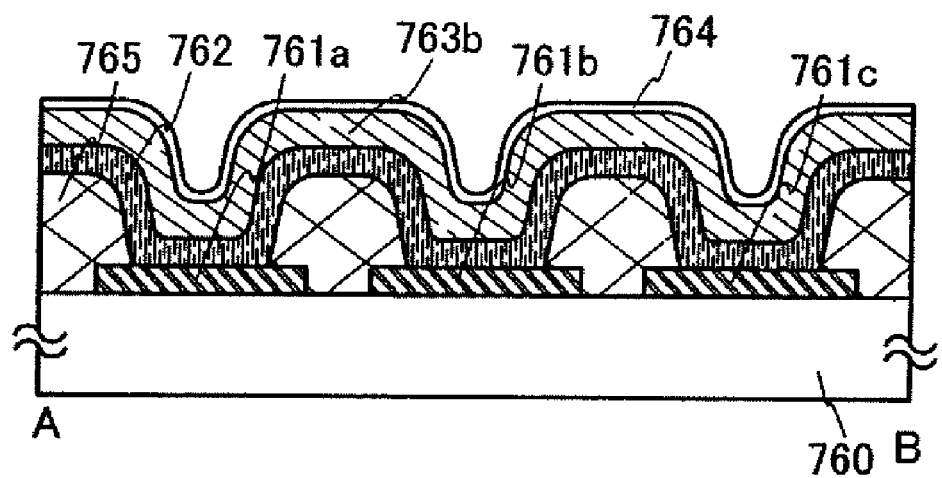

In addition, a partition wall (insulating layer) may be formed so as to cover the end portion of the first electrode layer. The partition wall (insulating layer) serves as a wall separating a light-emitting element and another light-emitting element. FIGS. 5A and 5B each show a structure in which the end portion of the first electrode layer is covered with the partition wall (insulating layer).

In an example of a light-emitting element shown in FIG. 5A, a partition wall (insulating layer) 775 is formed into a tapered shape to cover end portions of first electrode layers 771*a*, 771*b*, and 771*c*. The partition wall (insulating layer) 775 is formed over the first electrode layers 771*a*, 771*b*, and 771*c* provided over a substrate 770, and an EL layer 772, a second electrode 773*b*, and an insulating layer 774 are formed. The EL layer 772 has a stacked structure including a light-emitting layer containing an organic compound and a functional layer containing a mixed-valence compound.

An example of a light-emitting element shown in FIG. 5B has a shape in which a partition wall (insulating layer) 765 has a curvature, and radius of the curvature changes continuously. First electrode layers 761*a*, 761*b*, and 761*c* provided over a substrate 760, an EL layer 762 including a functional layer, a second electrode layer 763*b*, and an insulating layer 764 are formed. The EL layer 762 has a stacked structure including a light-emitting layer containing an organic compound and a functional layer containing a mixed-valence compound.

Figure 21A:
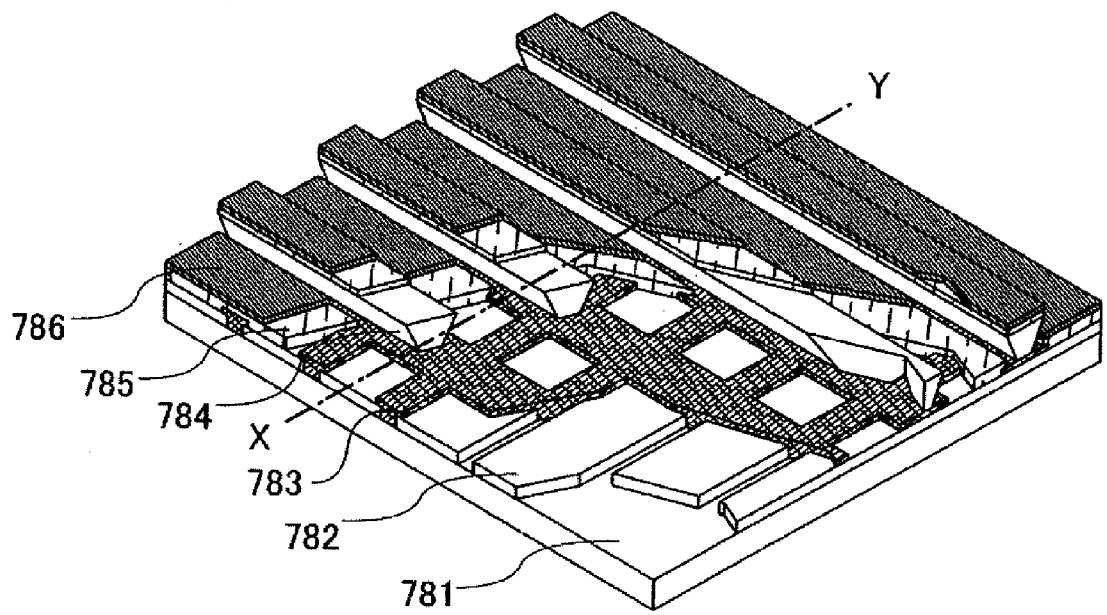
FIGS. 21A and 21B are views each explaining a light-emitting device of the present invention.
Figure 21B:
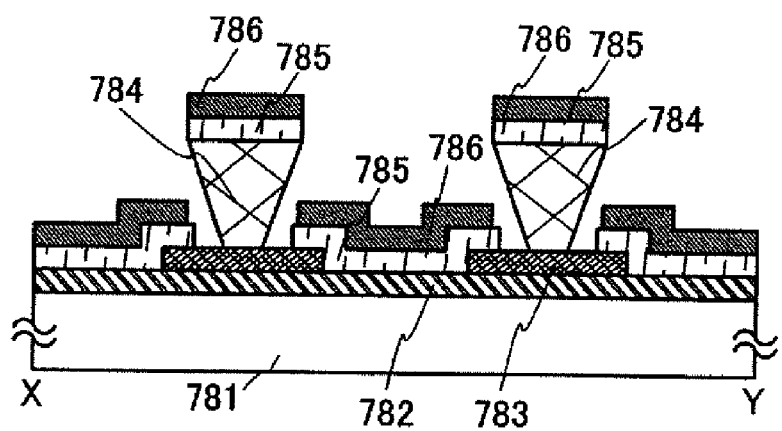

Another example of a partition wall is shown in FIGS. 21A and 21B. FIG. 21A is a perspective view of a passive matrix light-emitting device manufactured in accordance with the present invention, and FIG. 21B is a cross-sectional view taken along a line X-Y in FIG. 21A. In FIGS. 21A and 21B, an EL layer 785 is provided between a first electrode layer 782 and a second electrode layer 786 over a substrate 781. The EL layer 785 has a stacked structure including a light-emitting layer containing an organic compound and a functional layer containing a mixed-valence compound. The end portion of the first electrode layer 782 is covered with an insulating layer 783. A partition wall (insulating layer) 784 is provided over the insulating layer 783. The partition wall (insulating layer) 784 slopes so that a distance between one side wall and the other side wall becomes narrow toward the substrate surface. That is, a cross section taken in the direction of the short sides of the partition layer 784 is trapezoidal, and the base of the cross-section, (a side in the same direction as a plane direction of the insulating layer 783 and in contact with the insulating layer 783), is shorter than the upper side thereof, (a side in the same direction as the plane direction of the insulating layer 783 and not in contact with the insulating layer 783). The partition wall (insulating layer) 784 provided in this manner can prevent the light-emitting element from being defective due to static electricity or the like.

The EL layer 762 which is formed in accordance with the present invention and provided between the electrode layers has the functional layer containing a mixed-valence compound. Accordingly, a light-emitting element can be driven at low voltage to reduce its power consumption. A light-emitting device with high reliability can thus be manufactured.

When an element in a compound has a plurality of valences, this element is in a state that is referred to as a mixed-valence state and this compound is referred to as a mixed-valence compound. An example of a mixed-valence state is a state in which an element M contained in a compound MX has valences of +n and +m (n≠m), that is, a plurality of valences. An element may have three or more valences.

Specific examples of valences include a mixed state of valences of +1 and +2, a mixed state of valences of +2 and +3, and further a mixed state of valences of +1, +2, and +3. As valences that form a mixed-valence state, numbers are not necessarily consecutive and the case of a mixed state of valences of +1 and +3 may be possible. Furthermore, in one compound, each of two or more elements may be in a mixed-valence state. For example, in the case of the above compound MX, an element X has valences of −a and −b (a≠b) and an element M has valences of +n and +m (n≠m). The mixed-valence compound used in the present invention includes, in its category, both organic compounds and inorganic compounds. Moreover, a compositional formula of the compound may be non-stoichiometric.

The compound can be in a mixed-valence state and the state (e.g., ratio of valences) thereof can be controlled depending on conditions for the formation or the synthesis. Examples of the conditions include a synthetic temperature, kinds of raw materials or the quantity thereof to be mixed, and the like in synthesizing an objective compound. The compound can be in a mixed-valence state and the state thereof can be controlled also depending on a state in which a thin film is formed (film formation method such as vacuum evaporation or the like). Further, in some cases, oxide or sulfide can be in a mixed-valence state by a defect or by doping of a certain element. The valence state can be classified into an ordered type and a disordered type according to the state. In a disordered type, an element having valences of +n and +m (an atom having a valence of +n and an atom having a valence of +m) is randomly distributed in a crystal structure. On the other hand, in an ordered type, an element of an atom having a valence of +n and an atom having a valence of +m is not randomly distributed but aligned in a certain site. For example, a compound is in a state in which only an atom having a valence of +n is in one site and only an atom having a valence of +m is in another site. It is considered that a disordered type is preferable for hopping conduction. Among such mixed-valence compounds are a lot of materials having interesting properties, such as a superconductor and a sensor.

Hopping conduction occurs in a mixed-valence compound because it has different valences. Such hopping conduction can thus improve the mobility of a charge (carrier). Therefore, when a mixed-valence compound is contained in a functional layer of a light-emitting element, the light-emitting element can be driven at low voltage to achieve the decrease of power consumption and the improvement of reliability.

Among elements in a mixed-valence state are a transition metal and a rare-earth metal. For example, europium (Eu) has valences of +2 and +3. Among mixed-valence compounds are a metal chalcogenide such as metal oxide and metal sulfide, and the like. For example, molybdenum oxide ($MoO_3$) is formed as a compound in a state in which molybdenum (Mo) has not only a valence of +3, but valences of both +2 and +3 in combination.

Oxide or sulfide of a transition metal and a rare-earth metal can be used for the mixed-valence compound contained in the above functional layer. For example, as oxide, there are perovskite-type oxide such as strontium titanate ($SrTiO_3$); a ferrite material such as magnetic ($Fe_3O_4$), manganese ferrite ($MnFe_2O_4$), or nickel ferrite ($NiFe_2O_4$); tungsten trioxide ($WO_3$), vanadium oxide ($V_2O_5$), molybdenum oxide ($MoO_3$), rhenium oxide ($ReO_3$), europium oxide ($Eu_3O_4$), lithium titanate ($LiTi_2O_4$), manganese oxide ($Mn_3O_4$), cobalt oxide ($Co_3O_4$), antimony oxide ($Sb_2O_4$), lead oxide ($Pb_3O_4$), and the like. As sulfide, there are europium sulfide ($Eu_3S_4$), copper sulfide ($Cu_xS$) (x is in the range of 1 to 2), gallium sulfide (GaS), thallium sulfide (TlS), and the like. Furthermore, as a halogen compound, there are silver fluoride ($Ag_2F$), indium halide ($InF_2$, $InCl_2$, $InBr_2$, or $InI_2$), tantalum chloride ($Ta_6Cl_{15}$), thallium chloride ($Tl_4Cl_6$), and gallium chloride ($GaCl_2$). Moreover, as nitride, there are indium nitride (InN), tin nitride (SnN), and the like. As arsenide, there are europium arsenide ($Eu_3As_4$) and the like. Furthermore, a metallic complex of platinum (Pt), palladium (Pd), nickel (Ni), iridium (Ir), or iron (Fe) is in a mixed-valence state. It is to be noted that manganese oxide ($Mn_3O_4$) and copper sulfide ($Cu_xS$) (x is in the range of 1 to 2) are more preferable. Some of oxide or sulfide are in a mixed-valence state when oxygen defect or sulfur defect are generated. It is considered that such oxide and sulfide are useful for a hole-transporting layer because they become p-type semiconductor.

A quartz substrate, a silicon substrate, a metal substrate, a stainless-steel substrate, or the like, in addition to a glass substrate and a flexible substrate, can be used as the substrates 750, 760, 770, 781, and 790. The flexible substrate is a substrate that can be bent, such as a plastic substrate formed using polycarbonate, polyarylate, polyether sulfone, or the like. In addition, a film (formed using polypropylene, polyester, vinyl, polyvinyl fluoride, vinyl chloride, or the like), paper made of a fibrous material, a base film (polyester, polyamide, an inorganic evaporated film, paper, or the like), or the like can be used. Alternatively, the light-emitting element can be provided over a field effect transistor (FET) formed on a semiconductor substrate such as a Si substrate, or over a thin film transistor (TFT) formed over a substrate such as a glass substrate.

Any of the materials and methods of the EL layer including the first electrode layer, the second electrode layer, the light-emitting material, and the functional layer and the light-emitting layer, described in the above Embodiment Mode 1, can be similar to those described in this embodiment mode.

For the partition walls (insulating layers) 765, 775, and 784, silicon oxide, silicon nitride, silicon oxynitride, aluminum oxide, aluminum nitride, aluminum oxynitride, or other inorganic insulating materials; acrylic acid, methacrylic acid, or a derivative thereof; a heat-resistant high molecular material such as polyimide, aromatic polyamide, or polybenzimidazole; or a siloxane resin may be used. Alternatively, the following resin materials can be used: a vinyl resin such as polyvinyl alcohol or polyvinylbutyral, an epoxy resin, a phenol resin, a novolac resin, an acrylic resin, a melamine resin, a urethane resin, and the like. Further alternatively, an organic material such as benzocyclobutene, parylene, fluorinated arylene ether, or polyimide; or the like may be used. A vapor deposition method such as a plasma CVD method or a thermal CVD method, or a sputtering method can be used as a formation method of the partition walls. A droplet-discharging method or a printing method (a method to form a pattern, such as screen printing or offset printing) can also be used. A coating film or an SOG film obtained by a coating method or the like can also be used.

After the conductive layer, the insulating layer, or the like is formed by discharge of a composition by a droplet-discharging method, a surface thereof may be planarized by pressing with pressure to enhance planarity. The pressing may be performed as follows: unevenness is reduced by rolling a roller-shaped object on the surface, the surface is pressed with a flat plate-shaped object, or the like. A heating step may also be performed at the time of the pressing. Alternatively, the concavity and convexity of the surface may be removed with an air knife after the surface is softened or melted with a solvent or the like. A CMP method may also be used for polishing the surface. This step can be employed in planarizing the surface when concavity and convexity are generated by a droplet-discharging method.

When a functional layer containing a mixed-valence compound is included in the light-emitting element of this embodiment mode, which includes the light-emitting layer containing an organic compound, the electron-transporting property of the functional layer can be improved. Therefore, the light-emitting element can be driven at low voltage to reduce its power consumption.

Accordingly, the light-emitting device including the light-emitting element of this embodiment mode, to which the present invention is applied, can achieve low power consumption and high reliability.

Embodiment Mode 4

This embodiment mode will explain a light-emitting device having a structure that is different from that of Embodiment Mode 2. Specifically, a case where a structure of a light-emitting device is an active matrix type will be shown.

Figure 6A:
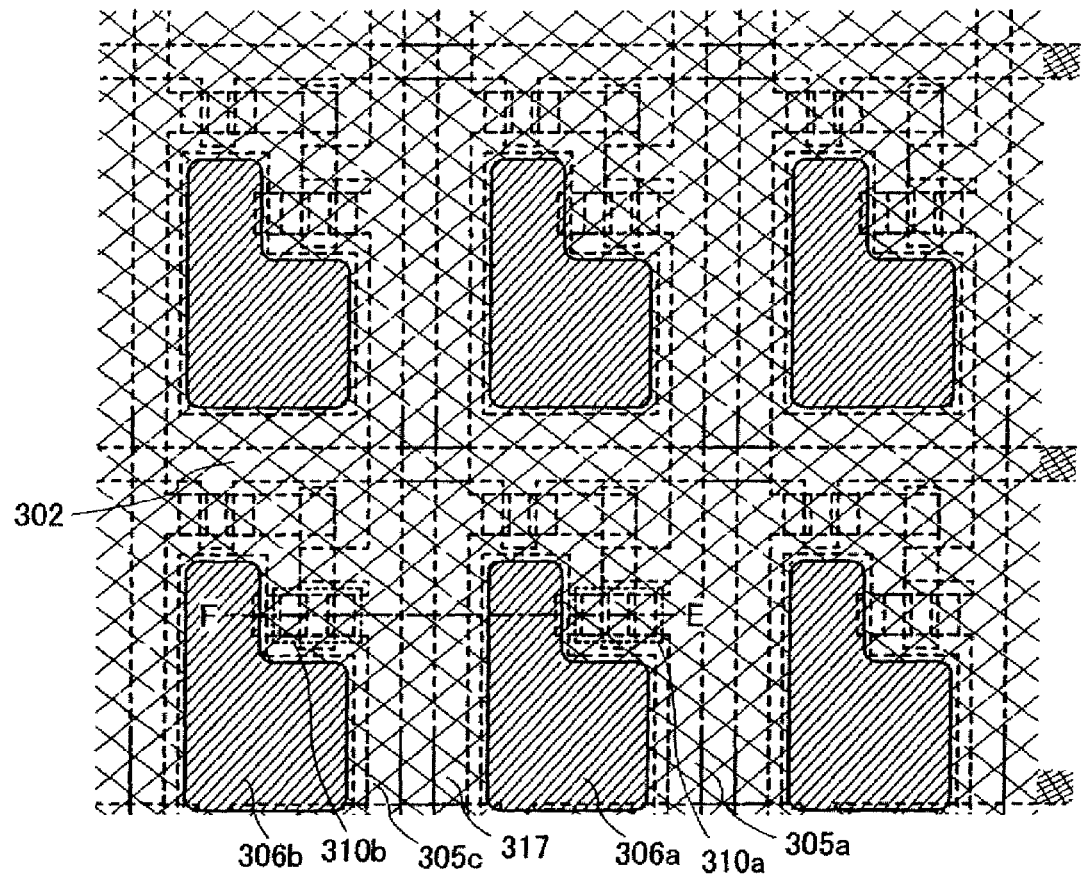
FIGS. 6A and 6B are views each explaining a light-emitting device of the present invention.
Figure 6B:
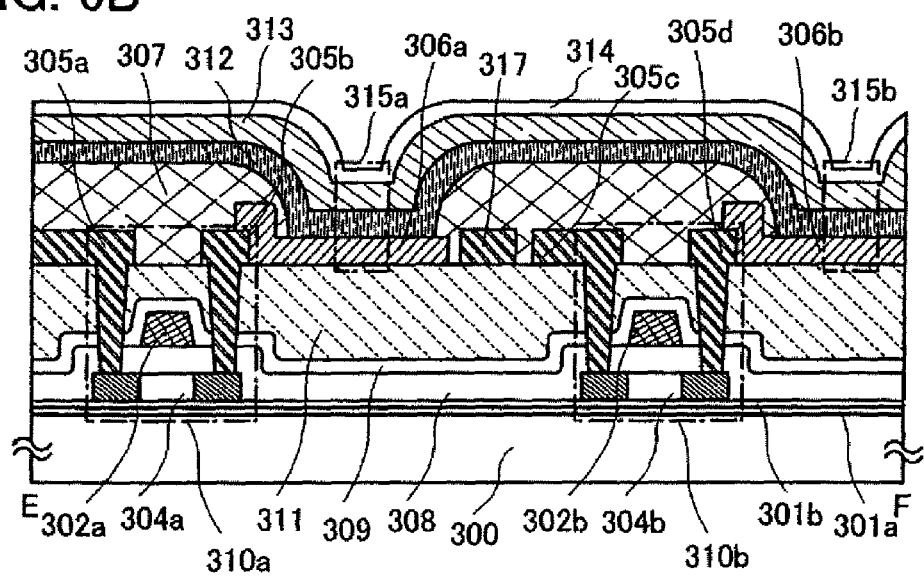

FIG. 6A is a top view of the light-emitting device, and FIG. 6B is a cross-sectional view taken along a line E-F in FIG. 6A. Although an EL layer 312, a second electrode layer 313, and an insulating layer 314 are not illustrated in FIG. 6A, they are provided as shown in FIG. 6B. The EL layer 312 has a stacked structure including a light-emitting layer containing an organic compound and a functional layer containing a mixed-valence compound.

A first wiring extending in a first direction and a second wiring extending in a second direction perpendicular to the first direction are provided in a matrix. The first wiring is connected to a source electrode layer or drain electrode layer of each of transistors 310a and 310b, and the second wiring is connected to a gate electrode layer of each of the transistors 310a and 310b. A first electrode layer 306a is connected to the source electrode layer or drain electrode layer of the transistor 310a, which is not connected to the first wiring, and a first electrode layer 306b is connected to the source electrode layer or the drain electrode layer of the transistor 310b, which is not connected to the first wiring. Light-emitting elements 315a and 315b are provided as a stacked structure of the first electrode layers 306a and 306b, the EL layer 312, and the second electrode layer 313. A partition wall (insulating layer) 307 is provided between the adjacent light-emitting elements. The EL layer 312 and the second electrode layer 313 are stacked over the first electrode layers 306a and 306b and the partition wall (insulating layer) 307. An insulating layer 314 to serve as a protective layer is provided over the second electrode layer 313. In addition, a thin film transistor is used for each of the transistors 310a and 310b (see FIG. 6B).

The light-emitting elements in FIG. 6B are provided over a substrate 300. The substrate 300 is provided with insulating layers 301a, 301b, 308, 309, and 311; a semiconductor layer 304a, a gate electrode layer 302a, and a wiring 305a serving as a source electrode layer or a drain electrode layer, which form a transistor 310a; and a semiconductor layer 304b and a gate electrode layer 302b which form a transistor 310b. The EL layer 312 and the second electrode layer 313 are formed over the first electrode layers 306a and 306b and the partition wall (insulating layer) 307.

Figure 11:
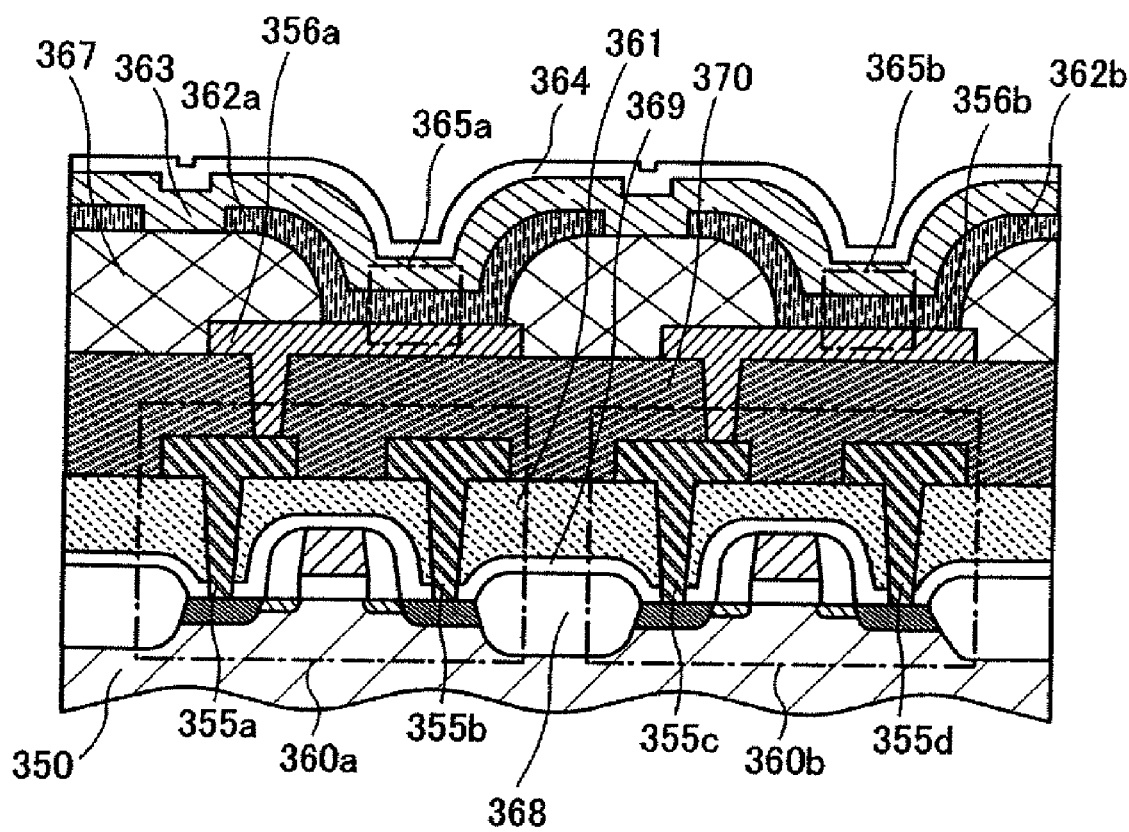
FIG. 11 is a view explaining a light-emitting device of the present invention.

As shown in FIG. 11, light-emitting elements 365a and 365b may be connected to field effect transistors 360a and 360b, respectively, which are provided over a single crystal semiconductor substrate 350. In this case, an insulating layer 370 is provided so as to cover source or drain electrode layers 355a to 355d of the field effect transistors 360a and 360b. Over the insulating layer 370, the light-emitting element 365a is formed of a first electrode layer 356a, a partition wall (insulating layer) 367, an EL layer 362a, and a second electrode layer 363; and the light-emitting element 365b is formed of a first electrode layer 356b, the partition wall (insulating layer) 367, an EL layer 362b, and the second electrode layer 363. The EL layer may selectively be provided with the use of a mask or the like only for each light-emitting element, like the EL layers 362a and 362b. The EL layers 362a and 362b each have a stacked structure including a light-emitting layer containing an organic compound and functional layers containing a mixed-valence compound. Moreover, the light-emitting device shown in FIG. 11 also includes an element separating region 368, insulating layers 369, 361, and 364. The EL layers 362a and 362b are formed over the first electrode layers 356a and 356b and the partition wall 367. Further, the second electrode layer 363 is formed over the EL layers 362a and 362b.

The EL layers 312, 362a, and 362b included in the light-emitting elements manufactured according to the present invention includes the functional layer (e.g., a hole-injecting layer, a hole-transporting layer, an electron-injecting layer, and an electron-transporting layer) as well as the light-emitting layer. At least one of the functional layers may contain a mixed-valence compound. It is needles to say that all the functional layers may each contain a mixed-valence compound.

When an element in a compound has a plurality of valences, this element is in a state that is referred to as a mixed-valence state and this compound is referred to as a mixed-valence compound. An example of a mixed-valence state is a state in which an element M contained in a compound MX has valences of +n and +m (n≠m), that is, a plurality of valences. An element may have three or more valences.

Specific examples of valences include a mixed state of valences of +1 and +2, a mixed state of valences of +2 and +3, and further a mixed state of valences of +1, +2, and +3. As valences that form a mixed-valence state, numbers are not necessarily consecutive and the case of a mixed state of valences of +1 and +3 may be possible. Furthermore, in one compound, each of two or more elements may be in a mixed-valence state. For example, in the case of the above compound MX, an element X has valences of −a and −b (a≠b) and an element M has valences of +n and +m (n≠m). The mixed-valence compound used in the present invention includes, in its category, both organic compounds and inorganic compounds. Moreover, a compositional formula of the compound may be non-stoichiometric.

The compound can be in a mixed-valence state and the state (e.g., ratio of valences) thereof can be controlled depending on conditions for the formation or the synthesis. Examples of the conditions include a synthetic temperature, kinds of raw materials or the quantity thereof to be mixed, and the like in synthesizing an objective compound. The compound can be in a mixed-valence state and the state thereof can be controlled also depending on a state in which a thin film is formed (film formation method such as vacuum evaporation or the like). Further, in some cases, oxide or sulfide can be in a mixed-valence state by a defect or by doping of a certain element. The valence state can be classified into an ordered type and a disordered type according to the state. In a disordered type, an element having valences of +n and +m (an atom having a valence of +n and an atom having a valence of +m) is randomly distributed in a crystal structure. On the other hand, in an ordered type, an element of an atom having a valence of +n and an atom having a valence of +m is not randomly distributed but aligned in a certain site. For example, a compound is in a state in which only an atom having a valence of +n is in one site and only an atom having a valence of +m is in another site. It is considered that a disordered type is preferable for hopping conduction. Among such mixed-valence compounds are a lot of materials having interesting properties, such as a superconductor and a sensor.

Hopping conduction occurs in a mixed-valence compound because it has different valences. Such hopping conduction can thus improve the mobility of a charge (carrier). Therefore, when a mixed-valence compound is contained in a functional layer of a light-emitting element, the light-emitting element can be driven at low voltage to achieve the decrease of power consumption and the improvement of reliability.

Among elements in a mixed-valence state are a transition metal and a rare-earth metal. For example, europium (Eu) has valences of +2 and +3. Among mixed-valence compounds are metal chalcogenide such as metal oxide and metal sulfide, and the like. For example, molybdenum oxide ($MoO_3$) is formed as a compound in a state in which molybdenum (Mo) has not only a valence of +3, but valences of both +2 and +3 in combination.

Oxide or sulfide of a transition metal and a rare-earth metal can be used for the mixed-valence compound contained in the above functional layer. For example, as oxide, there are perovskite-type oxide such as strontium titanate ($SrTiO_3$); a ferrite material such as magnetic ($Fe_3O_4$), manganese ferrite ($MnFe_2O_4$), or nickel ferrite ($NiFe_2O_4$); tungsten trioxide ($WO_3$), vanadium oxide ($V_2O_5$), molybdenum oxide ($MoO_3$), rhenium oxide ($ReO_3$), europium oxide ($Eu_3O_4$), lithium titanate ($LiTi_2O_4$), manganese oxide ($Mn_3O_4$), cobalt oxide ($Co_3O_4$), antimony oxide ($Sb_2O_4$), lead oxide ($Pb_3O_4$), and the like. As sulfide, there are europium sulfide ($Eu_3S_4$), copper sulfide ($Cu_xS$) (x is in the range of 1 to 2), gallium sulfide (GaS), thallium sulfide (TlS), and the like. Furthermore, as a halogen compound, there are silver fluoride ($Ag_2F$), indium halide ($InF_2$, $InCl_2$, $InBr_2$, or $InI_2$), tantalum chloride ($Ta_6Cl_5$), thallium chloride ($Tl_4Cl_6$), and gallium chloride ($GaCl_2$). Moreover, as nitride, there are indium nitride (InN), tin nitride (SnN), and the like. As arsenide, there are europium arsenide ($Eu_3As_4$) and the like. Furthermore, a metallic complex of platinum (Pt), palladium (Pd), nickel (Ni), iridium (Ir), or iron (Fe) is in a mixed-valence state. It is to be noted that manganese oxide ($Mn_3O_4$) and copper sulfide ($Cu_xS$) (x is in the range of 1 to 2) are more preferable. Some of oxide or sulfide are in a mixed-valence state when oxygen defect or sulfur defect are generated. It is considered that such oxide and sulfide are useful for a hole-transporting layer because they become p-type semiconductor.

When the insulating layer 370 is provided to form the light-emitting elements as shown in FIG. 11, the first electrode layers can be freely arranged. In other words, although the light-emitting elements 315a and 315b are required to be provided in a region where the source electrode layer or drain electrode layer of the transistors 310a and 310b is not provided in the structure of FIG. 6B, the light-emitting elements 315a and 315b can be formed, for example, over the transistors 310a and 310b, respectively, in the above structure. Consequently, the light-emitting device can be more highly integrated.

The transistors 310a and 310b may have any structure as long as they can function as switching elements. Various semiconductors such as an amorphous semiconductor, a crystalline semiconductor, a polycrystalline semiconductor, and a microcrystal semiconductor can be used as a semiconductor layer, and an organic transistor may also be formed using an organic compound. FIG. 6A shows an example in which a planar type thin film transistor is provided over an insulating substrate; however, a transistor can also be a staggered type or a reverse staggered type.

When a functional layer containing a mixed-valence compound is included in the light-emitting element of this embodiment mode, which includes the light-emitting layer containing an organic compound, the electron-transporting property of the functional layer can be improved. Therefore, the light-emitting element can be driven at low voltage to reduce its power consumption.

Accordingly, the light-emitting device including the light-emitting element of this embodiment mode, to which the present invention is applied, can achieve low power consumption and high reliability.

Embodiment Mode 5

A manufacturing method of a light-emitting device in this embodiment mode will be explained in detail with reference to FIGS. 7A and 7B, FIG. 8, FIGS. 16A to 16C, and FIGS. 17A and 17B.

Figure 16A:
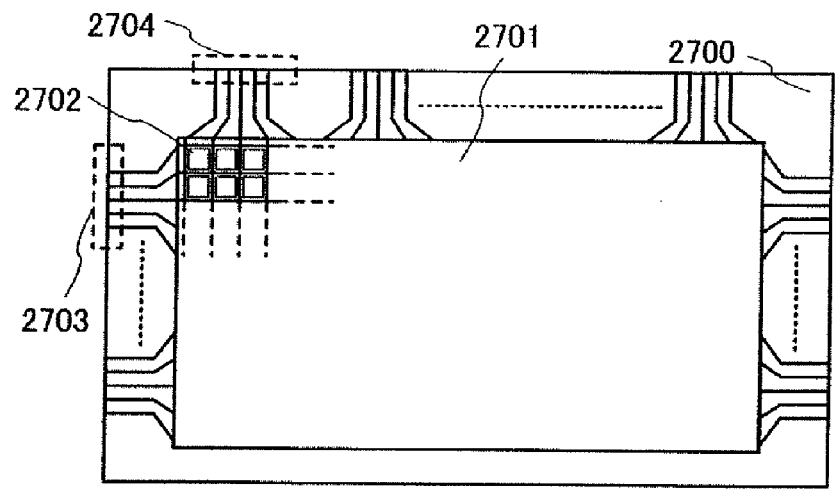
FIGS. 16A to 16C are top views of a light-emitting device of the present invention.

FIG. 16A is a top view showing a structure of a display panel in accordance with the present invention, which includes, over a substrate 2700 having an insulating surface, a pixel portion 2701 in which pixels 2702 are arranged in a matrix, a scanning line input terminal 2703, and a signal line input terminal 2704. The number of pixels may be set depending on various standards: 1024×768×3 (RGB) in the case of XGA and full-color display using RGB, 1600×1200×3 (RGB) in the case of UXGA and full-color display using RGB, and 1920×1080×3 (RGB) in the case of full spec high vision and full-color display using RGB.

The pixels 2702 are arranged in a matrix in such a manner that a scanning line extending from the scanning line input terminal 2703 and a signal line extending from the signal line input terminal 2704 are intersected. Each of the pixels 2702 is provided with a switching element and a pixel electrode layer connected thereto. A typical example of the switching element is a TFT. A gate electrode layer side of the TFT is connected to the scanning line, and a source or drain side of the TFT is connected to the signal line; thus, each pixel can be controlled independently by a signal input from outside.

Figure 17A:
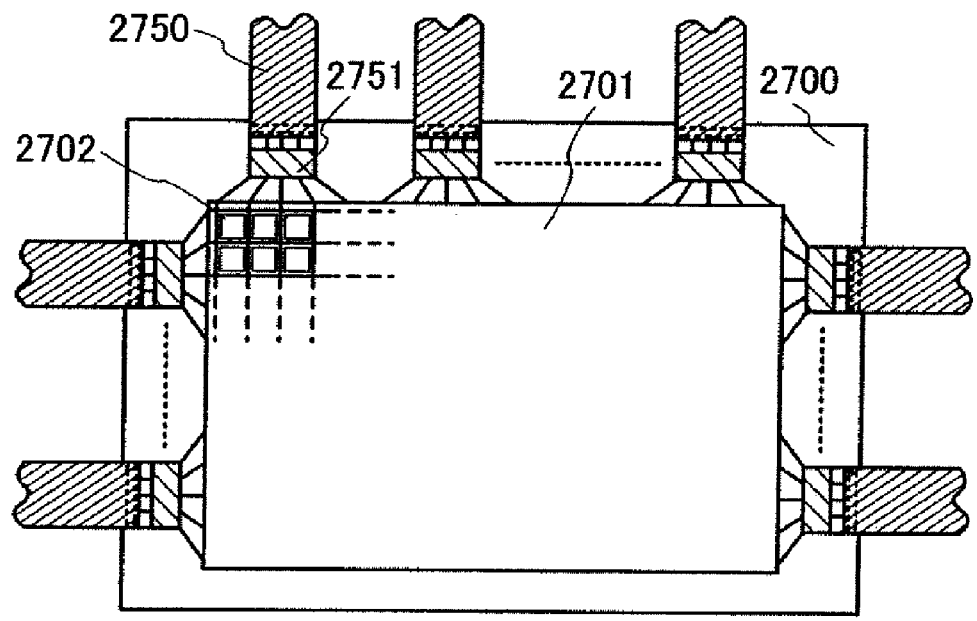
FIGS. 17A and 17B are each a top view of a light-emitting device of the present invention.
Figure 17B:
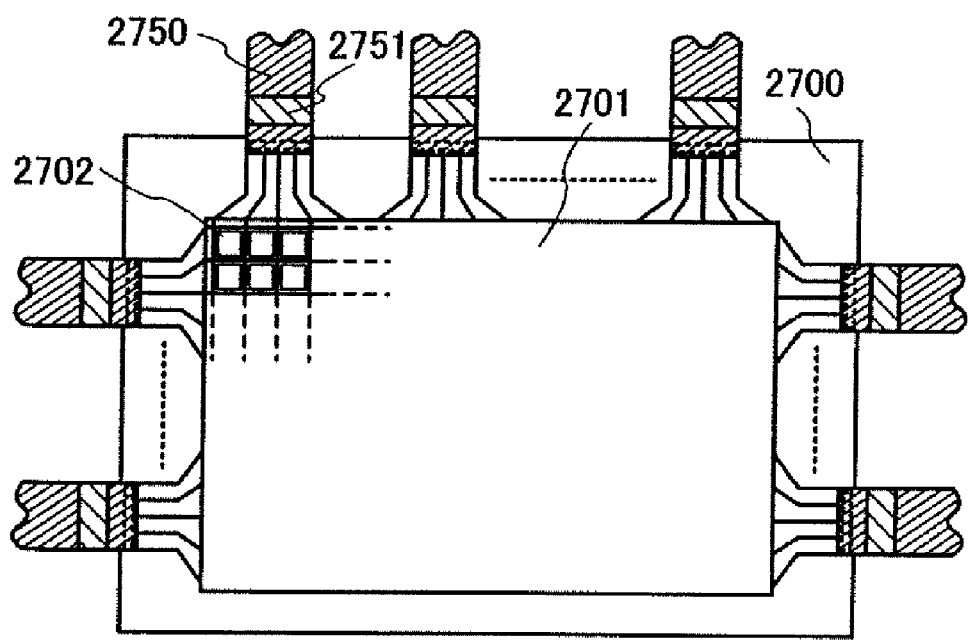

FIG. 16A shows a structure of a display panel in which signals to be input to the scanning line and the signal line are controlled by an external driver circuit; however, a driver IC 2751 may also be mounted on the substrate 2700 by a chip on glass (COG) method as shown in FIG. 17A. Further, as another mode, a tape automated bonding (TAB) method as shown in FIG. 17B may also be employed. A driver IC may be formed using a single crystal semiconductor substrate, or a circuit including TFT's formed over a glass substrate. In FIGS. 17A and 17B, the driver IC 2751 is connected to a flexible printed circuit (FPC) 2750.

Figure 16B:
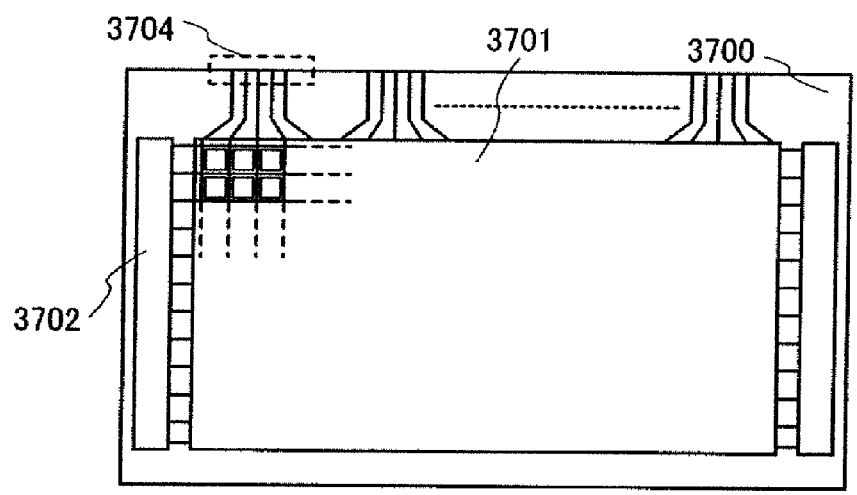
Figure 16C:
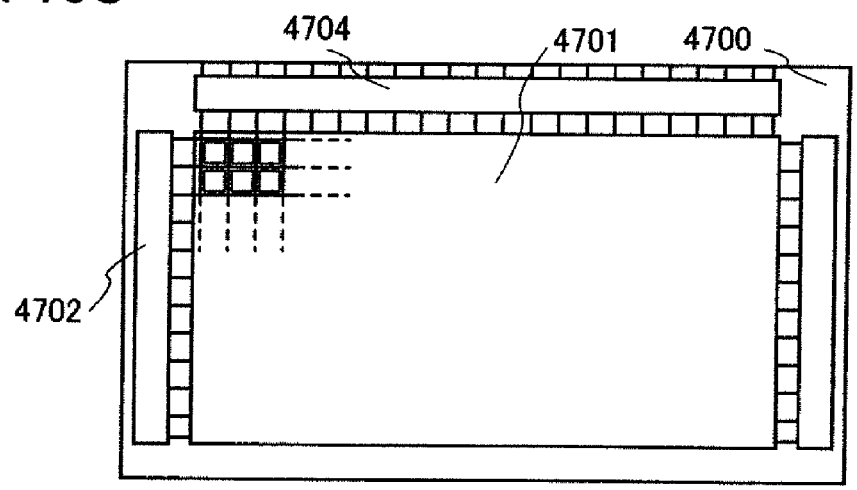

Further, in the case where a TFT to be provided in each of the pixels 2702 is formed using a crystalline semiconductor, a scanning line driver circuit 3702 can be formed over a substrate 3700 as shown in FIG. 16B. In FIG. 16B, a pixel portion 3701 is controlled by an external driver circuit, to which a signal line input terminal 3704 is connected, similarly to FIG. 16A. In the case where a TFT to be provided in each of the pixels 2702 is formed using a polycrystalline (microcrystalline) semiconductor, a single crystal semiconductor, or the like with high mobility, a pixel portion 4701, a scanning line driver circuit 4702, and a signal line driver circuit 4704 can be integrated over a substrate 4700 as shown in FIG. 16C.

A base film 101a is formed using silicon nitride oxide to a thickness of 10 to 200 nm (preferably, 50 to 150 nm) over a substrate 100 having an insulating surface by a sputtering method, a physical vapor deposition (PVD) method, a chemical vapor deposition (CVD) method such as a low-pressure CVD (LPCVD) method or a plasma CVD method, or the like; and a base film 101b is stacked thereover using a silicon oxynitride to a thickness of 50 to 200 nm (preferably, 100 to 150 nm). Acrylic acid, methacrylic acid, and a derivative thereof, a heat-resistant high-molecular material such as polyimide, aromatic polyamide, or polybenzimidazole, or a siloxane resin may alternatively be used. Further, the following resin materials may also be used: a vinyl resin such as polyvinyl alcohol or polyvinylbutyral, an epoxy resin, a phenol resin, a novolac resin, an acrylic resin, a melamine resin, an urethane resin, and the like. Furthermore, an organic material such as benzocyclobutene, parylene, fluorinated arylene ether, or polyimide; a composite material containing a water-soluble homopolymer and a water-soluble copolymer, or the like may be used. In addition, an oxazole resin can be used, and for example, photo-curable type polybenzoxazole or the like can be used.

A droplet-discharging method, a printing method, (a method to form a pattern, such as screen printing or offset printing), a coating method such as a spin coating method, a dipping method, a dispenser method, or the like can also be used. In this embodiment mode, the base films 101a and 101b are formed by a plasma CVD method. The substrate 100 may be a glass substrate, a quartz substrate, a silicon substrate, a metal substrate, or a stainless steel substrate having a surface covered with an insulating film. Further, a plastic substrate which can withstand a processing temperature of this embodiment mode, or a flexible substrate such as a film may also be used. As a plastic substrate, a substrate made of polyethylene terephthalate (PET), polyethylene naphthalate (PEN), or polyether sulfone (PES) may be used, and as a flexible substrate, a substrate made of a synthetic resin such as acrylic can be used. Because a light-emitting device manufactured in this embodiment mode has a structure in which light from a light-emitting element is extracted through the substrate 100, the substrate 100 is required to have a light-transmitting property.

The base film can be formed using silicon oxide, silicon nitride, silicon oxynitride, silicon nitride oxide, or the like, and may be a single layer or have a staked layer structure including two or three layers.

Subsequently, a semiconductor film is formed over the base film. The semiconductor film may be formed to a thickness of 25 to 200 nm (preferably, 30 to 150 nm) by any method (e.g., a sputtering method, an LPCVD method, or a plasma CVD method). In this embodiment mode, it is preferable to use a crystalline semiconductor film formed by crystallization of an amorphous semiconductor film by laser irradiation.

The semiconductor film can be formed of an amorphous semiconductor (hereinafter also referred to as "AS") formed by a vapor deposition method or a sputtering method, using a semiconductor material gas typified by silane or germane; a polycrystalline semiconductor formed by crystallization of an amorphous semiconductor using light energy or thermal energy; a semi-amorphous semiconductor (also referred to as microcrystal and hereinafter also referred to as "SAS"); or the like.

An SAS is a semiconductor having an intermediate structure between amorphous and crystalline (including single crystal and polycrystalline) structures and a third state which is stable in terms of free energy. Moreover, the SAS includes a crystalline region with a short-range order and lattice distortion. The SAS is formed by glow discharge decomposition (plasma CVD) of a gas containing silicon. As the gas containing silicon, $SiH_4$ can be used, and in addition, $Si_2H_6$, $SiH_2Cl_2$, $SiHCl_3$, $SiCl_4$, $SiF_4$, or the like can also be used. Further, $F_2$ and $GeF_4$ may be mixed. The gas containing silicon may be diluted with $H_2$, or $H_2$ and one or a plurality of rare gas elements of He, Ar, Kr, and Ne. A rare element such as helium, argon, krypton, or neon is made to be contained to promote lattice distortion, whereby a favorable SAS with increased stability can be obtained. An SAS layer formed by using a hydrogen based gas may be stacked over an SAS layer formed by using a fluorine based gas as the semiconductor film.

Hydrogenated amorphous silicon may be typically used as an amorphous semiconductor, while polysilicon and the like may be typically given as a crystalline semiconductor. Polysilicon (polycrystalline silicon) includes, in its category, so called high-temperature polysilicon formed using polysilicon as a main material, which is formed at processing temperatures of greater than or equal to 800° C.; so-called low-temperature polysilicon formed using polysilicon as a main material, which is formed at processing temperatures of less than or equal to 600° C.; polysilicon obtained by crystallization by addition of an element that promotes crystallization; and the like. It is needless to say that a semi-amorphous semiconductor or a semiconductor containing a crystal phase in part thereof may also be used as described above.

In the case where a crystalline semiconductor film is used for the semiconductor film, the crystalline semiconductor film may be formed by a known method such as a laser crystallization method, a thermal crystallization method, and a thermal crystallization method using an element such as nickel, which promotes crystallization. Further, a microcrystalline semiconductor that is an SAS may be crystallized by laser irradiation to enhance crystallinity. In the case where an element that promotes crystallization is not used, the amorphous semiconductor film is, before being irradiated with a laser beam, heated at 500° C. for 1 hour in a nitrogen atmosphere to discharge hydrogen so that the hydrogen concentration of the amorphous semiconductor film is less than or equal to $1\times10^{20}$ atoms/cm$^3$. This is because, if the amorphous semiconductor film contains much hydrogen, the amorphous semiconductor film is broken by laser beam irradiation. Heat treatment for crystallization may be performed with the use of a heating furnace, laser irradiation, irradiation with light emitted from a lamp (also referred to as lamp annealing), or the like. As a heating method, an RTA method such as a gas rapid thermal anneal (GRTA) method or a lamp rapid thermal anneal (LRTA) method may be used. A GRTA method is a method in which heat treatment is performed by a high-temperature gas whereas an LRTA method is a method in which heat treatment is performed by light emitted from a lamp.

In a crystallization process in which an amorphous semiconductor layer is crystallized to form a crystalline semiconductor layer, an element that promotes crystallization (also referred to as a catalytic element or a metal element) may be added to an amorphous semiconductor layer, and crystallization may be performed by heat treatment (at 550 to 750° C. for 3 minutes to 24 hours). As the element that promotes crystallization, one or a plurality of kinds of a metal such as iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

A method for introducing a metal element into the amorphous semiconductor film is not particularly limited as long as it is a method for introducing the metal element on the surface of or inside the amorphous semiconductor film. For example, a sputtering method, a CVD method, a plasma treatment method (also including a plasma CVD method), an adsorption method, or a method of applying a solution of metal salt can be used. Among them, a method using a solution is simple and advantageous in that the concentration of the metal element can be easily controlled. At this time, it is desirable to form an oxide film by UV light irradiation in an oxygen atmosphere, a thermal oxidation method, treatment with ozone water containing hydroxyl radical or hydrogen peroxide, or the like so that the wettability of the surface of the amorphous semiconductor film is improved, and an aqueous solution is diffused over the entire surface of the amorphous semiconductor film.

In order to remove or reduce the element that promotes crystallization from the crystalline semiconductor layer, a semiconductor layer containing an impurity element is formed to be in contact with the crystalline semiconductor layer and is made to function as a gettering sink. As the impurity element, an impurity element imparting n-type, an impurity element imparting p-type, a rare gas element, or the like can be used. For example, one or a plurality of kinds of elements such as phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a rare gas element is formed over the crystalline semiconductor layer containing the element that promotes crystallization, and heat treatment (at temperatures of 550 to 750° C. for 3 minutes to 24 hours) is performed. The element that promotes crystallization contained in the crystalline semiconductor layer moves into the semiconductor layer containing a rare gas element, and then is removed or reduced. Thereafter, the semiconductor layer containing a rare gas element functioning as the gettering sink is removed.

By scanning a laser beam and the semiconductor film relatively, laser irradiation can be performed. Further, in the laser beam irradiation, a marker may be formed in order to overlap beams with high precision and/or control positions for starting and finishing laser beam irradiation. The marker may be formed over the substrate at the same time as the amorphous semiconductor film is formed.

In the case of laser beam irradiation, a continuous wave oscillation laser beam (a CW laser beam) or a pulsed oscillation laser beam (a pulsed laser beam) can be used. As a laser beam that can be used here, a laser beam emitted from one or a plurality of kinds of the following lasers: a gas laser such as an Ar laser, a Kr laser, or an excimer laser; a laser using, as a medium, single crystal YAG, YVO$_4$, forsterite (Mg$_2$SiO$_4$), YAlO$_3$, or GdVO$_4$, or polycrystal (ceramic) YAG, Y$_2$O$_3$, YVO$_4$, YAlO$_3$, or GdVO$_4$ doped with one or a plurality of kinds of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser. A large grain crystal can be obtained by irradiation with the fundamental wave of such a laser beam or the second harmonic to fourth harmonic laser beam of the fundamental wave. For example, the second harmonic (532 nm) or the third harmonic (355 nm) of an Nd:YVO$_4$ laser beam (the fundamental wave: 1064 nm) can be used. As for an Nd:YVO$_4$ laser, either continuous wave oscillation or pulsed oscillation can be performed. In the case of continuous wave oscillation, the power density of the laser beam needs to be approximately 0.01 to 100 MW/cm$^2$ (preferably 0.1 to 10 MW/cm$^2$). Then, irradiation is carried out at a scanning rate of approximately 10 to 2000 cm/sec.

Further, a laser using, as a medium, single crystal YAG, YVO$_4$, forsterite (Mg$_2$SiO$_4$), YAlO$_3$, or GdVO$_4$, or polycrystal (ceramic) YAG, Y$_2$O$_3$, YVO$_4$, YAlO$_3$, or GdVO$_4$ doped with one or a plurality of kinds of Nd, Yb, Cr, Ti, Ho, Er, Tm, and Ta as a dopant; an Ar ion laser; or a Ti: sapphire laser can perform continuous wave oscillation. In addition, pulsed oscillation at a repetition rate of greater than or equal to 10 MHz is also possible by Q-switch operation, mode locking, or the like. Through pulsed oscillation of a laser beam at a repetition rate of greater than or equal to 10 MHz, the semiconductor film is irradiated with the next pulse after the semiconductor film is melted by a laser beam and before the film is solidified. Accordingly, differed from the case where a pulsed laser at a lower repetition rate is used, the solid-liquid interface can be continuously moved in the semiconductor film, and a crystal grain grown continuously along the scanning direction can be obtained.

The use of ceramics (polycrystal) as a medium allows the medium to be formed into a free shape at low cost in a short time. Although a columnar medium of several mm in diameter and several tens of mm in length is usually used in the case of single crystal, larger media can be formed in the case of ceramics.

Since the concentration of the dopant such as Nd or Yb in the medium, which directly contributes to light emission, is difficult to be changed significantly both in single crystal and polycrystal, improvement in laser beam output by increase in the concentration of the dopant has a certain level of limitation. However, in the case of ceramics, drastic improvement in output can be expected because the size of the medium can be significantly increased compared with the case of single crystal.

Further, in the case of ceramics, a medium having a parallelepiped shape or a rectangular parallelepiped shape can be easily formed. When a medium having such a shape is used and oscillation light goes in zigzag in the medium, an oscillation light path can be longer. Accordingly, amplification is increased and oscillation with high output is possible. Since a laser beam emitted from the medium having such a shape has a cross section of a quadrangular shape when being emitted, it can be shaped easily into a linear beam compared with a circular beam. The laser beam emitted in such a manner is shaped by using an optical system; accordingly, a linear beam having a short side of less than or equal to 1 mm and a long side of several mm to several m can be easily obtained. In addition, by uniform irradiation of the medium with excited light, a linear beam has a uniform energy distribution in the long side direction. Further, the semiconductor film may be irradiated with a laser beam at an incident angle θ (0<θ<90°) with respect to the semiconductor film, whereby an interference of the laser beam can be prevented.

By irradiation of the semiconductor film with this linear beam, the entire surface of the semiconductor film can be annealed more uniformly. In the case where uniform annealing using from one end to the other end of the linear beam is required, slits may be provided for the both ends so as to shield a portion where energy is attenuated.

When the linear beam with uniform intensity, obtained in this manner, is used to anneal the semiconductor film and this semiconductor film is used to manufacture a light-emitting device, the light-emitting device has favorable and uniform characteristics.

The semiconductor film may be irradiated with a laser beam in an inert gas atmosphere such as a rare gas or nitrogen as well. Accordingly, roughness of the surface of the semiconductor film can be suppressed by laser beam irradiation, and variation of threshold voltage due to variation of interface state density can be prevented.

For crystallization of the amorphous semiconductor film, heat treatment and laser beam irradiation may be combined or only one of them may be performed a plurality of times.

In this embodiment mode, an amorphous semiconductor film is formed over the base film 101b and crystallized, whereby a crystalline semiconductor film is formed.

After an oxide film formed over the amorphous semiconductor film is removed, an oxide film is formed to a thickness of 1 to 5 nm by UV light irradiation in an oxygen atmosphere, a thermal oxidization method, treatment with ozone water containing hydroxyl radical or hydrogen peroxide solution, or the like. In this embodiment mode, Ni is used as an element that promotes crystallization. An aqueous solution containing 10 ppm of Ni acetate is applied by a spin coating method.

In this embodiment mode, after heat treatment is performed by an RTA method at 750° C. for 3 minutes, the oxide film formed over the semiconductor film is removed and laser beam irradiation is performed. The amorphous semiconductor film is crystallized by the aforementioned crystallization treatment, whereby the crystalline semiconductor film is formed.

In the case where crystallization is performed with the use of a metal element, a gettering process is performed to reduce or remove the metal element. In this embodiment mode, the metal element is gettered using at amorphous semiconductor film as a gettering sink. First, an oxide film is formed over the crystalline semiconductor film by UV light irradiation in an oxygen atmosphere, a thermal oxidation method, treatment with ozone water containing hydroxyl radical or hydrogen peroxide, or the like. The oxide film is preferably made thick by heat treatment. Then, an amorphous semiconductor film is formed to a thickness of 50 nm by a plasma CVD method (a condition of this embodiment mode: 350 W, 35 Pa, and deposition gas: SiH$_4$ (the flow rate: 5 sccm) and Ar (the flow rate: 1000 sccm)).

Then, heat treatment is performed by an RTA method at 744° C. for 3 minutes to reduce or remove the metal element. Heat treatment may also be performed in a nitrogen atmosphere. Then, the amorphous semiconductor film serving as a gettering sink and the oxide film formed over the amorphous semiconductor film are removed with hydrofluoric acid or the like, whereby a crystalline semiconductor film in which the metal element is reduced or removed can be obtained. In this embodiment mode, the amorphous semiconductor film serving as a gettering sink is removed with the use of tetramethyl ammonium hydroxide (TMAH).

The semiconductor film obtained as described above may be doped with the slight amount of impurity elements (boron or phosphorus) in order to control threshold voltage of a thin film transistor. This doping of the impurity elements may also be performed to the amorphous semiconductor film before the crystallization step. When the semiconductor film in an amorphous state is doped with the impurity element, the impurity element can also be activated by subsequent heat treatment for crystallization. Further, defects and the like generated in doping can be improved as well.

Subsequently, the crystalline semiconductor film is etched into a desired shape, whereby semiconductor layers are formed.

An etching process may be either plasma etching (dry etching) or wet etching. In the case where a large-area substrate is processed, plasma etching is more suitable. As an etching gas, a fluorine-based gas such as $CF_4$ or $NF_3$, or a chlorine-based gas such as $Cl_2$ or $BCl_3$ is used, to which an inert gas such as He or Ar may be added as appropriate. When an etching process by atmospheric pressure discharge is employed, local electric discharge can also be realized, which does not require a mask layer to be formed over the entire surface of the substrate.

In the present invention, a conductive layer to form a wiring layer or an electrode layer, a mask layer to form a predetermined pattern, or the like may be formed by a method capable of selectively forming a pattern, such as a droplet-discharging method. In the droplet-discharging (ejecting) method (also referred to as an inkjet method in accordance with the system thereof), liquid of a composition prepared for a specific purpose is selectively discharged (ejected), and a predetermined pattern (a conductive layer, an insulating layer, or the like) is formed. At that time, a region where a pattern is formed may be subjected to treatment to control the wettability or adhesion. Additionally, a method capable of transferring or drawing a pattern, for example, a printing method (a method to form a pattern, such as screen printing or offset printing), a dispenser method, or the like can also be used.

In this embodiment mode, a resin material such as an epoxy resin, an acrylic resin, a phenol resin, a novolac resin, a melamine resin, or an urethane resin is used as a mask. Alternatively, an organic material such as benzocyclobutene, parylene, fluorinated arylene ether, or polyimide having a light transmitting property; a compound material formed by polymerization of siloxane-based polymers or the like; or the like can also be used. Further, a commercially available resist material including a photosensitive agent, such as a positive resist or a negative resist, may be alternatively used. When a droplet-discharging method is used with any material, the surface tension and the viscosity of the material are appropriately adjusted by the control of the solvent concentration, addition of a surfactant, or the like.

A gate-insulating layer covering the semiconductor layer is formed. The gate-insulating layer 107 is formed using an insulating film containing silicon to a thickness of 10 to 150 nm by a plasma CVD method, a sputtering method, or the like. The gate-insulating layer 107 may be formed using a known material such as an oxide material or nitride material of silicon, typified by silicon nitride, silicon oxide, silicon oxynitride, and silicon nitride oxide, and may be a stacked layer or a single layer. For example, the gate-insulating layer can have a stacked layer of three layers including a silicon nitride film, a silicon oxide film, and a silicon nitride film, or a single layer of a silicon oxynitride film.

Subsequently, a gate electrode layer is formed over the gate-insulating layer. The gate electrode layer can be formed by a sputtering method, an evaporation method, a CVD method, or the like. The gate electrode layer may be formed using an element such as tantalum (Ta), tungsten (W), titanium (Ti), molybdenum (Mo), aluminum (Al), copper (Cu), chromium (Cr), or neodymium (Nd), or an alloy material or a compound material containing these elements as its main component. Further, as the gate electrode layer, a semiconductor film typified by a polycrystalline silicon film doped with an impurity element such as phosphorus can be used, or AgPdCu alloy may be used. In addition, the gate electrode layer may be a single layer or a stacked layer.

In this embodiment mode, the gate electrode layer is formed into a tapered shape; however, the present invention is not limited thereto. The gate electrode layer may have a stacked layer structure, where only one layer has a tapered shape while the other has a perpendicular side surface by anisotropic etching. As described in this embodiment mode, the taper angles may be different or the same between the stacked gate electrode layers. With the tapered shape, coverage of a film to be stacked thereover is improved and defects are reduced, whereby reliability is improved.

The gate-insulating layer 107 may be etched to some extent and reduced in thickness (so-called film wear) by the etching step of forming the gate electrode layer.

An impurity element is added to the semiconductor layer to form an impurity region. The impurity region can be formed as a high-concentration impurity region and a low-concentration impurity region by the control of the concentration of the impurity element. A thin film transistor having a low-concentration impurity region is referred to as a thin film transistor having a light doped drain (LDD) structure. In addition, the low-concentration impurity region can be formed so as to overlap with the gate electrode layer. Such a thin film transistor is referred to as a thin film transistor having a gate overlapped LDD (GOLD) structure. The polarity of the thin film transistor is made n-type by addition of phosphorus (P) or the like to an impurity region thereof. In the case where a p-type thin film transistor is formed, boron (B) or the like may be added.

In this embodiment mode, a region of the impurity region, which overlaps with the gate electrode layer with the gate-insulating layer 107 interposed therebetween, is denoted as a Lov region. Further, a region of the impurity region, which does not overlap with the gate electrode layer with the gate-insulating layer 107 interposed therebetween, is denoted as a Loff region. In FIGS. 7A and 7B, the impurity region is shown by hatching and a blank space. This does not mean that the blank space is not doped with an impurity element, but makes it easy to understand that the concentration distribution of the impurity element in this region reflects the mask and the doping condition. It is to be noted that this is the same in other drawings of this specification.

Heat treatment, intense light irradiation, or laser beam irradiation may be performed in order to activate the impurity element. At the same time as the activation, plasma damage to the gate-insulating layer 107 and plasma damage to the interface between the gate-insulating layer and the semiconductor layer can be recovered.

Subsequently, a first interlayer insulating layer to cover the gate electrode layer and the gate-insulating layer 107 is formed. In this embodiment mode, a stacked layer structure of insulating films 167 and 168 is employed. The insulating films 167 and 168 can be formed of a silicon nitride film, a silicon nitride oxide film, a silicon oxynitride film, a silicon oxide film, or the like by a sputtering method or a plasma CVD method. Alternatively, other insulating films containing silicon may also be used as a single layer or a stacked layer structure including three or more layers.

Further, heat treatment is performed at 300 to 550° C. for 1 to 12 hours in a nitrogen atmosphere, and the semiconductor layer is hydrogenated. Preferably, this heat treatment is performed at 400 to 500° C. Through this step, dangling bonds in the semiconductor layer are terminated by hydrogen contained in the insulating film 167 which is an interlayer insulating layer. In this embodiment mode, heat treatment is performed at 410° C.

In addition, the insulating films 167 and 168 can be formed using a material selected from aluminum nitride (AlN), aluminum oxynitride (AlON), aluminum nitride oxide containing more nitrogen than oxygen (AlNO), aluminum oxide, diamond-like carbon (DLC), nitrogen-containing carbon (CN), polysilazane, and other substances containing an inorganic insulating material. A material containing siloxane may also be used. Further, an organic insulating material such as polyimide, acrylic, polyamide, polyimide amide, resist, or benzocyclobutene may also be used. In addition, an oxazole resin can be used, and for example, photo-curable type polybenzoxazole or the like can be used.

Subsequently, contact holes (openings) that reach the semiconductor layer are formed in the insulating films 167 and 168, and the gate-insulating layer 107 with the use of a mask formed using a resist. A conductive film is formed so as to cover the opening and then etched, whereby a source electrode layer or a drain electrode layer is formed, which is electrically connected to part of a source region or a drain region. A conductive film is formed by a PVD method, a CVD method, an evaporation method, or the like, and then etched into a desired shape to form the source electrode layer or the drain electrode layer. Further, the conductive film can be selectively formed in a predetermined position by a droplet-discharging method, a printing method, a dispenser method, an electrolytic plating method, or the like. A reflow method or a damascene method may also be used. The source electrode layer or the drain electrode layer is formed using a metal such as Ag, Au, Cu, Ni, Pt, Pd, Ir, Rh, W, Al, Ta, Mo, Cd, Zn, Fe, Ti, Si, Ge, Zr, or Ba, or alloy or metal nitride thereof. In addition, a stacked layer structure of these materials may also be used.

Through the above steps, an active matrix substrate can be manufactured, in which a p-channel thin film transistor 285 having a p-type impurity region in a Lov region and an n-channel thin film transistor 275 having an n-channel impurity region in a Lov region are provided in a peripheral driver circuit region 204; and a multi-channel type n-channel thin film transistor 265 having an n-type impurity region in a Loff region and a p-channel thin film transistor 245 having a p-type impurity region in a Lov region are provided in a pixel region 206.

The structure of the thin film transistor is not limited to this embodiment mode, and a single gate structure in which one channel forming region is formed, a double gate structure in which two channel forming regions are formed, or a triple gate structure in which three channel forming regions are formed may be employed. Further, the thin film transistor in the peripheral driver circuit region may also employ a single gate structure, a double gate structure, or a triple gate structure.

Next, an insulating film 181 is formed as a second interlayer insulating layer. In FIGS. 7A and 7B, a separation region 201 for separation by scribing, an external terminal connection region 202 to which an FPC is attached, a wiring region 203 which is a lead wiring region for the peripheral portion, the peripheral driver circuit region 204, and the pixel region 206 are provided. Wirings 179a and 179b are provided in the wiring region 203, and a terminal electrode layer 178 connected to an external terminal is provided in the external terminal connection region 202.

The insulating film 181 can be formed using a material selected from silicon oxide, silicon nitride, silicon oxynitride, silicon nitride oxide, aluminum nitride (AlN), aluminum oxide containing nitrogen (also referred to as aluminum oxynitride) (AlON), aluminum nitride containing oxygen (also referred to as aluminum nitride oxide) (AlNO), aluminum oxide, diamond-like carbon (DLC), nitrogen-containing carbon (CN), phosphosilicate glass (PSG), borophosphosilicate glass (BPSG), alumina, or other substances containing an inorganic insulating material. In addition, a siloxane resin may also be used. Further, a photosensitive or non-photosensitive organic insulating material such as polyimide, acrylic, polyamide, polyimide amide, resist, benzocyclobutene, polysilazane, or a low-dielectric material (Low-k material) can also be used. In addition, an oxazole resin can be used, and for example, photo-curable type polybenzoxazole or the like can be used. An interlayer insulating layer provided for planarization is required to have high heat resistance, a high insulating property, and high planarity. Thus, the insulating film 181 is preferably formed by a coating method typified by a spin coating method.

The insulating film 181 can be formed by a dipping method, spray coating, a doctor knife, a roll coater, a curtain coater, a knife coater, a CVD method, an evaporation method, or the like. The insulating film 181 may also be formed by a droplet-discharging method. In the case of a droplet-discharging method, a material solution can be saved. In addition, a method capable of transferring or drawing a pattern, such as a droplet-discharging method, for example, a printing method (a method to form a pattern, such as screen printing or offset printing) or a dispenser method can also be used.

A minute opening, that is, a contact hole is formed in the insulating film 181 in the pixel region 206.

Then, a first electrode layer 185 (also referred to as a pixel electrode layer) is formed so as to be in contact with the source electrode layer or the drain electrode layer. The first electrode layer 185 functions as an anode or a cathode, and may be formed using an element such as Ti, Ni, W, Cr, Pt, Zn, Sn, In, or Mo; an alloy material or a compound material containing any of the above elements as its main component, such as titanium nitride, $TiSi_xN_y$, $WSi_x$, tungsten nitride, $WSi_xN_y$, or NbN; or a stacked film thereof with a total thickness of 100 to 800 nm.

In this embodiment mode, the first electrode layer 185 has a light-transmitting property because light from the light-emitting element is extracted through the first electrode layer 185. The first electrode layer 185 is formed with a transparent conductive film that is etched into a desired shape.

In the present invention, the first electrode layer 185 which is a light-transmitting electrode layer may be specifically formed using a transparent conductive film made of a light-transmitting conductive material such as indium oxide containing tungsten oxide, indium zinc oxide containing tungsten oxide, indium oxide containing titanium oxide, or indium tin oxide containing titanium oxide. It is needless to say that indium tin oxide (ITO), indium zinc oxide (IZO), indium tin oxide to which silicon oxide is added (ITSO), or the like can also be used.

In addition, even in the case of a non-light-transmitting material such as a metal film, when the film thickness is made thin (preferably, about 5 to 30 nm) enough to transmit light, light can be emitted through the first electrode layer 185. As a metal thin film that can be used for the first electrode layer 185, a conductive film made of titanium, tungsten, nickel, gold, platinum, silver, aluminum, magnesium, calcium, lithium, or alloy thereof, or the like can be used.

The first electrode layer 185 can be formed by an evaporation method, a sputtering method, a CVD method, a printing method, a dispenser method, a droplet-discharging method, or the like. In this embodiment mode, the first electrode layer 185 is formed by a sputtering method using indium zinc oxide containing tungsten oxide. The first electrode layer 185 is preferably used with a total thickness of 100 to 800 nm.

The first electrode layer 185 may be cleaned or polished by a CMP method or with the use of a polyvinyl alcohol based porous material so that the surface thereof is planarized. In addition, after polishing using a CMP method, ultraviolet ray irradiation, oxygen plasma treatment, or the like may be performed on the surface of the first electrode layer 185.

Heat treatment may be performed after the first electrode layer 185 is formed. By the heat treatment, moisture contained in the first electrode layer 185 is discharged. Accordingly, degasification or the like is not caused in the first electrode layer 185. Thus, even when a light-emitting material that is easily deteriorated by moisture is formed over the first electrode layer 185, the light-emitting material is not deteriorated; therefore, a highly reliable light-emitting device can be manufactured.

Next, an insulating layer 186 (also referred to as a partition wall or a barrier) is formed to cover the end portion of the first electrode layer 185 and the source electrode layer or the drain electrode layer.

The insulating layer 186 can be formed using silicon oxide, silicon nitride, silicon oxynitride, silicon nitride oxide, or the like, and may have a single layer structure or a stacked layer structure including two or three layers. In addition, as other materials for the insulating layer 186, a material selected from aluminum nitride, aluminum oxynitride containing more oxygen than nitrogen, aluminum nitride oxide containing more nitrogen than oxygen, aluminum oxide, diamond-like carbon (DLC), nitrogen-containing carbon, polysilazane, or other substances containing an inorganic insulating material can be used. A material containing siloxane may also be used. Further, a photosensitive or non-photosensitive organic insulating material such as polyimide, acrylic, polyamide, polyimide amide, resist, benzocyclobutene, or polysilazane may also be used. In addition, an oxazole resin can be used, and for example, photo-curable type polybenzoxazole or the like can be used.

The insulating layer 186 can be formed by a sputtering method, a physical vapor deposition (PVD) method, a CVD method such as a low-pressure CVD (LPCVD) method or a plasma CVD method, a droplet-discharging method capable of selectively forming a pattern, a method capable of transferring or drawing a pattern such as a printing method (a method to form a pattern such as screen printing or offset printing), a dispenser method, a coating method such as a spin coating method, a dipping method, or the like.

An etching process may be either plasma etching (dry etching) or wet etching. In the case where a large-area substrate is processed, plasma etching is more suitable. As an etching gas, a fluorine-based gas such as $CF_4$ or $NF_3$, or a chlorine-based gas such as $Cl_2$ or $BCl_3$ is used, to which an inert gas such as He or Ar may be added as appropriate. When an etching process by atmospheric pressure discharge is employed, local electric discharge can also be realized, which does not require a mask layer to be formed over the entire surface of the substrate.

As shown in FIG. 7A, in a connection region 205, a wiring layer formed of the same material and through the same process as those of a second electrode layer is electrically connected to a wiring layer formed of the same material and through the same process as those of the gate electrode layer.

An EL layer 188 is formed over the first electrode layer 185. The EL layer 188 has a stacked structure including a light-emitting layer containing an organic compound and a functional layer containing a mixed-valences compound. Although only one pixel is shown in FIGS. 7A and 7B, EL layers corresponding to each color of red (R), green (G), and blue (B) are formed in this embodiment mode. The EL layer 188 may be formed as described in Embodiment Mode 1.

The EL layer 188 formed according to the present invention includes the functional layer (e.g., a hole-injecting layer, a hole-transporting layer, an electron-injecting layer, and an electron-transporting layer) as well as the light-emitting layer. At least one of the functional layers may contain a mixed-valence compound. It is needless to say that plural of functional layers may have mixed-valence compounds or all the functional layers may have mixed-valence compounds.

When an element in a compound has a plurality of valences, this element is in a state that is referred to as a mixed-valence state and this compound is referred to as a mixed-valence compound. An example of a mixed-valence state is a state in which an element M contained in a compound MX has valences of +n and +m (n≠m), that is, a plurality of valences. An element may have three or more valences.

Specific examples of valences include a mixed state of valences of +1 and +2, a mixed state of valences of +2 and +3, and further a mixed state of valences of +1, +2, and +3. As valences that form a mixed-valence state, numbers are not necessarily consecutive and the case of a mixed state of valences of +1 and +3 may be possible. Furthermore, in one compound, each of two or more elements may be in a mixed-valence state. For example, in the case of the above compound MX, an element X has valences of −a and −b (a≠b) and an element M has valences of +n and +m (n≠m). The mixed-valence compound used in the present invention includes, in its category, both organic compounds and inorganic compounds. Moreover, a compositional formula of the compound may be non-stoichiometric.

The compound can be in a mixed-valence state and the state (e.g., ratio of valences) thereof can be controlled depending on conditions for the formation or the synthesis. Examples of the conditions include a synthetic temperature, kinds of raw materials or the quantity thereof to be mixed, and the like in synthesizing an objective compound. The compound can be in a mixed-valence state and the state thereof can be controlled also depending on a state in which a thin film is formed (film formation method such as vacuum evaporation or the like). Further, in some cases, oxide or sulfide can be in a mixed-valence state by a defect or by doping of a certain element. The valence state can be classified into an ordered type and a disordered type according to the state. In a disordered type, an element having valences of +n and +m (an atom having a valence of +n and an atom having a valence of +m) is randomly distributed in a crystal structure. On the other hand, in an ordered type, an element of an atom having a valence of +n and an atom having a valence of +m is not randomly distributed but aligned in a certain site. For example, a compound is in a state in which only an atom having a valence of +n is in one site and only an atom having a valence of +m is in another site. It is considered that a disordered type is preferable for hopping conduction. Among such mixed-valence compounds are a lot of materials having interesting properties, such as a superconductor and a sensor.

Hopping conduction occurs in a mixed-valence compound because it has different valences. Such hopping conduction can thus improve the mobility of a charge (carrier). Therefore, when a mixed-valence compound is contained in a functional layer of a light-emitting element, the light-emitting element can be driven at low voltage to achieve the decrease of power consumption and the improvement of reliability.

Among elements in a mixed-valence state are a transition metal and a rare-earth metal. For example, europium (Eu) has valences of +2 and +3. Among mixed-valence compounds are metal chalcogenide such as metal oxide and metal sulfide, and the like. For example, molybdenum oxide ($MoO_3$) is formed as a compound in a state in which molybdenum (Mo) has not only a valence of +3, but valences of both +2 and +3 in combination.

Oxide or sulfide of a transition metal and a rare-earth metal can be used for the mixed-valence compound contained in the above functional layer. For example, as oxide, there are perovskite-type oxide such as strontium titanate ($SrTiO_3$); a ferrite material such as magnetic ($Fe_3O_4$), manganese ferrite ($MnFe_2O_4$), or nickel ferrite ($NiFe_2O_4$); tungsten trioxide ($WO_3$), vanadium oxide ($V_2O_5$), molybdenum oxide ($MoO_3$), rhenium oxide ($ReO_3$), europium oxide ($EU_3O_4$), lithium titanate ($LiTi_2O_4$), manganese oxide ($Mn_3O_4$), cobalt oxide ($Co_3O_4$), antimony oxide ($Sb_2O_4$), lead oxide ($Pb_3O_4$), and the like. As sulfide, there are europium sulfide ($EU_3S_4$), copper sulfide ($Cu_xS$) (x is in the range of 1 to 2), gallium sulfide (GaS), thallium sulfide (TlS), and the like. Furthermore, as a halogen compound, there are silver fluoride ($Ag_2F$), indium halide ($InF_2$, $InCl_2$, $InBr_2$, or $InI_2$), tantalum chloride ($Ta_6Cl_{15}$), thallium chloride ($Tl_4Cl_6$), and gallium chloride ($GaCl_2$). Moreover, as nitride, there are indium nitride (InN), tin nitride (SnN), and the like. As arsenide, there are europium arsenide ($Eu_3As_4$) and the like. Furthermore, a metallic complex of platinum (Pt), palladium (Pd), nickel (Ni), iridium (Ir), or iron (Fe) is in a mixed-valence state. It is to be noted that manganese oxide ($Mn_3O_4$) and copper sulfide ($Cu_xS$) (x is in the range of 1 to 2) are more preferable. Some of oxide or sulfide are in a mixed-valence state when oxygen defect or sulfur defect are generated. It is considered that such oxide and sulfide are useful for a hole-transporting layer because they become p-type semiconductor.

Subsequently, a second electrode layer 189 formed of a conductive film is provided over the EL layer 188. As the second electrode layer 189, Al, Ag, Li, Ca, alloy or a compound thereof such as MgAg, MgIn, AlLi, $CaF_2$, or calcium nitride may be used. In this manner, a light-emitting element 190 including the first electrode layer 185, the EL layer 188, and the second electrode layer 189 is formed (see FIG. 7B).

In the light-emitting device of this embodiment mode, shown in FIGS. 7A and 7B, light from the light-emitting element 190 is emitted through the first electrode layer 185 to be transmitted in a direction indicated by an arrow in FIG. 7B.

In this embodiment mode, an insulating layer may be provided as a passivation film (protective film) over the second electrode layer 189. It is effective to provide a passivation film so as to cover the second electrode layer 189 as described above. The passivation film can be formed as a single layer or a stacked layer of an insulating film containing silicon nitride, silicon oxide, silicon oxynitride, silicon nitride oxide, aluminum nitride, aluminum oxynitride, aluminum nitride oxide containing more nitrogen than oxygen, aluminum oxide, diamond-like carbon (DLC), or nitrogen-containing carbon. Alternatively, a siloxane resin may also be used.

At this time, it is preferable to form the passivation film by using a film with favorable coverage, and it is effective to use a carbon film, particularly, a DLC film for the passivation film. A DLC film can be formed in the range of room temperature to less than or equal to 100° C.; therefore, it can also be formed easily over the EL layer 188 having low heat resistance. A DLC film can be formed by a plasma CVD method (typically, an RF plasma CVD method, a microwave CVD method, an electron cyclotron resonance (ECR) CVD method, a heat filament CVD method, or the like), a combustion method, a sputtering method, an ion-beam evaporation method, a laser evaporation method, or the like. As a reaction gas for deposition, a hydrogen gas and a carbon hydride-based gas (e.g., $CH_4$, $C_2H_2$, or $C_6H_6$) are used and ionized by glow discharge, and the ions are accelerated to impact against a cathode to which negative self-bias voltage is applied, thereby forming a film. Further, a CN film may be formed with the use of a $C_2H_4$ gas and a $N_2$ gas as a reaction gas. A DLC film has high blocking effect against oxygen; therefore, oxidization of the EL layer 188 can be suppressed. Accordingly, a problem such as oxidation of the EL layer 188 during a subsequent sealing step can be prevented.

A sealing substrate 195, and the substrate 100 over which the light-emitting element 190 is formed are firmly attached to each other with a sealing material 192, whereby the light-emitting element 190 is sealed (see FIGS. 7A and 7B). As the sealing material 192, typically, a visible light curable resin, an ultraviolet ray curable resin, or a thermosetting resin is preferably used. An example thereof is an epoxy resin such as a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type epoxy resin, a glycidyl ester resin, a glycidyl amine-based resin, a heterocyclic epoxy resin, or a modified epoxy resin. It is to be noted that a region surrounded by the sealing material 192 may be filled with a filler 193 or filled and sealed with nitrogen or the like by sealing in a nitrogen atmosphere. Although the filler 193 is not required to transmit light because a bottom emission type is employed in this embodiment mode, the filler 193 is required to transmit light in the case where light is extracted through the filler 193. Typically, a visible light curable epoxy resin, an ultraviolet ray curable epoxy resin, or a thermosetting epoxy resin may be used. Through the aforementioned steps, a light-emitting device having a display function, including the light-emitting element of this embodiment mode, is completed. Further, the filler 193 may be dripped in a liquid state to fill the light-emitting device. With the use of a hygroscopic substance such as a drying agent as the filler 193, moisture-absorbing effect can be improved, whereby the element can be prevented from deteriorating.

A drying agent is provided in an EL display panel in order to prevent deterioration of the element due to moisture. In this embodiment mode, the drying agent is provided in a concave portion that is formed so as to surround the pixel region on the sealing substrate, whereby a thin design is not hindered. Further, the drying agent is also formed in a region corresponding to a gate-wiring layer so that a moisture-absorbing area becomes wide; thus, moisture can be effectively absorbed. In addition, the drying agent is formed over a gate-wiring layer that does not emit light from itself; therefore, light extraction efficiency is not decreased, either.

The light-emitting element is sealed by the glass substrate in this embodiment mode. Sealing treatment is treatment to protect the light-emitting element from moisture, using any of a method for mechanically sealing the light-emitting element by a cover material, a method for filling and sealing the light-emitting element with a thermosetting resin or an ultraviolet ray curable resin, and a method for sealing the light-emitting element by a thin film having a high barrier property, such as a metal oxide film or a metal nitride film. Although glass, ceramics, plastics, or metal can be used as the cover material, it is required to have a light-transmitting property in the case where light is emitted to the cover material side. The cover material and the substrate over which the light-emitting element is formed are attached to each other with a sealing material such as a thermosetting resin or an ultraviolet ray curable resin, and a sealed space is formed by curing of the resin by heat treatment or ultraviolet ray irradiation treatment. It is also effective to provide a moisture-absorbing material typified by barium oxide in this sealed space. This moisture-absorbing material may be provided over and in contact with the sealing material, or over or in the periphery of the partition wall so as not to shield light from the light-emitting element. Further, the space between the cover material and the substrate over which the light-emitting element is formed can be filled with a thermosetting resin or an ultraviolet ray curable resin. In this case, it is effective to add a moisture-absorbing material typified by barium oxide in the thermosetting resin or the ultraviolet ray curable resin.

Figure 8:
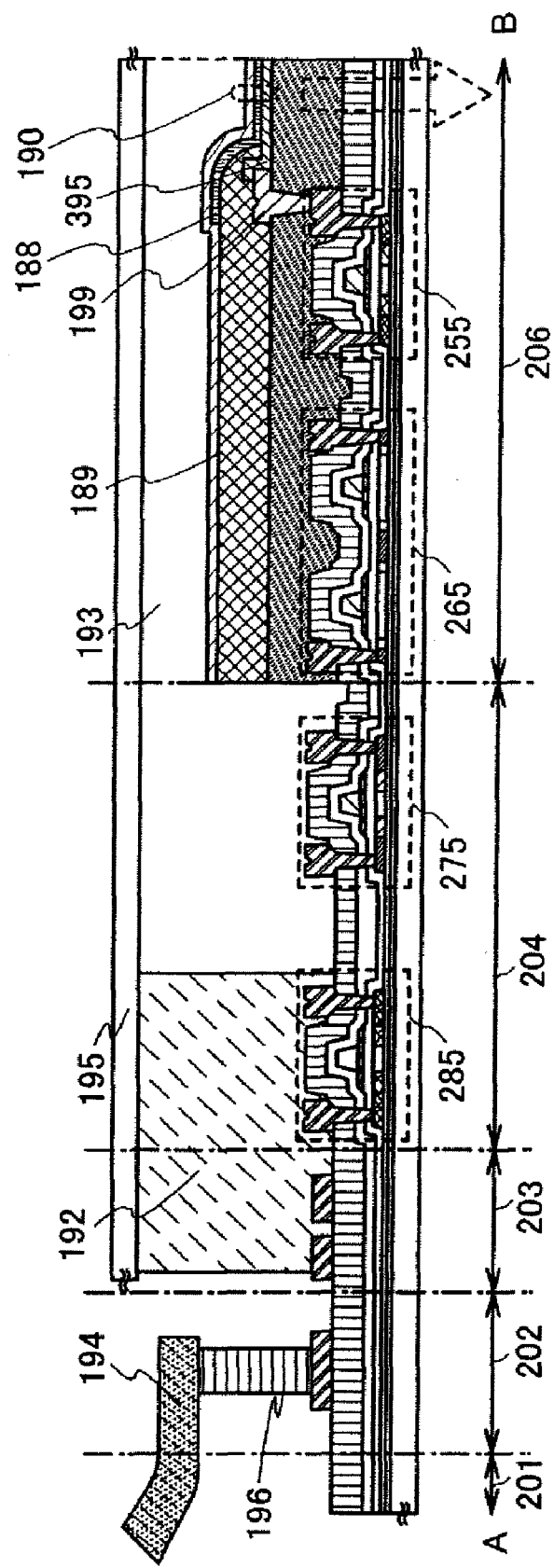
FIG. 8 is a view explaining a light-emitting device of the present invention.

FIG. 8 shows an example in which, in the light-emitting device shown in FIGS. 7A and 7B manufactured in this embodiment mode, a source electrode layer or a drain electrode layer and a first electrode layer are not directly in contact with each other to be electrically connected, but connected to each other through a wiring layer. In a light-emitting device of FIG. 8, a first electrode layer 395 and a source electrode layer or drain electrode layer of a thin film transistor to drive the light-emitting element are electrically connected to each other through a wiring layer 199. In FIG. 8, the first electrode layer 395 is connected to the source electrode layer or the drain electrode layer so that part of the first electrode layer 395 is stacked over the wiring layer 199; however, the first electrode layer 395 may be formed first, and then the wiring layer 199 may be formed over and to be in contact with the first electrode layer 395.

In this embodiment mode, the terminal electrode layer 178 is connected to an FPC 194 through an anisotropic conductive layer 196 in the external terminal connection region 202, and electrically connected to outside. In addition, as shown in FIG. 7A which is a top view of the light-emitting device, the light-emitting device manufactured in this embodiment mode includes a peripheral driver circuit region 207 and a peripheral driver circuit region 208 each including a scanning line driver circuit, in addition to the peripheral driver circuit region 204 and the peripheral driver circuit region 209 each including a signal line driver circuit.

Although the circuit as described above is formed in this embodiment mode, the present invention is not limited thereto. An IC chip may be mounted by the aforementioned COG method or TAB method as a peripheral driver circuit. Further, the number of each of a gate line driver circuit and a source line driver circuit may be one or more than one.

In the light-emitting device of the present invention, a driving method for image display is not particularly limited, and for example, a dot sequential driving method, a line sequential driving method, an area sequential driving method, or the like may be used. Typically, a line sequential driving method may be used, and a time division gray scale driving method and an area gray scale driving method may be used as appropriate. Further, a video signal input to the source line of the light-emitting device may be an analog signal or a digital signal. The driver circuit and the like may be appropriately designed in accordance with the video signal.

When a functional layer containing a mixed-valence compound is included in the light-emitting element of this embodiment mode, which includes the light-emitting layer containing an organic compound, the electron-transporting property of the functional layer can be improved. Therefore, the light-emitting element can be driven at low voltage to reduce its power consumption.

Accordingly, the light-emitting device including the light-emitting element of this embodiment mode, to which the present invention is applied, can achieve low power consumption and high reliability.

Embodiment Mode 6

A light-emitting device including a light-emitting element can be manufactured according to the present invention. Light-emitting element emits light in any manner of bottom emission, top emission, and dual emission. This embodiment mode will explain examples of a dual emission type and a top emission type with reference to FIG. 9 and FIG. 19. Further, this embodiment mode will show an example in which the second interlayer insulating layer (the insulating film 181) is not formed in the light-emitting device manufactured in Embodiment Mode 4. Therefore, the same portions or portions having the similar functions will not be repeatedly explained.

Figure 9:
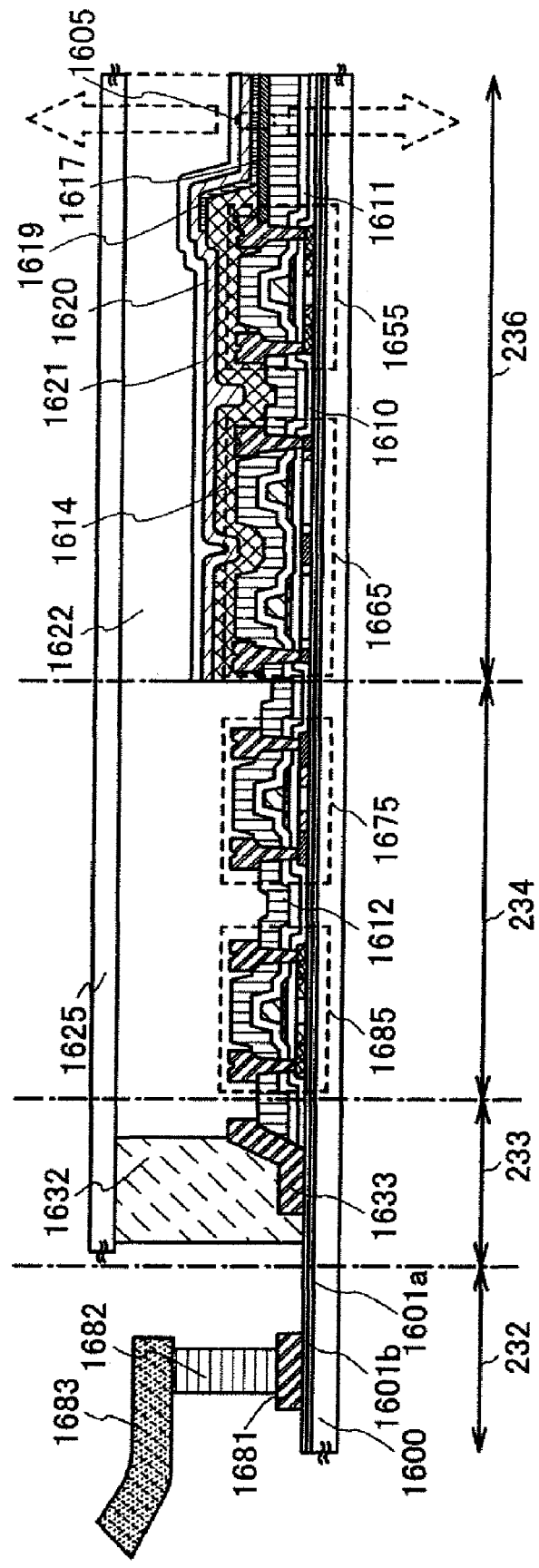
FIG. 9 is a view explaining a light-emitting device of the present invention.

FIG. 9 shows a light-emitting device, which includes an element substrate 1600, thin film transistors 1655, 1665, 1675, and 1685, a first electrode layer 1617, the EL layer 1619, a second electrode layer 1620, a filler 1622, a sealing material 1632, insulating films 1601a and 1601b, a gate-insulating layer 1610, insulating films 1611 and 1612, an insulating layer 1614, a sealing substrate 1625, a wiring layer 1633, a terminal electrode layer 1681, an anisotropic conductive layer 1682, and an FPC 1683. The light-emitting device also includes an external terminal connection region 232, a sealing region 233, a peripheral driver circuit region 234, and a pixel region 236. The filler 1622 can be formed by a dripping method using a material in a state of a liquid composition. The sealing substrate 1625 and the element substrate 1600 over which the filler 1622 is formed by a dripping method are attached to each other to seal the light-emitting device. The EL layer 1619 has a stacked layer structure of the light-emitting layer containing an organic compound and a functional layer containing a mixed-valence compound.

The EL layer 1619 included in the light-emitting element manufactured according to the present invention includes the functional layer (e.g., a hole-injecting layer, a hole-transporting layer, an electron-injecting layer, and an electron-transporting layer) as well as the light-emitting layer. At least one of the functional layers may contain a mixed-valence compound. It is needles to say that all the functional layers may each contain a mixed-valence compound.

When an element in a compound has a plurality of valences, this element is in a state that is referred to as a mixed-valence state and this compound is referred to as a mixed-valence compound. An example of a mixed-valence state is a state in which an element M contained in a compound MX has valences of +n and +m (n≠m), that is, a plurality of valences. An element may have three or more valences.

Specific examples of valences include a mixed state of valences of +1 and +2, a mixed state of valences of +2 and +3, and further a mixed state of valences of +1, +2, and +3. As valences that form a mixed-valence state, numbers are not necessarily consecutive and the case of a mixed state of valences of +1 and +3 may be possible. Furthermore, in one compound, each of two or more elements may be in a mixed-valence state. For example, in the case of the above compound MX, an element X has valences of −a and −b (a≠b) and an element M has valences of +n and +m (n≠m). The mixed-valence compound used in the present invention includes, in its category, both organic compounds and inorganic compounds. Moreover, a compositional formula of the compound may be non-stoichiometric.

The compound can be in a mixed-valence state and the state (e.g., ratio of valences) thereof can be controlled depending on conditions for the formation or the synthesis. Examples of the conditions include a synthetic temperature, kinds of raw materials or the quantity thereof to be mixed, and the like in synthesizing an objective compound. The compound can be in a mixed-valence state and the state thereof can be controlled also depending on a state in which a thin film is formed (film formation method such as vacuum evaporation or the like). Further, in some cases, oxide or sulfide can be in a mixed-valence state by a defect or by doping of a certain element. The valence state can be classified into an ordered type and a disordered type according to the state. In a disordered type, an element having valences of +n and +m (an atom having a valence of +n and an atom having a valence of +m) is randomly distributed in a crystal structure. On the other hand, in an ordered type, an element of an atom having a valence of +n and an atom having a valence of +m is not randomly distributed but aligned in a certain site. For example, a compound is in a state in which only an atom having a valence of +n is in one site and only an atom having a valence of +m is in another site. It is considered that a disordered type is preferable for hopping conduction. Among such mixed-valence compounds are a lot of materials having interesting properties, such as a superconductor and a sensor.

Hopping conduction occurs in a mixed-valence compound because it has different valences. Such hopping conduction can thus improve the mobility of a charge (carrier). Therefore, when a mixed-valence compound is contained in a functional layer of a light-emitting element, the light-emitting element can be driven at low voltage to achieve the decrease of power consumption and the improvement of reliability.

Among elements in a mixed-valence state are a transition metal and a rare-earth metal. For example, europium (Eu) has valences of +2 and +3. Among mixed-valence compounds are metal chalcogenide such as metal oxide and metal sulfide, and the like. For example, molybdenum oxide ($MoO_3$) is formed as a compound in a state in which molybdenum (Mo) has not only a valence of +3, but valences of both +2 and +3 in combination.

Oxide or sulfide of a transition metal and a rare-earth metal can be used for the mixed-valence compound contained in the above functional layer. For example, as oxide, there are perovskite-type oxide such as strontium titanate ($SrTiO_3$); a ferrite material such as magnetic ($Fe_3O_4$), manganese ferrite ($MnFe_2O_4$), or nickel ferrite ($NiFe_2O_4$); tungsten trioxide ($WO_3$), vanadium oxide ($V_2O_5$), molybdenum oxide ($MoO_3$), rhenium oxide ($ReO_3$), europium oxide ($Eu_3O_4$), lithium titanate ($LiTi_2O_4$), manganese oxide ($Mn_3O_4$), cobalt oxide ($Co_3O_4$), antimony oxide ($Sb_2O_4$), lead oxide ($Pb_3O_4$), and the like. As sulfide, there are europium sulfide ($Eu_3S_4$), copper sulfide ($Cu_xS$) (x is in the range of 1 to 2), gallium sulfide (GaS), thallium sulfide (TlS), and the like. Furthermore, as a halogen compound, there are silver fluoride ($Ag_2F$), indium halide ($InF_2$, $InCl_2$, $InBr_2$, or $InI_2$), tantalum chloride ($Ta_6Cl_{15}$), thallium chloride ($Tl_4Cl_6$), and gallium chloride ($GaCl_2$). Moreover, as nitride, there are indium nitride (InN), tin nitride (SnN), and the like. As arsenide, there are europium arsenide ($Eu_3As_4$) and the like. Furthermore, a metallic complex of platinum (Pt), palladium (Pd), nickel (Ni), iridium (Ir), or iron (Fe) is in a mixed-valence state. It is to be noted that manganese oxide ($Mn_3O_4$) and copper sulfide ($Cu_xS$) (x is in the range of 1 to 2) are more preferable. Some of oxide or sulfide are in a mixed-valence state when oxygen defect or sulfur defect are generated. It is considered that such oxide and sulfide are useful for a hole-transporting layer because they become p-type semiconductor.

The light-emitting device of FIG. 9 is a dual emission type, in which light is emitted from both the element substrate 1600 side and the sealing substrate 1625 side in directions indicated by arrows. Thus, a light-transmitting electrode layer is used as each of the first electrode layer 1617 and the second electrode layer 1620.

In this embodiment mode, each of the first electrode layer 1617 and the second electrode layer 1620, which is a light-transmitting electrode layer, may be specifically formed using a transparent conductive film made of a light-transmitting conductive material such as indium oxide containing tungsten oxide, indium zinc oxide containing tungsten oxide, indium oxide containing titanium oxide, or indium tin oxide containing titanium oxide. It is needless to say that indium tin oxide (ITO), indium zinc oxide (IZO), indium tin oxide to which silicon oxide is added (ITSO), or the like can be used.

In addition, even in the case of a non-light-transmitting material such as a metal film, when the film thickness is made thin (preferably, about 5 to 30 nm) enough to transmit light, light can be emitted through the first electrode layer 185. As a metal thin film that can be used for the first electrode layer 185, a conductive film made of titanium, tungsten, nickel, gold, platinum, silver, aluminum, magnesium, calcium, lithium, or alloy thereof, or the like can be used.

As described above, in the light-emitting device of FIG. 9, light emitted from a light-emitting element 1605 passes through both the first electrode layer 1617 and the second electrode layer 1620, whereby light is emitted from both sides.

Figure 19:
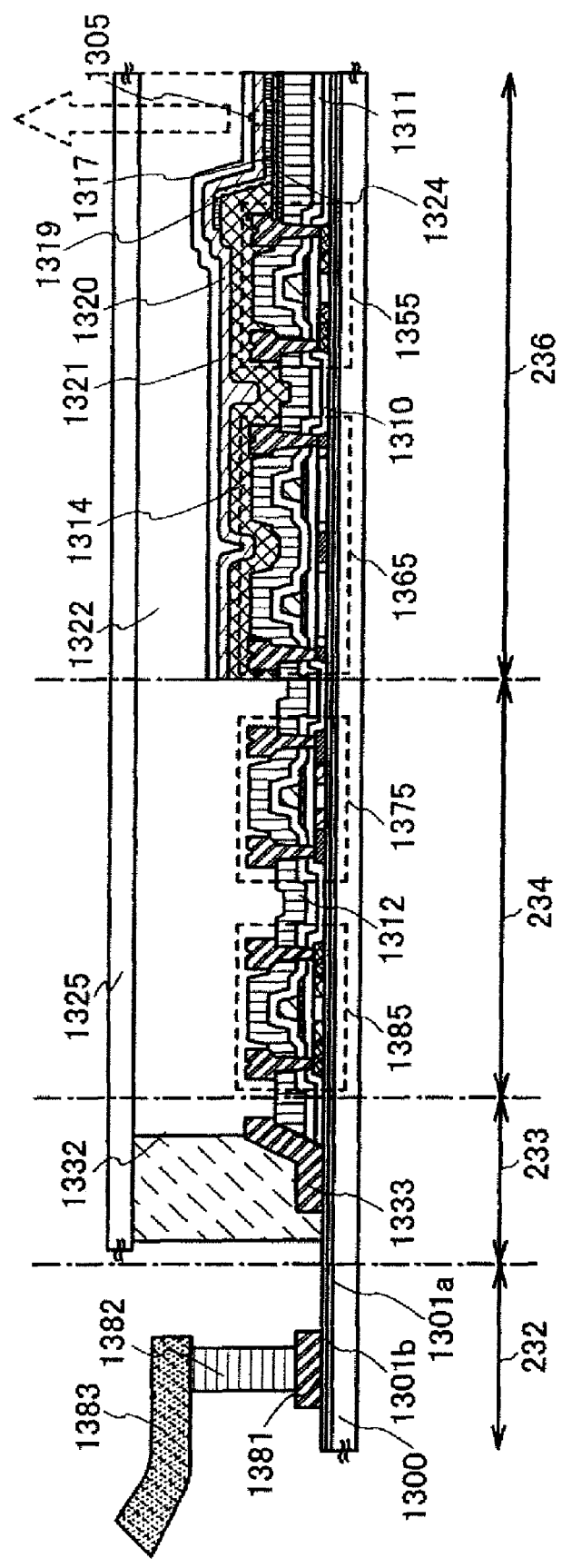
FIG. 19 is a view explaining a light-emitting device of the present invention.

A light-emitting device of FIG. 19 is a top emission type in which light is emitted in the direction of the arrow. The light-emitting device shown in FIG. 19 includes an element substrate 1300, thin film transistors 1355, 1365, 1375, and 1385, a wiring layer 1324, a first electrode layer 1317, an EL layer 1319, a second electrode layer 1320, a protective film 1321, a filler 1322, a sealing material 1332, insulating films 1301a and 1301b, a gate-insulating layer 1310, insulating films 1311 and 1312, an insulating layer 1314, a sealing substrate 1325, a wiring layer 1333, a terminal electrode layer 1381, an anisotropic conductive layer 1382, and an FPC 1383. The EL layer 1319 has a stacked layer structure including a light-emitting layer containing an organic compound and a functional layer containing a mixed-valence compound.

In each of the light-emitting devices shown in FIG. 9 and FIG. 19, the insulating layer stacked over the terminal electrode layer is removed by etching. With a structure where a permeable insulating layer is not provided at the periphery of the terminal electrode layer in this manner, reliability is more improved. The light-emitting device shown in FIG. 19 includes the external terminal connection region 232, the sealing region 233, the peripheral driver circuit region 234, and the pixel region 236. In the light-emitting device of FIG. 19, the wiring layer 1324 which is a reflective metal layer is formed below the first electrode layer 1317, and the first electrode layer 1317 which is a transparent conductive film is formed over the wiring layer 1324 in the above dual emission light-emitting device shown in FIG. 9. As the wiring layer 1324, a conductive film made of titanium, tungsten, nickel, gold, platinum, silver, copper, tantalum, molybdenum, aluminum, magnesium, calcium, lithium, or alloy thereof, or the like may be used as long as the material has reflectivity. Preferably, a substance having high reflectivity in a visible light region is used, and a titanium nitride film is used in this embodiment mode. In addition, the first electrode layer 1317 may be formed of a conductive film, and in that case, the wiring layer 1324 having reflectivity is not necessarily provided.

Each of the first electrode layer 1317 and the second electrode layer 1320 may be specifically formed using a transparent conductive film made of a light-transmitting conductive material such as indium oxide containing tungsten oxide, indium zinc oxide containing tungsten oxide, indium oxide containing titanium oxide, or indium tin oxide containing titanium oxide. It is needless to say that indium tin oxide (ITO), indium zinc oxide (IZO), indium tin oxide to which silicon oxide is added (ITSO), or the like can also be used.

Even in the case of a non-light-transmitting material such as a metal film, when the thickness is made thin (preferably, about 5 to 30 nm) so as to be able to transmit light, light can be emitted through the second electrode layer 1620. As a metal thin film that can be used for the second electrode layer 1620, a conductive film made of titanium, tungsten, nickel, gold, platinum, silver, aluminum, magnesium, calcium, lithium, or alloy thereof, or the like can be used.

A pixel of a light-emitting device manufactured using a light-emitting element can be driven by a simple matrix mode or an active matrix mode. In addition, either digital driving or analog driving can be employed.

A color filter (colored layer) may be provided for a sealing substrate. The color filter (colored layer) can be formed by an evaporation method or a droplet-discharging method. With the use of the color filter (colored layer), high-definition display can be performed. This is because a broad peak can be modified to be sharp in the emission spectrum of each of R, G, and B by the color filter (colored layer).

Full color display can be performed by formation of a material emitting light of a single color and combination of the material with a color filter or a color conversion layer. A second substrate (a sealing substrate), for example, may be provided with the color filter (colored layer) or the color conversion layer and then attached to the substrate.

Naturally, display with monochromatic light emission may be performed. For instance, an area-color display device using monochromatic light emission may be formed. A passive-matrix display portion is suitable for the area-color display device, and characters and symbols can be mainly displayed thereon.

The first electrode layer 870 and the second electrode layer 850 can be formed by an evaporation method, a sputtering method, a CVD method, an EB evaporation method, a printing method, a dispenser method, a droplet-discharging method, or the like.

The first electrode layer 870 and the second electrode layer 850 can similarly be formed by an evaporation method using heat resistance, an EB evaporation method, a sputtering method, a wet method, or the like. This embodiment mode can be freely combined with the above Embodiment Modes 1 to 4.

The light-emitting element of the present invention, which includes a light-emitting layer containing an organic compound, can obtain a functional layer having an improved electron-transporting property when a mixed-valence compound is contained in the functional layers. Therefore, the light-emitting element can be driven at low voltage to reduce its power consumption.

Accordingly, the light-emitting element of this embodiment mode, to which the present invention is applied, can achieve low power consumption and high reliability.

Embodiment Mode 7

Another embodiment mode of the present invention will be explained with reference to FIG. 10. This embodiment mode shows an example in which, in the light-emitting device manufactured in Embodiment Mode 4, a channel-etched type reverse staggered thin film transistor is used as a thin film transistor and the first interlayer insulating layer and the second interlayer insulating layer are not formed. Therefore, the same portions or portions having the similar functions will not be repeatedly explained.

Figure 10:
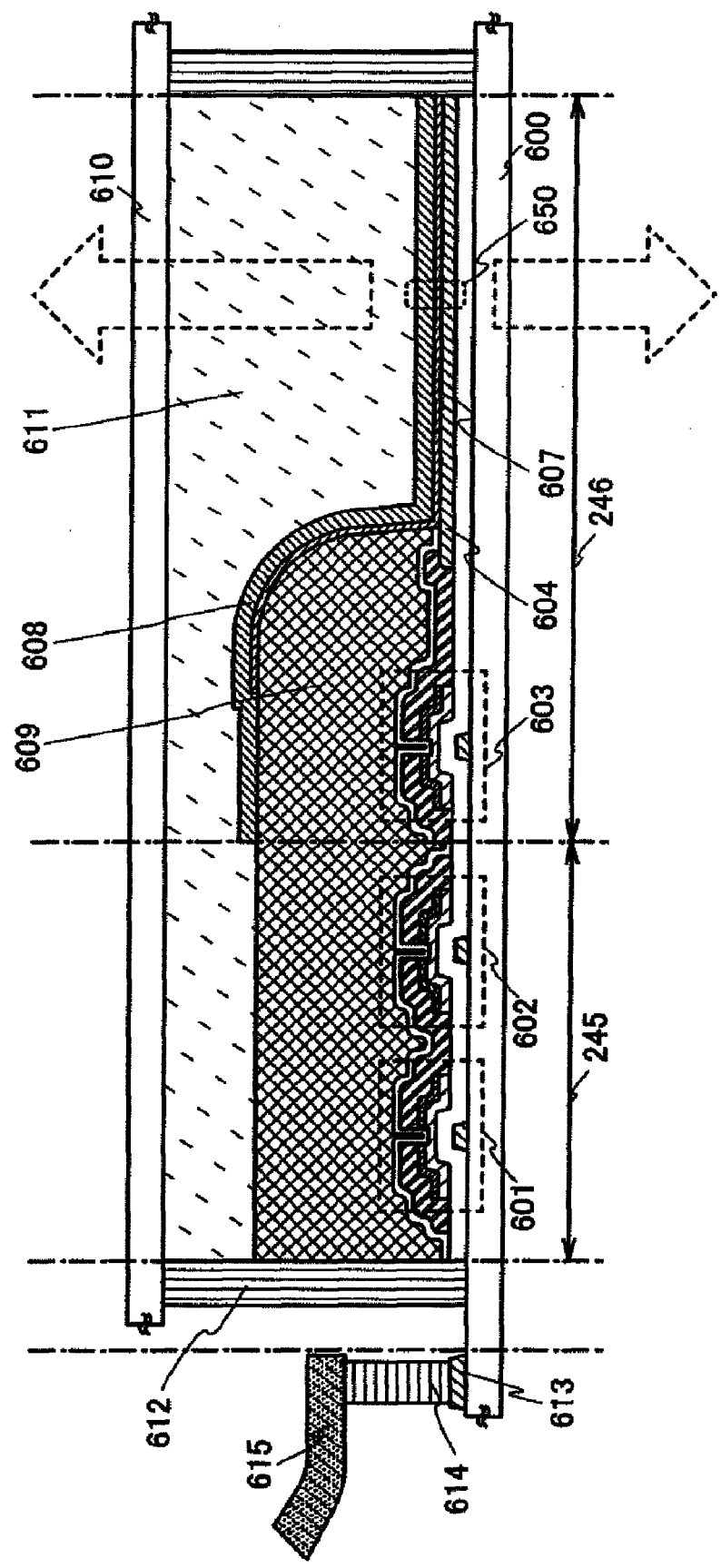
FIG. 10 is a view explaining a light-emitting device of the present invention.

A light-emitting device shown in FIG. 10 has a structure in which, over a substrate 600, reverse staggered thin film transistors 601 and 602 are provided in a peripheral driver circuit region 245; a reverse staggered thin film transistor 603, a gate-insulating layer 605, an insulating film 606, an insulating layer 609, a light-emitting element 650 which is a stacked layer of a first electrode layer 604, an EL layer 607, and a second electrode layer 608, a filler 611, and a sealing substrate 610 are provided in a pixel region 246; and a sealing material 612, a terminal electrode layer 613, an anisotropic conductive layer 614, and an FPC 615 are provided in a sealing region. The EL layer 607 includes a light-emitting layer containing an organic compound and functional layers containing a mixed-valence compound.

The EL layer 607 included in the light-emitting element manufactured using the present invention includes the functional layers (e.g., a hole-injecting layer, a hole-transporting layer, an electron-injecting layer, and an electron-transporting layer) as well as the light-emitting layer. At least one layer of the functional layers may contain a mixed-valence compound. It is needles to say that all the functional layers may each contain a mixed-valence compound.

When an element in a compound has a plurality of valences, this element is in a state that is referred to as a mixed-valence state and this compound is referred to as a mixed-valence compound. An example of a mixed-valence state is a state in which an element M contained in a compound MX has valences of +n and +m (n≠m), that is, a plurality of valences. An element may have three or more valences.

Specific examples of valences include a mixed state of valences of +1 and +2, a mixed state of valences of +2 and +3, and further a mixed state of valences of +1, +2, and +3. As valences that form a mixed-valence state, numbers are not necessarily consecutive and the case of a mixed state of valences of +1 and +3 may be possible. Furthermore, in one compound, each of two or more elements may be in a mixed-valence state. For example, in the case of the above compound MX, an element X has valences of −a and −b (a≠b) and an element M has valences of +n and +m (n≠m). The mixed-valence compound used in the present invention includes, in its category, both organic compounds and inorganic compounds. Moreover, a compositional formula of the compound may be non-stoichiometric.

The compound can be in a mixed-valence state and the state (e.g., ratio of valences) thereof can be controlled depending on conditions for the formation or the synthesis. Examples of the conditions include a synthetic temperature, kinds of raw materials or the quantity thereof to be mixed, and the like in synthesizing an objective compound. The compound can be in a mixed-valence state and the state thereof can be controlled also depending on a state in which a thin film is formed (film formation method such as vacuum evaporation or the like). Further, in some cases, oxide or sulfide can be in a mixed-valence state by a defect or by doping of a certain element. The valence state can be classified into an ordered type and a disordered type according to the state. In a disordered type, an element having valences of +n and +m (an atom having a valence of +n and an atom having a valence of +m) is randomly distributed in a crystal structure. On the other hand, in an ordered type, an element of an atom having a valence of +n and an atom having a valence of +m is not randomly distributed but aligned in a certain site. For example, a compound is in a state in which only an atom having a valence of +n is in one site and only an atom having a valence of +m is in another site. It is considered that a disordered type is preferable for hopping conduction. Among such mixed-valence compounds are a lot of materials having interesting properties, such as a superconductor and a sensor.

Hopping conduction occurs in a mixed-valence compound because it has different valences. Such hopping conduction can thus improve the mobility of a charge (carrier). Therefore, when a mixed-valence compound is contained in a functional layer of a light-emitting element, the light-emitting element can be driven at low voltage to achieve the decrease of power consumption and the improvement of reliability.

Among elements in a mixed-valence state are a transition metal and a rare-earth metal. For example, europium (Eu) has valences of +2 and +3. Among mixed-valence compounds are metal chalcogenide such as metal oxide and metal sulfide, and the like. For example, molybdenum oxide ($MoO_3$) is formed as a compound in a state in which molybdenum (Mo) has not only a valence of +3, but valences of both +2 and +3 in combination.

Oxide or sulfide of a transition metal and a rare-earth metal can be used for the mixed-valence compound contained in the above functional layer. For example, as oxide, there are perovskite-type oxide such as strontium titanate ($SrTiO_3$); a ferrite material such as magnetic ($Fe_3O_4$), manganese ferrite ($MnFe_2O_4$), or nickel ferrite ($NiFe_2O_4$); tungsten trioxide ($WO_3$), vanadium oxide ($V_2O_5$), molybdenum oxide ($MoO_3$), rhenium oxide ($ReO_3$), europium oxide ($Eu_3O_4$), lithium titanate ($LiTi_2O_4$), manganese oxide ($Mn_3O_4$), cobalt oxide ($Co_3O_4$), antimony oxide ($Sb_2O_4$), lead oxide ($Pb_3O_4$), and the like. As sulfide, there are europium sulfide ($Eu_3S_4$), copper sulfide ($Cu_xS$) (x is in the range of 1 to 2), gallium sulfide (GaS), thallium sulfide (TlS), and the like. Furthermore, as a halogen compound, there are silver fluoride ($Ag_2F$), indium halide ($InF_2$, $InCl_2$, $InBr_2$, or $InI_2$), tantalum chloride ($Ta_6Cl_{15}$), thallium chloride ($Tl_4Cl_6$), and gallium chloride ($GaCl_2$). Moreover, as nitride, there are indium nitride (InN), tin nitride (SnN), and the like. As arsenide, there are europium arsenide ($Eu_3As_4$) and the like. Furthermore, a metallic complex of platinum (Pt), palladium (Pd), nickel (Ni), iridium (Ir), or iron (Fe) is in a mixed-valence state. It is to be noted that manganese oxide ($Mn_3O_4$) and copper sulfide ($Cu_xS$) (x is in the range of 1 to 2) are more preferable. Some of oxide or sulfide are in a mixed-valence state when oxygen defect or sulfur defect are generated. It is considered that such oxide and sulfide are useful for a hole-transporting layer because they become p-type semiconductor.

A gate electrode layer, a source electrode layer, and a drain electrode layer of each of the reverse staggered thin film transistors 601, 602, and 603 formed in this embodiment mode are formed by a droplet-discharging method. A droplet-discharging method is a method in which a composition having a liquid conductive material is discharged and solidified by drying and/or baking, whereby a conductive layer or an electrode layer are formed. When a composition including an insulating material is discharged and solidified by drying and/or baking, an insulating layer can also be formed. Because a component of a light-emitting device, such as a conductive layer or an insulating layer, can be selectively formed, steps are simplified and material loss can be prevented. Therefore, a light-emitting device can be manufactured at low cost with high productivity.

A droplet-discharging unit used in a droplet-discharging method is generally a unit to discharge liquid droplets, such as a nozzle equipped with a composition discharge outlet, a head having one or a plurality of nozzles, or the like. Each nozzle of the droplet-discharging unit is set that: the diameter is 0.02 to 100 μm (preferably less than or equal to 30 μm) and the quantity of component discharge from the nozzle is 0.001 to 100 pl (preferably greater than or equal to 0.1 pl and less than or equal to 40 pl, and more preferably less than or equal to 10 pl). The discharge quantity is increased proportionately to the diameter of the nozzle. It is preferable that the distance between an object to be processed and the discharge outlet of the nozzle be as short as possible in order to drip the droplet on a desired position; the distance is preferably set to be 0.1 to 3 mm (more preferably less than or equal to 1 mm).

In the case where a film (e.g., an insulating film or a conductive film) is formed by a droplet-discharging method, the film is formed as follows: a composition containing a film material that is processed into a particle state is discharged, and then fused or welded by baking to be solidified. A film formed by a sputtering method or the like tends to have a columnar structure, whereas the film thus formed by discharging and baking of the composition containing a conductive material tends to have a polycrystalline structure having the large number of grain boundaries.

As the composition to be discharged from the discharge outlet, a conductive material dissolved or dispersed in a solvent is used. The conductive material corresponds to a fine particle or a dispersed nanoparticle of a metal such as Ag, Au, Cu, Ni, Pt, Pd, Ir, Rh, W, or Al; metal sulfide such as Cd or Zn, oxide of Fe, Ti, Si, Ge, Zr, Ba, or the like; silver halide, or the like. The above-described conductive materials may also be used in combination. Although a transparent conducive film transmits light in exposure of a back side because of its light-transmitting property, the transparent conductive film can be used as being a stacked body with a material that does not transmit light. As the transparent conductive film, indium tin oxide (ITO), indium tin oxide containing silicon oxide (ITSO), organic indium, organic tin, zinc oxide, titanium nitride, or the like can be used: Further, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may also be used. As for the composition to be discharged from the discharge outlet, it is preferable to use any of the materials of gold, silver, and copper, dissolved or dispersed in a solvent, considering specific resistance, and it is more preferable to use silver or copper having low resistance. When silver or copper is used, a barrier film may be provided together as a countermeasure against impurities. A silicon nitride film or a nickel boron (NiB) film can be used as the barrier film.

The composition to be discharged is a conductive material dissolved or dispersed in a solvent, which further contains a dispersant or a thermosetting resin. In particular, the thermosetting resin has a function of preventing generation of cracks or uneven baking during baking. Thus, a formed conductive layer may contain an organic material. The organic material to be contained is different depending on heating temperature, atmosphere, and time period. This organic material is an organic resin that functions as a thermosetting resin, a solvent, a dispersant, and a coating of a metal particle, or the like; typical examples thereof include polyimide, acrylic, a novolac resin, a melamine resin, a phenol resin, an epoxy resin, a silicone resin, a furan resin, a diallyl phthalate resin, and other organic resins.

In addition, a particle with a plurality of layers, in which a conductive material is coated with another conductive material, may also be used. For example, a particle with a three-layer structure in which copper is coated with nickel boron (NiB) and the nickel boron is further coated with silver, may be used. For the solvent, esters such as butyl acetate or ethyl acetate, alcohols such as isopropyl alcohol or ethyl alcohol, an organic solvent such as methyl ethyl ketone or acetone, or water is used. The viscosity of the composition is preferably less than or equal to 20 mPa·s (cp), which prevents the composition from drying and allows the composition to be discharged smoothly from the discharge outlet. The surface tension of the composition is preferably less than or equal to 40 mN/m. However, the viscosity and the like of the composition may be appropriately controlled in accordance with a solvent to be used or an intended purpose. For example, the viscosity of a composition in which ITO, organic indium, or organic tin is dissolved or dispersed in a solvent may be set to be 5 to 20 mPa·s, the viscosity of a composition in which silver is dissolved or dispersed in a solvent may be set to be 5 to 20 mPa·s, and the viscosity of a composition in which gold is dissolved or dispersed in a solvent may be set to be 5 to 20 mPa·s.

Further, the conductive layer may also be formed as a stack of a plurality of conductive materials. In addition, the conductive layer may be formed first by a droplet-discharging method using silver as a conductive material and may be then plated with copper or the like. The plating may be performed by electroplating or a chemical (electroless) plating method. The plating may be performed by immersing a substrate surface in a container filled with a solution containing a plating material; alternatively, the solution containing a plating material may be applied to the substrate placed obliquely (or vertically) so as to flow the solution containing a plating material on the substrate surface. When the plating is performed by application of a solution to the substrate placed obliquely, there is an advantage of miniaturizing a process apparatus.

The diameter of the particle of the conductive material is preferably as small as possible for preventing nozzles from being clogged and for forming a minute pattern, although it depends on the diameter of each nozzle, a desired shape of a pattern, and the like. Preferably, the diameter of the particle of the conductive material is less than or equal to 0.1 μm. The composition is formed by a known method such as an electrolyzing method, an atomizing method, or a wet reduction method, and the particle size thereof is generally about 0.01 to 10 μm. When a gas evaporation method is employed, the size of nanoparticles protected by a dispersant is as minute as about 7 nm. When a surface of each particle is covered with a coating, the nanoparticles do not aggregate in the solvent and are stably dispersed in the solvent at room temperature, and behave similarly to liquid. Accordingly, it is preferable to use a coating.

In addition, the step of discharging the composition may be performed under reduced pressure. When the step is performed under reduced pressure, an oxide film or the like is not formed on the surface of the conductive material, which is preferable. After the composition is discharged, one or both of drying or baking are performed. Both the drying step and baking step are heat treatment; however, for example, drying is performed at 100° C. for 3 minutes, baking is performed at 200 to 350° C. for 15 to 60 minutes, and they are different in purpose, temperature, and time period. The steps of drying and baking are performed under normal pressure or under reduced pressure, by laser beam irradiation, rapid thermal annealing, heating using a heating furnace, or the like. It is to be noted that the timing of each heat treatment is not particularly limited. The substrate may be heated in advance to favorably perform the steps of drying and baking, and the temperature at that time is, although it depends on the material of the substrate or the like, generally 100 to 800° C. (preferably, 200 to 350° C.). Through these steps, nanoparticles are made in contact with each other and fusion and welding are accelerated since a peripheral resin is hardened and shrunk, while the solvent in the composition is volatilized or the dispersant is chemically removed.

A continuous wave or pulsed gas laser or solid-state laser may be used for the laser beam irradiation. An excimer laser, a YAG laser, or the like can be used as the former gas laser. A laser using a crystal of YAG, $YVO_4$, $GdVO_4$, or the like which is doped with Cr, Nd, or the like can be used as the latter solid-state laser. It is preferable to use a continuous wave laser in consideration of the absorptance of a laser beam. Moreover, a laser irradiation method in which pulsed and continuous wave lasers are combined may be used. It is preferable that the heat treatment by laser beam irradiation be rapidly performed within several microseconds to several tens of seconds so as not to damage the substrate 100, depending on the heat resistance of the substrate 100. Rapid thermal annealing (RTA) is carried out by raising the temperature rapidly and heating the substrate instantaneously for several microseconds to several minutes with the use of an infrared lamp or a halogen lamp that emits ultraviolet to infrared light in an inert gas atmosphere. Because this treatment is performed instantaneously, only an outermost thin film can be heated and the lower layer of the film is not adversely affected. In other words, even a substrate having low heat resistance such as a plastic substrate is not adversely affected.

After the conductive layer, the insulating layer, or the like is formed by discharge of a composition by a droplet-discharging method, a surface thereof may be planarized by pressing with pressure to enhance planarity. The pressing may be performed as follows: unevenness is reduced by rolling a roller-shaped object on the surface, the surface is pressed with a flat plate-shaped object, or the like. A heating step may also be performed at the time of the pressing. Alternatively, the concavity and convexity of the surface may be removed with an air knife after the surface is softened or melted with a solvent or the like. A CMP method may also be used for polishing the surface. This step can be employed in planarizing the surface when concavity and convexity are generated by a droplet-discharging method.

In this embodiment mode, an amorphous semiconductor is used as a semiconductor layer and a semiconductor layer having one conductive type may be formed as needed. In this embodiment mode, an amorphous n-type semiconductor layer as a semiconductor layer having one conductive type is stacked over the semiconductor layer. Further, an NMOS structure of an n-channel TFT in which an n-type semiconductor layer is formed, a PMOS structure of a p-channel TFT in which a p-type semiconductor layer is formed, and a CMOS structure having an n-channel TFT and a p-channel TFT can be formed. In this embodiment mode, the reverse staggered thin film transistors 601 and 603 are formed of an n-channel TFT, and the reverse staggered thin film transistor 602 is formed of a p-channel TFT, whereby the reverse staggered thin film transistors 601 and 602 form a CMOS structure in the peripheral driver circuit region 255.

Moreover, in order to impart conductivity, an element imparting conductivity is added by doping and an impurity region is formed in the semiconductor layer; therefore, an n-channel TFT or a p-channel TFT can be formed. Instead of forming an n-type semiconductor layer, conductivity may be imparted to the semiconductor layer by plasma treatment with a $PH_3$ gas.

Further, the semiconductor layer can be formed using an organic semiconductor material by a printing method, a spray method, a spin coating method, a droplet-discharging method, a dispenser method, or the like. In this case, the aforementioned etching step is not required; therefore, the number of steps can be reduced. As an organic semiconductor, a low molecular material such as pentacene, a high molecular material, or the like can be used, and a material such as an organic pigment and a conductive high molecular material can be used as well. As the organic semiconductor material used in the present invention, a high molecular material of a π electron conjugated system of which a skeleton is composed of conjugated double bonds is preferable. Typically, a soluble high molecular material such as polythiophene, polyfluorene, poly(3-alkylthiophene), or a polythiophene derivative can be used.

A light-emitting element that can be applied to the present invention can employ the structure as described in the above embodiment modes.

This embodiment mode can be freely combined with any of Embodiment Modes 1 to 4.

The light-emitting element of the present invention, which includes a light-emitting layer containing an organic compound, can obtain a functional layer having an improved electron-transporting property when a mixed-valence compound is contained in the functional layers. Therefore, the light-emitting element can be driven at low voltage to reduce its power consumption.

Accordingly, the light-emitting element of this embodiment mode, to which the present invention is applied, can achieve low power consumption and high reliability.

Embodiment Mode 8

Figure 18:
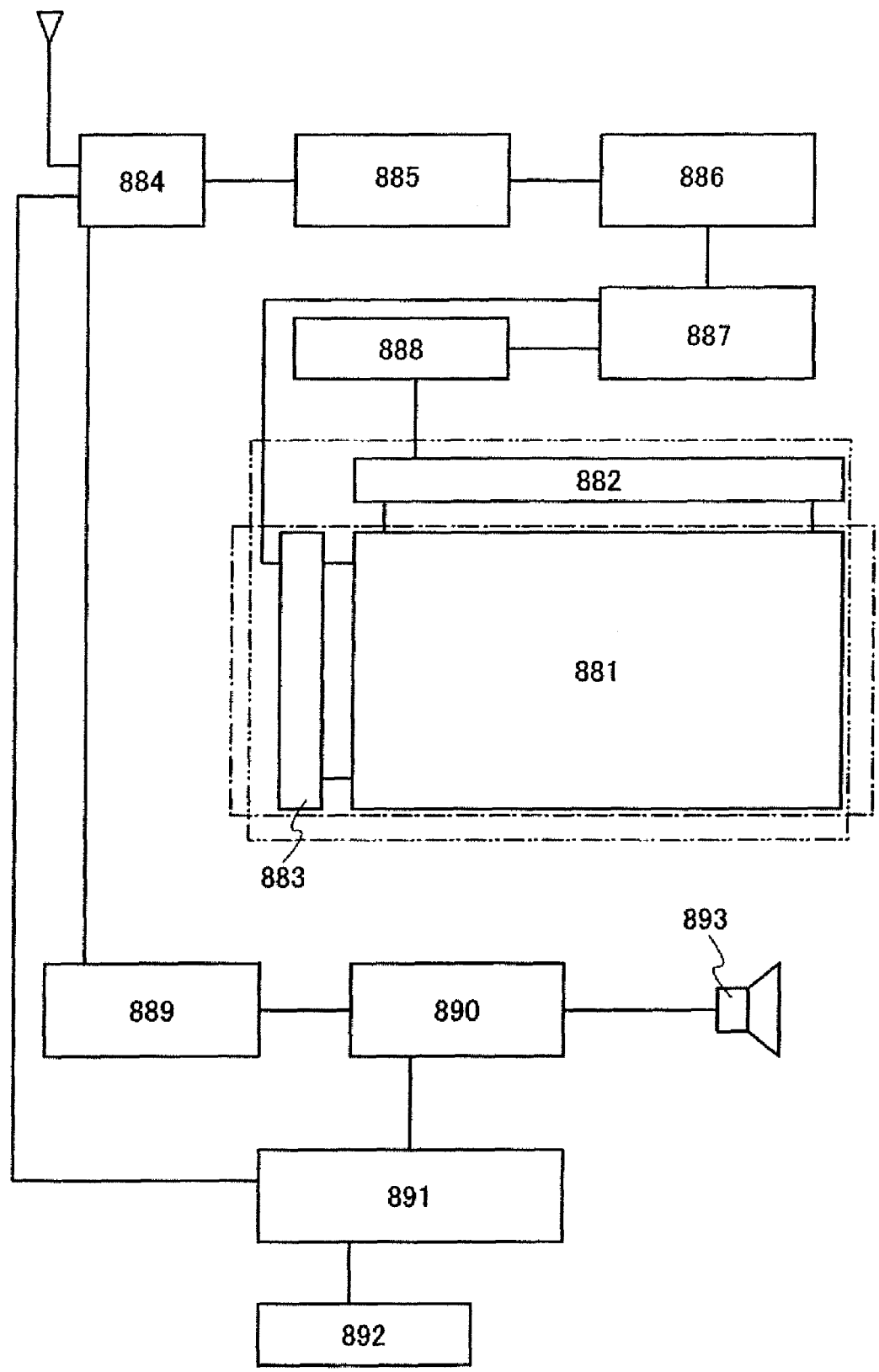
FIG. 18 is a diagram explaining an electronic device to which the present invention is applied.

The light-emitting device manufactured by the present invention can function as a light-emitting display device that performs display, and a television device can be completed using the light-emitting display device of the present invention. FIG. 18 is a block diagram showing a major structure of a television device (in this embodiment mode, an EL television device). The display panel may have any of the following modes: the case as shown in FIG. 16A where only a pixel portion is formed, and a scanning line driver circuit and a signal line driver circuit are mounted by a TAB method as shown in FIG. 17B; the case as shown in FIG. 16A where only a pixel portion is formed, and a scanning line driver circuit and a signal line driver circuit are mounted by a COG method as shown in FIG. 17A; the case as shown in FIG. 16B where TFTs are each formed of an SAS, the pixel portion and the scanning line driver circuit are integrated over the substrate, and the signal line driver circuit is mounted as a driver IC separately; the case as shown in FIG. 16C where the pixel portion, the signal line driver circuit, and the scanning line driver circuit are integrated over the substrate; and the like.

Other external circuits include, on an input side of video signals, a video signal amplifier circuit 885 which amplifies a video signal among signals received by a tuner 884, a video signal processing circuit 886 which converts a signal output from the video signal amplifier circuit 885 into cromatinance signals corresponding to respective colors of red, green, and blue, a control circuit 887 which converts the video signal into an input specification of the driver IC, and the like. The control circuit 887 outputs signals to the scanning line side and the signal line side. In the case of digital driving, a signal dividing circuit 888 may be provided on the signal line side so that input digital signals are divided into m pieces to be supplied.

Among the signals received by the tuner 884, audio signals are transmitted to an audio signal amplifier circuit 889, of which output is supplied to a speaker 893 through an audio signal processing circuit 890. A control circuit 891 receives control data such as a receiving station (receiving frequency) and volume from an input portion 892, and transmits signals to the tuner 884 and the audio signal processing circuit 890.

Figure 12A:
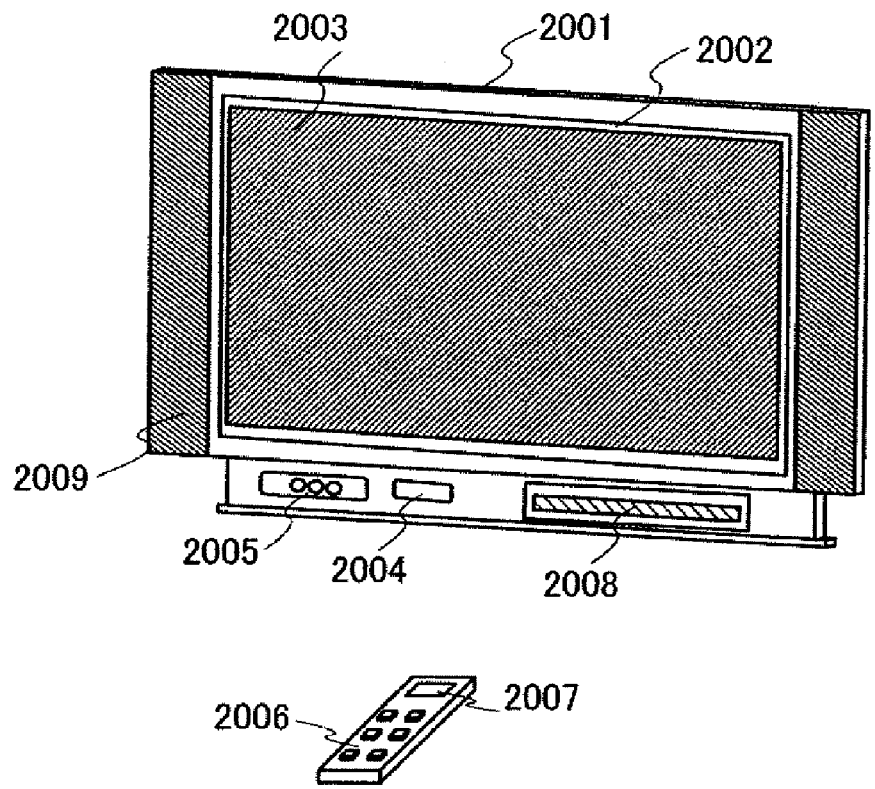
FIGS. 12A and 12B are views each showing an electronic device to which the present invention is applied.
Figure 12B:
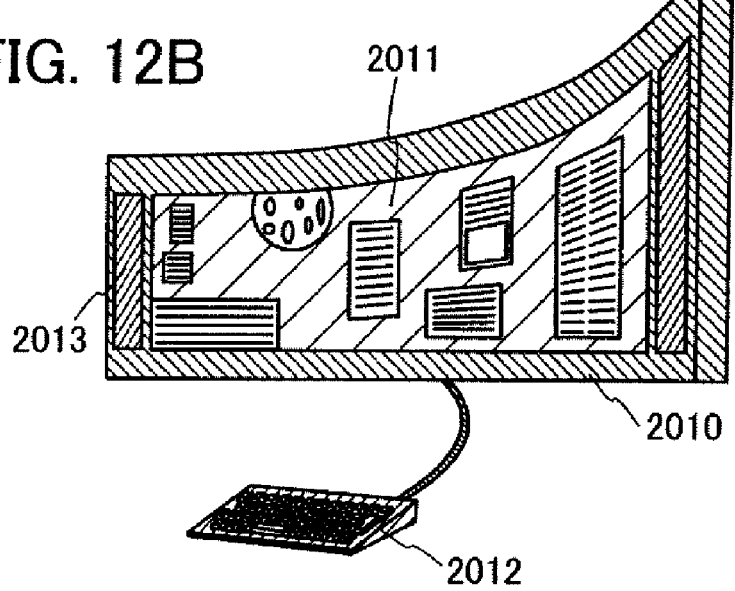

As shown in FIGS. 12A and 12B, a display module is incorporated in a chassis and then a television device can be completed. A display panel as shown in FIGS. 7A and 7B, in which components up to an FPC are set, is generally called an EL display module. Therefore, by using the EL display module as shown in FIGS. 7A and 7B, an EL television device can be completed. A main screen 2003 is formed by using the display module, and a speaker portion 2009, an operation switch, and the like are provided as other attachment systems. In this manner, a television device can be completed by the present invention.

In addition, with the use of retardation films and a polarizing plate, reflected light of light incident from outside may be blocked. In the case of a top emission light-emitting device, an insulating layer serving as a partition wall may be colored to be used as a black matrix. The partition wall can be formed by a droplet-discharging method or the like as well, using a pigment-based black resin or a resin material such as polyimide mixed with carbon black or the like, or a stacked layer thereof. A partition wall may be formed by discharge of different materials in the same region a plurality of times by a droplet-discharging method. As the retardation films, a quarter wave plate or a half wave plate may be used, and the display module may be designed so as to be able to control light. As the structure, a TFT element substrate, a light-emitting element, a sealing substrate (sealing material), the retardation films (a quarter wave plate or a half wave plate), and the polarizing plate are sequentially stacked, where light emitted from the light-emitting element is transmitted therethrough and emitted to outside from the polarizing plate side. The polarizing plate, the retardation film, and the like may also have a stacked structure. The retardation film and the polarizing plate may be provided on a side to which light passes through, or may be provided on both sides in the case of a dual emission light-emitting device in which light is emitted to the both sides. In addition, an anti-reflective film may be provided on the outer side of the polarizing plate. Accordingly, an image with higher resolution and precision can be displayed.

As shown in FIG. 12A, a display panel 2002 using a light-emitting element is incorporated in a chassis 2001. General television broadcast can be received by a receiver 2005. Further, by connection to a communication network in a wired or wireless manner through a modem 2004, one way (from transmitter to receiver) or two-way (between transmitter and receiver or between receivers) data communication is possible. The television device can be operated by using a switch incorporated in the chassis 2001 or a separate remote control device 2006. The remote control device may be provided with a display portion 2007 which displays data to be output.

In the television device, a sub-screen 2008 may be formed with a second display panel in addition to the main screen 2003, which has a structure to display a channel, volume, or the like. In this structure, the main screen 2003 may be formed using an EL display panel with a superior viewing angle while the sub-screen 2008 may be formed using a liquid crystal display panel that can perform display with low power consumption. To give priority to low power consumption, the main screen 2003 may be formed using a liquid crystal display panel and the sub-screen 2008 may be formed using an EL display panel so as to be capable of blinking. According to the present invention, a highly reliable light-emitting device can be manufactured even by using a large substrate with a lot of TFTs and electronic components.

FIG. 12B is a television device having a large display portion with the size of, for example, 20 to 80 inches, including a chassis 2010, a keyboard portion 2012 as an operation portion, a display portion 2011, a speaker portion 2013, and the like. The present invention is applied to manufacturing of the display portion 2011. The display portion shown in FIG. 12B is formed of a substance that can be curved; therefore, the television device has a curved display portion. In this manner, the shape of the display portion can be freely designed; therefore, a television device with a desired shape can be manufactured.

According to the present invention, a light-emitting device with low power consumption and high reliability can be manufactured. Therefore, the television device with low power consumption and high reliability can be manufactured.

It is needless to say that the present invention is not limited to a television device and can be used for various applications as a large display medium, such as an information display board at train stations, airports, and the like, and an advertisement board on the street as well as a monitor of a personal computer.

This embodiment mode can be used by being combined with any of Embodiment Modes 1 to 6.

Embodiment Mode 9

This embodiment mode will be explained with reference to FIGS. 13A and 13B. This embodiment mode will describe an example of a module using a panel including the light-emitting device manufactured in Embodiment Modes 3 to 7.

Figure 13A:
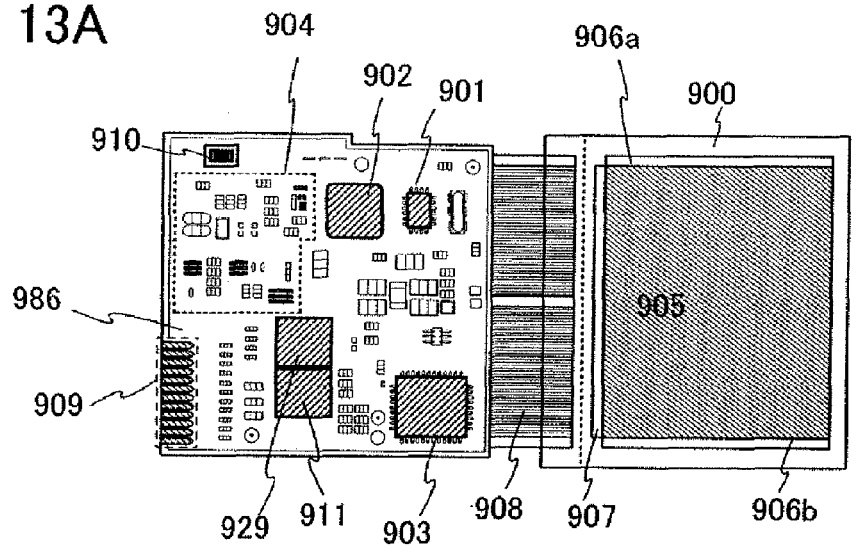
FIGS. 13A and 13B are a view and a diagram each showing an electronic device to which the present invention is applied.

A module of an information terminal shown in FIG. 13A includes a printed wiring board 986 over which a controller 901, a central processing unit (CPU) 902, a memory 911, a power source circuit 903, an audio processing circuit 929, a transmission/reception circuit 904, and other elements such as a resistor, a buffer, and a capacitor are mounted. In addition, a panel 900 is connected to the printed wiring board 986 through a flexible wiring circuit (FPC) 908.

The panel 900 is provided with a pixel portion 905 including a light-emitting element in each pixel, a first scanning line driver circuit 906a and a second scanning line driver circuit 906b which select a pixel included in the pixel portion 905, and a signal line driver circuit 907 which supplies a video signal to the selected pixel.

Various control signals are input and output through an interface (I/F) portion 909 provided over the printed wiring board 986. In addition, an antenna port 910 to transmit and receive signals to/from an antenna is provided for the printed wiring board 986.

It is to be noted that, although the printed wiring board 986 is connected to the panel 900 through the FPC 908 in this embodiment mode, the present invention is not limited to this structure. The controller 901, the audio processing circuit 929, the memory 911, the CPU 902, or the power source circuit 903 may be directly mounted on the panel 900 by a chip on glass (COG) method. Moreover, various elements such as a capacitor and a buffer are provided for the printed wiring board 986 to prevent a noise in power source voltage or a signal or delay signal in signal rising are prevented.

Figure 13B:
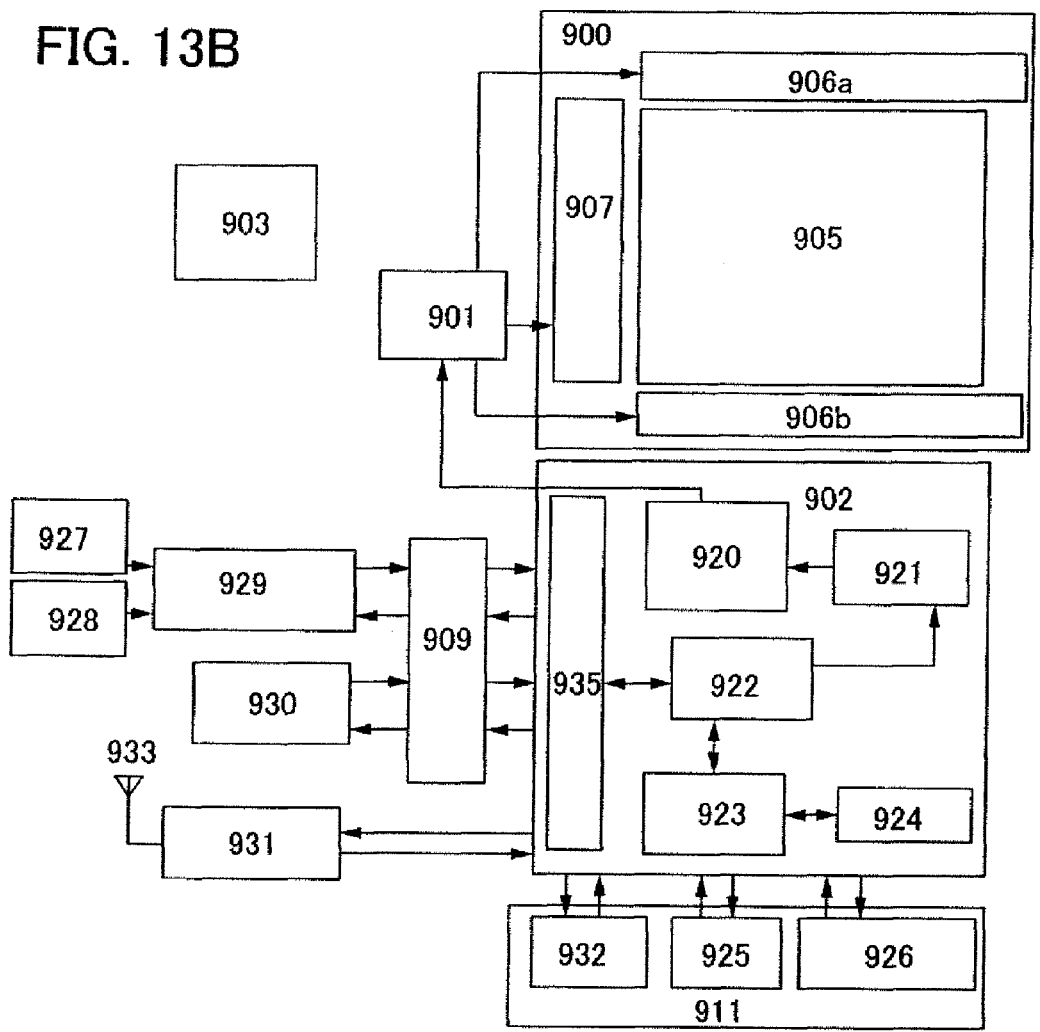

FIG. 13B is a block diagram of the module shown in FIG. 13A. This module 999 includes a VRAM 932, a DRAM 925, a flash memory 926, and the like, as the memory 911. The VRAM 932 stores image data to be displayed on the panel 900, the DRAM 925 stores image data or audio data, and the flash memory 926 stores various programs.

The power source circuit 903 generates power source voltage applied to the panel 900, the controller 901, the CPU 902, the audio processing circuit 929, the memory 911, and the transmission/reception circuit 931. Moreover, in some cases, a current source may be provided in the power source circuit 903 depending on the specifications of the panel 900.

The CPU 902 includes a control signal generating circuit 920, a decoder 921, a register 922, an arithmetic circuit 923, a RAM 924, an interface 935 for the CPU, and the like. Various signals input to the CPU 902 through the interface 935 are input to the arithmetic circuit 923, the decoder 921, and the like after once being held in the register 922. The arithmetic circuit 923 operates based on the input signal and specifies an address to send various instructions. The signal input to the decoder 921 is decoded and input to the control signal generating circuit 920. The control signal generating circuit 920 generates a signal including various instructions based on the input signal and sends it to the address specified by the arithmetic circuit 923, which are specifically the memory 911, the transmission/reception circuit 931, the audio processing circuit 929, the controller 901, and the like.

The memory 911, the transmission/reception circuit 931, the audio processing circuit 929, and the controller 901 operate in accordance with respective received instructions. The operations will be briefly explained below.

The signal input from an input unit 930 is transmitted to the CPU 902 mounted on the printed wiring board 986 through the interface (I/F) portion 909. The control signal generating circuit 920 converts the image data stored in the VRAM 932 into a predetermined format in accordance with the signal transmitted from the input unit 930 such as a pointing device or a keyboard, and then transmits it to the controller 901.

The controller 901 processes a signal including image data transmitted from the CPU 902 in accordance with the specifications of the panel 900, and supplies it to the panel 900. The controller 901 generates a Hsync signal, a Vsync signal, a clock signal CLK, alternating voltage (AC Cont), and a switching signal L/R, and supplies them to the panel 900 based on the power source voltage input from the power source circuit 903 and various signals input from the CPU 902.

In the transmission/reception circuit 904, a signal transmitted and received as an electric wave by the antenna 933 is processed. Specifically, a high frequency circuit such as an isolator, a band path filter, a voltage controlled oscillator (VCO), a low pass filter (LPF), a coupler, or a balun is included. Among the signals transmitted and received by the transmission/reception circuit 904, signals including audio data are transmitted to the audio processing circuit 929 in accordance with an instruction transmitted from the CPU 902.

The signals including audio data transmitted in accordance with the instruction from the CPU 902 are demodulated into audio signals in the audio processing circuit 929, and transmitted to a speaker 928. The audio signal transmitted from a microphone 927 is modulated in the audio processing circuit 929, and transmitted to the transmission/reception circuit 904 in accordance with the instruction from the CPU 902.

The controller 901, the CPU 902, the power source circuit 903, the audio processing circuit 929, and the memory 911 can be incorporated as a package of this embodiment mode. This embodiment mode can be applied to any circuit other than a high frequency circuit such as an isolator, a band path filter, voltage controlled oscillator (VCO), a low pass filter (LPF), a coupler, or a balun.

Embodiment Mode 10

Figure 14:
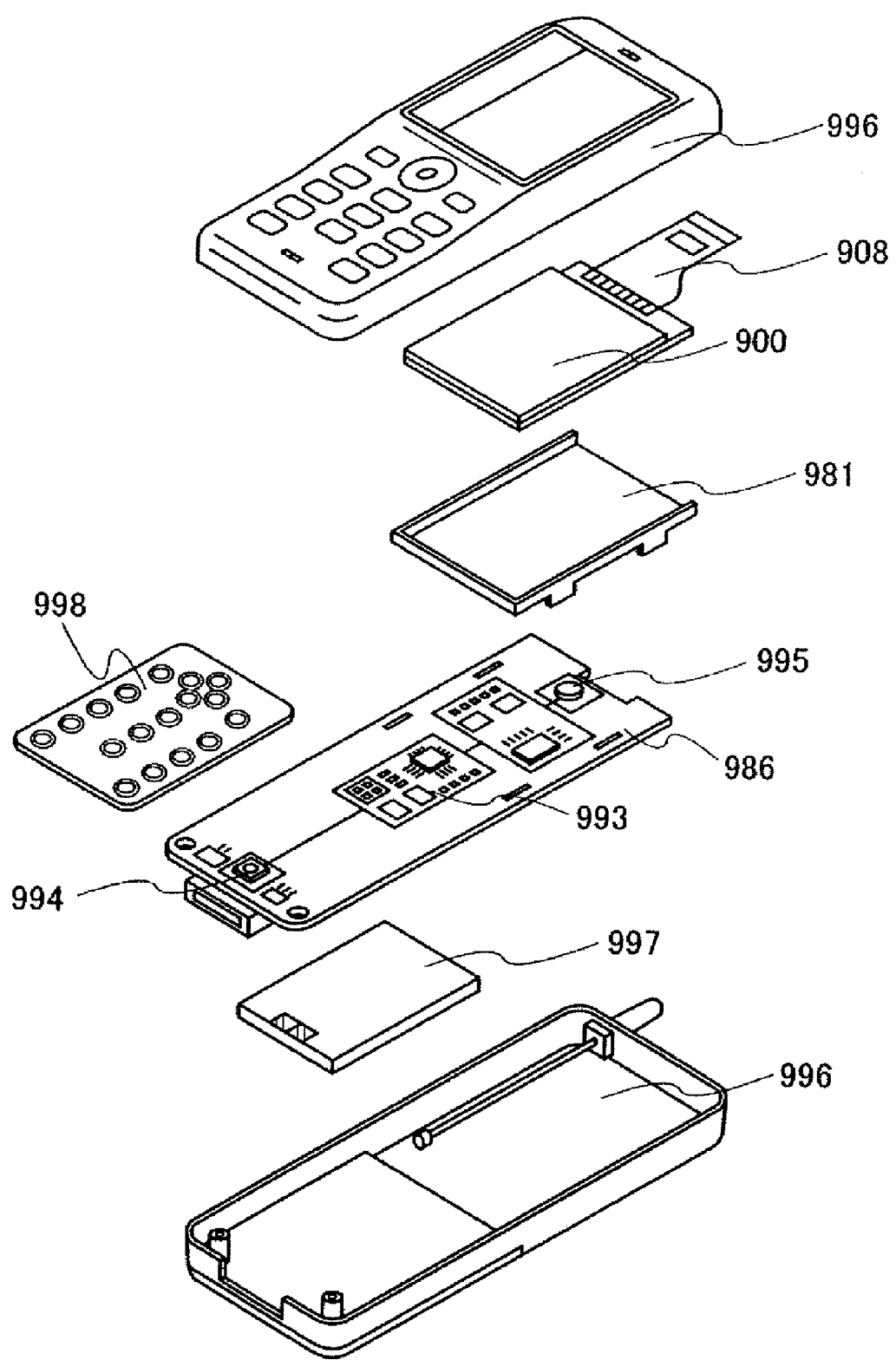
FIG. 14 is a view showing an electronic device to which the present invention is applied.

This embodiment mode will be explained with reference to FIG. 14. FIG. 14 shows one mode of a compact phone (mobile phone) including the module manufactured in Embodiment Mode 8, which operates wirelessly and can be carried. A panel 900 is detachably incorporated in a housing 981 so as to be easily combined with a module 999. The shape and size of the housing 981 can be changed in accordance with an electronic device into which the module is incorporated as appropriate.

The housing 981 to which the panel 900 is fixed is fitted to a printed wiring board 986 and set up as a module. A plurality of semiconductor devices that are packaged are mounted on the printed wiring board 986. The plurality of semiconductor devices mounted on the printed wiring board 986 have any function of a controller, a central processing unit (CPU), a memory, a power source circuit, and other elements such as a resistor, a buffer, and a capacitor. Moreover, an audio processing circuit including a microphone 994 and a speaker 995 and a signal processing circuit 993 such as a transmission/reception circuit are provided. The panel 900 is connected to the printed wiring board 986 through an FPC 908.

The module 999, the housing 981, the printed wiring board 986, an input unit 998, and a battery 997 are stored in a chassis 996. The pixel portion of the panel 900 is arranged so that it can be seen through a window formed in the chassis 996.

The chassis 996 shown in FIG. 14 is shown as an example of an exterior shape of a mobile phone. However, an electronic device of this embodiment mode can be changed into various modes in accordance with functions and intended purpose. In the following embodiment mode, examples of the modes will be explained.

Embodiment Mode 11

Examples of electronic devices according to the present invention include a television device (also referred to simply as a television or a television receiver), a camera such as a digital camera or a digital video, a mobile phone set (also referred to simply as a mobile phone or a cell-phone), a portable information terminal such as a PDA, a portable game machine, a monitor for a computer, a computer, an audio reproducing device such as a car audio system, an image reproducing device such as a home game machine, and the like. The specific examples will be explained with reference to FIGS. 15A to 15E.

Figure 15A:
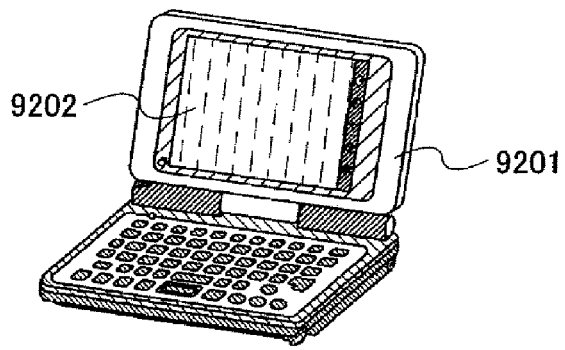
FIGS. 15A to 15E are views each showing an electronic device to which the present invention is applied.

A portable information terminal device shown in FIG. 15A includes a main body 9201, a display portion 9202, and the like. The light-emitting device of the present invention can be applied to the display portion 9202. Accordingly, a portable information terminal device with lower power consumption and high reliability can be provided.

Figure 15B:
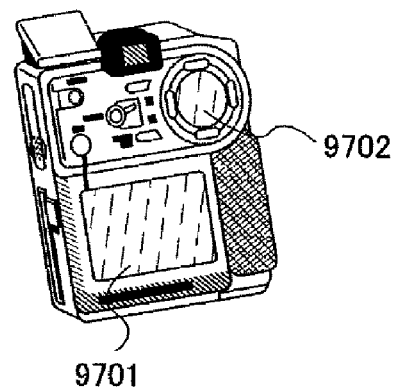

A digital video camera shown in FIG. 15B includes display portions 9701 and 9702, and the like. The light-emitting device of the present invention can be applied to the display portion 9701. Accordingly, a digital video camera with lower power consumption and high reliability can be provided.

Figure 15C:
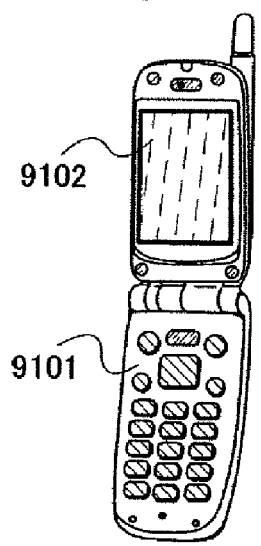

A mobile phone shown in FIG. 15C includes a main body 9101, a display portion 9102, and the like. The light-emitting device of the present invention can be applied to the display portion 9102. Accordingly, a mobile phone with lower power consumption and high reliability can be provided.

Figure 15D:
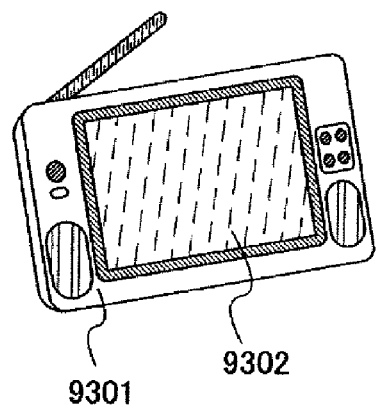

A portable television device shown in FIG. 15D includes a main body 9301, a display portion 9302, and the like. The light-emitting device of the present invention can be applied to the display portion 9302. Accordingly, a portable television device with lower power consumption and high reliability can be provided. Furthermore, the light-emitting device of the present invention can be applied to the broad range of television devices from a small-size one mounted on a portable terminal, such as a mobile phone, to a medium-size one that can be carried as well as a large-size one (e.g., greater than or equal to 40 inches).

Figure 15E:
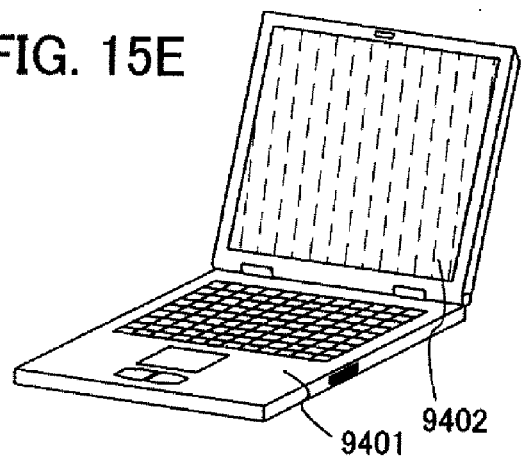

A portable computer shown in FIG. 15E includes a main body 9401, a display portion 9402, and the like. The light-emitting device of the present invention can be applied to the display portion 9402. Accordingly, a portable computer with lower power consumption and high reliability can be provided.

The light-emitting element and light-emitting device of the present invention can also be used as a lighting device. One mode using the light-emitting element of the present invention for a lighting device will be described with reference to FIG. 22, FIG. 23, and FIG. 24.

Figure 22:
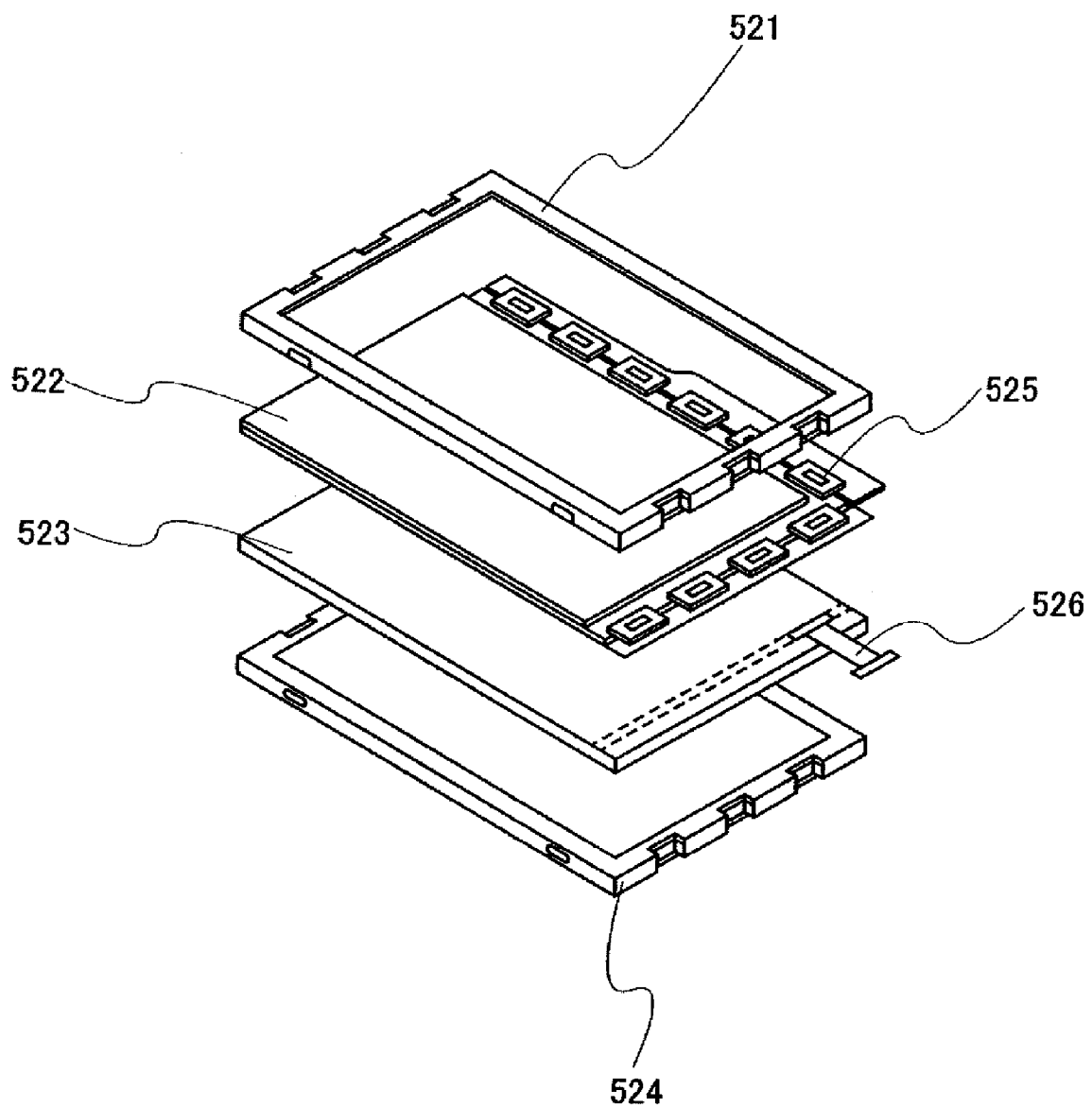
FIG. 22 is a view explaining an electronic device to which the present invention is applied.

FIG. 22 shows an example of a liquid crystal display device that uses the light-emitting device of the present invention as a backlight. The liquid crystal display device shown in FIG. 22 includes a chassis 521, a liquid crystal layer 522, a backlight 523, and a chassis 524. The liquid crystal layer 522 is connected to a driver IC 525. The light-emitting device of the present invention is used as the backlight 523. Current is supplied through a terminal 526.

The light-emitting device of the present invention is a lighting device with plane light emission, and can have a large area. Therefore, the backlight can have a large area, and thus a liquid crystal display device having a large area can be obtained. Furthermore, the light-emitting device of the present invention has a thin shape, and thus a thin shape of a display device can also be achieved.

The light-emitting device of the present invention can be used as a headlight of an automobile, a bicycle, a ship, or the like.

Figure 23:
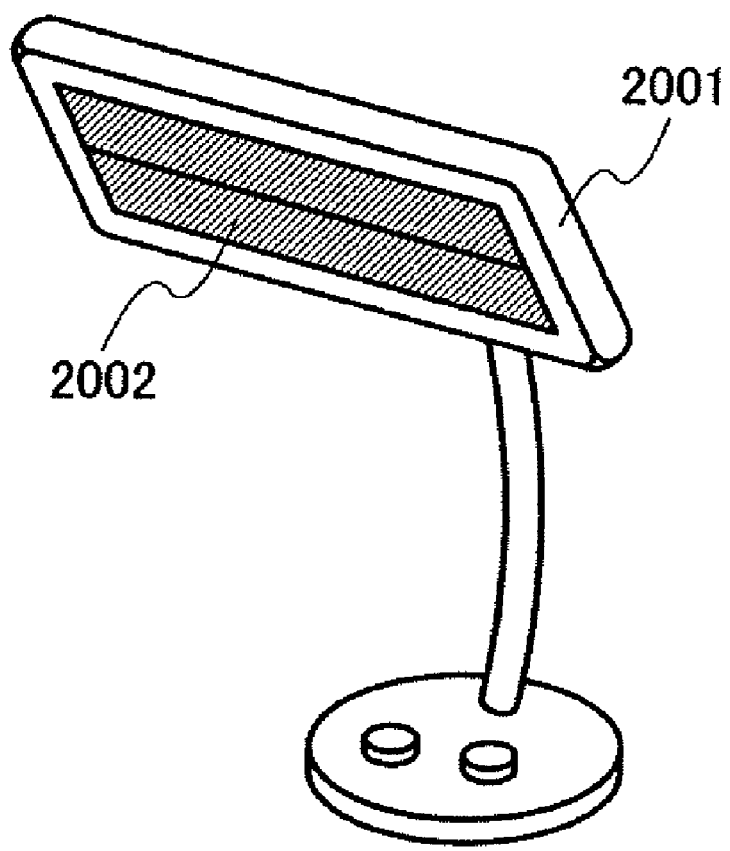
FIG. 23 is a view explaining an electronic device to which the present invention is applied.

FIG. 23 shows an example of using the light-emitting device of the present invention for a table lamp that is a lighting device. A table lamp shown in FIG. 23 has a chassis 2101 and a light source 2102. The light-emitting device of the present invention is used as the light source 2102. Since the light-emitting device of the present invention has a thin shape and consumes low power, it can be used as a lighting device with thin shape and low power consumption.

Figure 24:
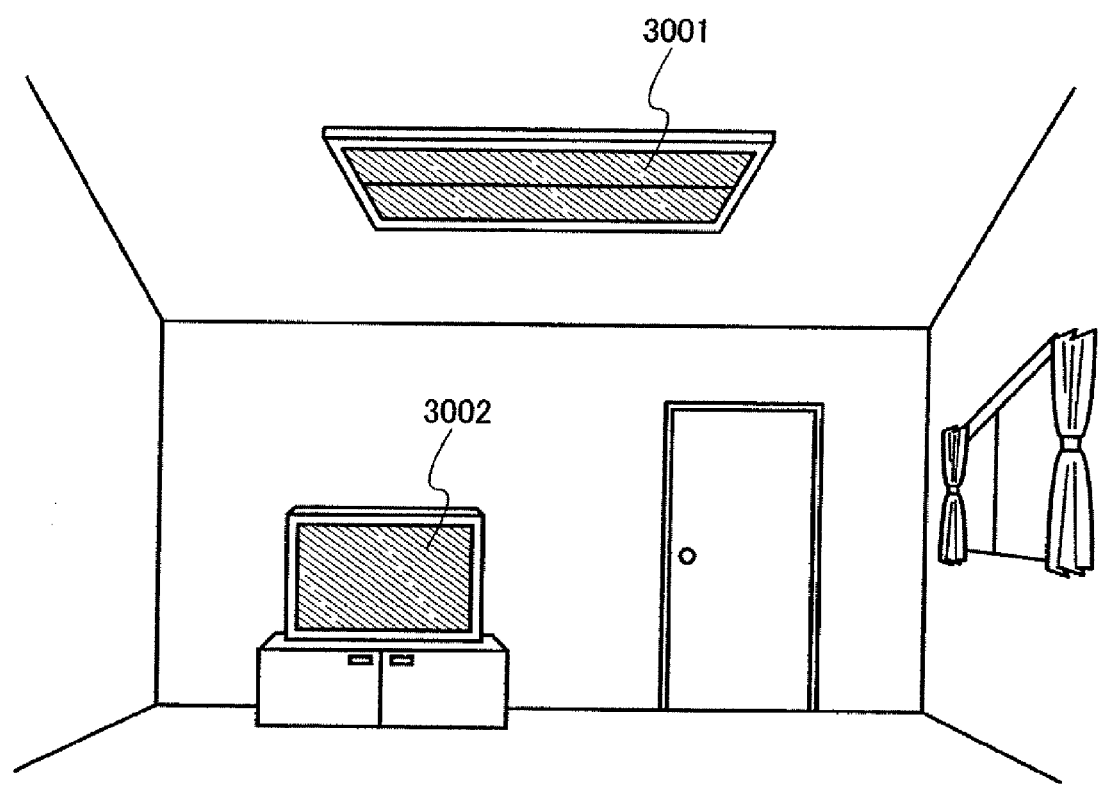
FIG. 24 is a view explaining an electronic device to which the present invention is applied.

FIG. 24 shows an example of using the light-emitting device of the present invention as an indoor lighting device 3001. Since the light-emitting device of the present invention can have a large area, it can be used as a lighting device having a large emission area. Furthermore, since the light-emitting device of the present invention has a thin shape and consumes low power, it can be used as a lighting device with thin shape and low power consumption. The indoor lighting device 3001 using the light-emitting device to which the present invention is applied, in this manner, and the television set relating to the present invention, as illustrated in FIGS. 12A and 12B, are placed in a room, where public broadcasting and movies can be watched. In such the case, since both of the devices consume low power, a powerful image can be watched in a bright room without concern about electricity charges.

A lighting device is not limited to those illustrated in FIG. 22, FIG. 23, and FIG. 24, and is applicable as a lighting device with various modes such as lighting for houses or public facilities. In such the case, the degree of freedom for design is high because a light-emitting medium having a thin film shape is used for the lighting device according to the present invention. Accordingly, various elaborately-designed products can be provided in the market.

In this manner, according to the light-emitting device of the present invention, an electronic device with lower power consumption and high reliability can be provided. This embodiment mode can be freely combined with the above embodiment modes.

This application is based on Japanese Patent Application serial no. 2006-344005 filed on Dec. 21, 2006, filed with Japan Patent Office, the entire contents of which are hereby incorporated by reference.

REFERENCE NUMERALS

30: level, 31: level, 32: electron, 33: arrow, 51: light-emitting layer, 52: hole-transporting layer, 53: electron-transporting layer, 54: hole-injecting layer, 55: electron-injecting layer, 60: electrode layer, 70: EL layer, 80: electrode layer, 100: substrate, 107: gate-insulating layer, 167: insulating film, 168: insulating film, 178: terminal electrode layer, 181: insulating film, 185: electrode layer, 186: insulating layer, 188: EL layer, 189: electrode layer, 190: light-emitting element, 192: sealing material, 193: filler, 194: FPC, 195: sealing substrate, 196: anisotropic conductive layer, 199: wiring layer, 201: region, 202: external terminal connection region, 203: wiring region, 204: peripheral driver circuit region, 205: connection region, 206: pixel region, 207: peripheral driver circuit region, 208: peripheral driver circuit region, 209: peripheral driver circuit region, 232: external terminal connection region, 233: sealing region, 234: peripheral driver circuit region, 236: pixel region, 245: thin film transistor, 246: pixel region, 255: peripheral driver circuit region, 265: thin film transistor, 275: thin film transistor, 285: thin film transistor, 300: substrate, 307: partition wall, 308: insulating layer, 309: insulating layer, 311: insulating layer, 312: EL layer, 313: electrode layer, 314: insulating layer, 350: single crystal semiconductor substrate, 361: insulating layer, 363: electrode layer, 364: insulating layer, 367: partition wall, 368: element separating region, 369: insulating layer, 370: insulating layer, 395: electrode layer, 501: electrode layer, 502: electrode layer, 511: light-emitting unit, 512: light-emitting unit, 513: charge-generating layer, 521: chassis, 522: liquid crystal layer, 523: backlight, 524: chassis, 525: driver IC, 526: terminal, 600: substrate, 601: reverse staggered thin film transistor, 602: reverse staggered thin film transistor, 603: reverse staggered thin film transistor, 604: electrode layer, 605: gate-insulating layer, 606: insulating film, 607: EL layer, 608: electrode layer, 609: insulating layer, 610: sealing substrate, 611: filler, 612: sealing material, 613: terminal electrode layer, 614: anisotropic conductive layer, 615: FPC, 650: light-emitting element, 750: substrate, 752: EL layer, 754: insulating layer, 760: substrate, 762: EL layer, 764: insulating layer, 765: partition wall, 770: substrate, 772: EL layer, 774: insulating layer, 775: partition wall, 781: substrate, 782: electrode layer, 783: insulating layer, 784: partition wall, 785: EL layer, 786: electrode layer, 790: substrate, 792: EL layer, 794: insulating layer, 802: third layer, 803: second layer, 804: first layer, 850: electrode layer, 860: EL layer, 870: electrode layer, 884: tuner, 885: video signal amplifier circuit, 886: video signal processing circuit, 887: control circuit, 888: signal dividing circuit, 889: audio signal amplifier circuit, 890: audio signal processing circuit, 891: control circuit, 892: input portion, 893: speaker, 900: panel, 901: controller, 902: central processing unit, 903: power source circuit, 904: transmission/reception circuit, 905: pixel portion, 907: signal line driver circuit, 908: flexible wiring circuit, 909: interface (I/F) portion, 910: antenna port, 911: memory, 920: control signal generating circuit, 921: decoder, 922: register, 923: arithmetic circuit, 924: RAM, 925: DRAM, 926: flash memory, 927: microphone, 928: speaker, 929: audio processing circuit, 930: input unit, 931: transmission/reception circuit, 932: VRAM, 933: antenna, 935: interface, 981: housing, 986: printed wiring board, 993: signal processing circuit, 994: microphone, 995: speaker, 996: chassis, 997: battery, 998: input unit, 999: module, 101a: base film, 101b: base film, 1300: element substrate, 1310: gate-insulating layer, 1311: insulating film, 1312: insulating film, 1314: insulating layer, 1317: electrode layer, 1319: EL layer, 1320: electrode layer, 1321: protective film, 1322: filler, 1324: wiring layer, 1325: sealing substrate, 1332: sealing material, 1333: wiring layer, 1355: thin film transistor, 1365: thin film transistor, 1375: thin film transistor, 1381: terminal electrode layer, 1382: anisotropic conductive layer, 1383: FPC, 1385: thin film transistor, 1600: element substrate, 1605: light-emitting element, 1610: gate-insulating layer, 1611: insulating film, 1612: insulating film, 1614: insulating layer, 1617: electrode layer, 1619: EL layer, 1620: electrode layer, 1622: filler, 1625: sealing substrate, 1632: sealing material, 1633: wiring layer, 1655: thin film transistor, 1665: thin film transistor, 1675: thin film transistor, 1681: terminal electrode layer, 1682: anisotropic conductive layer, 1683: FPC, 1685: thin film transistor, 179a: wiring, 179b: wiring, 2001: chassis, 2002: display panel, 2003: main screen, 2004: modem, 2005: receiver, 2006: separate remote control device, 2007: display portion, 2008: subscreen, 2009: speaker portion, 2010: chassis, 2011: display portion, 2012: keyboard portion, 2013: speaker portion, 205a: wiring, 2101: chassis, 2102: light source, 210b: transistor, 2700: substrate, 2701: pixel portion, 2702: pixel, 2703: scanning line input terminal, 2704: signal line input terminal, 2750: FPC, 2751: driver IC, 3001: lighting device, 301a: insulating layer, 301b: insulating layer, 302a: gate-insulating layer, 302b: gate-insulating layer, 304a: semiconductor layer, 304b: semiconductor layer, 306a: electrode layer, 306b: electrode layer, 310a: transistor, 310b: transistor, 315a: light-emitting element, 315b: light-emitting element, 355a: drain electrode layer, 356a: electrode layer, 356b: electrode layer, 360a: field effect transistor, 360b: field effect transistor, 362a: EL layer, 362b: EL layer, 365a: light-emitting element, 365b: light-emitting element, 3700: substrate, 3701: pixel portion, 3702: scanning line driver circuit, 3704: signal line input terminal, 4700: substrate, 4701: pixel portion, 4702: scanning line driver circuit, 4704: scanning line driver circuit, 751a: electrode layer, 751b: electrode layer, 751c: electrode layer, 753a: electrode layer, 753b: electrode layer, 753c: electrode layer, 761a: electrode layer, 761b: electrode layer, 761c: electrode layer, 763b: electrode layer, 771a: electrode layer, 771*b*: electrode layer, 771*c*: electrode layer, 773*b*: electrode layer, 791*a*: electrode layer, 791*b*: electrode layer, 791*c*: electrode layer, 793*b*: electrode layer, 906*a*: scanning line driver circuit, 906*b*: scanning line driver circuit, 9101: main body, 9102: display portion, 9201: main body, 9202: display portion, 9301: main body, 9302: display portion, 9401: main body, 9402: display portion, 9701: display portion, 9702: display portion, 1301*a*: insulating film, 1301*b*: insulating film, 1601*a*: insulating film, and 1601*b*: insulating film.

The invention claimed is:

1. A light-emitting element comprising:
   a light-emitting layer containing an organic compound provided between a first electrode layer and a second electrode layer; and
   a functional layer containing a mixed-valence compound on at least one of the first electrode layer side and the second electrode layer side of the light-emitting layer,
   wherein the mixed-valence compound includes a metal element, and the metal element has two or more different valences, and
   wherein the mixed-valence compound includes at least one of $Mn_3O_4$, $Co_3O_4$, $Pb_3O_4$, $Eu_3S_4$, $Ta_6Cl_{15}$, and $Tl_4Cl_6$.

2. A light-emitting device comprising the light-emitting element according to claim 1.

3. An electronic device comprising a display portion, wherein the display portion is provided with the light emitting element according claim 1.

4. A lighting device comprising the light emitting element according to claim 1.

5. A light-emitting element comprising:
   a light-emitting layer containing an organic compound provided between a first electrode layer and a second electrode layer; and
   a hole-transporting layer containing a mixed-valence compound on at least one of the first electrode layer side and the second electrode layer side of the light-emitting layer,
   wherein the mixed-valence compound includes a metal element, and the metal element has two or more different valences, and
   wherein the mixed-valence compound includes at least one of $Mn_3O_4$, $Co_3O_4$, $Pb_3O_4$, $Eu_3S_4$, $Ta_6Cl_{15}$, and $Tl_4Cl_6$.

6. A light-emitting device comprising the light-emitting element according to claim 5.

7. An electronic device comprising a display portion, wherein the display portion is provided with the light emitting element according claim 5.

8. A lighting device comprising the light emitting element according to claim 5.

9. A light-emitting element comprising:
   a light-emitting layer containing an organic compound provided between a first electrode layer and a second electrode layer; and
   an electron-transporting layer containing a mixed-valence compound on at least one of the first electrode layer side and the second electrode layer side of the light-emitting layer,
   wherein the mixed-valence compound includes a metal element, and the metal element has two or more different valences, and
   wherein the mixed-valence compound includes at least one of $Mn_3O_4$, $Co_3O_4$, $Pb_3O_4$, $Eu_3S_4$, $Ta_6Cl_{15}$, and $Tl_4Cl_6$.

10. A light-emitting device comprising the light-emitting element according to claim 9.

11. An electronic device comprising a display portion, wherein the display portion is provided with the light emitting element according claim 9.

12. A lighting device comprising the light emitting element according to claim 9.

13. A light-emitting element comprising,
    a first electrode layer, an electron-injecting layer, an electron-transporting layer, a light-emitting layer containing an organic compound, a hole-transporting layer, a hole-injecting layer, and a second electrode layer sequentially stacked; and
    a mixed-valence compound contained in at least one of the electron-injecting layer, the electron-transporting layer, the hole-transporting layer, and the hole-injecting layer,
    wherein the mixed-valence compound includes a metal element, and the metal element has two or more different valences, and
    wherein the mixed-valence compound includes at least one of $Mn_3O_4$, $Co_3O_4$, $Pb_3O_4$, $Eu_3S_4$, $Ta_6Cl_{15}$, and $Tl_4Cl_6$.

14. A light-emitting device comprising the light-emitting element according to claim 13.

15. An electronic device comprising a display portion, wherein the display portion is provided with the light emitting element according claim 13.

16. A lighting device comprising the light emitting element according to claim 13.

* * * * *